(12) United States Patent
Ohtani et al.

(10) Patent No.: US 6,625,072 B2
(45) Date of Patent: Sep. 23, 2003

(54) SEMICONDUCTOR INTEGRATED CIRCUIT DEVICE PROVIDED WITH A SELF-TESTING CIRCUIT FOR CARRYING OUT AN ANALYSIS FOR REPAIR BY USING A REDUNDANT MEMORY CELL

(75) Inventors: Jun Ohtani, Hyogo (JP); Tomoya Kawagoe, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/152,689

(22) Filed: May 23, 2002

(65) Prior Publication Data

US 2002/0196683 A1 Dec. 26, 2002

(30) Foreign Application Priority Data

Jun. 25, 2001 (JP) ........................ 2001-191113

(51) Int. Cl.[7] ................................................ G11C 7/00
(52) U.S. Cl. ........................................ 365/200; 365/201
(58) Field of Search ................................... 365/200, 201

(56) References Cited

U.S. PATENT DOCUMENTS 5,535,161 A * 7/1996 Kato ........................... 365/200
6,243,307 B1  6/2001 Kawagoe ..................... 365/201

FOREIGN PATENT DOCUMENTS

JP    11-120792    4/1999
JP    2001-6387    1/2001

* cited by examiner

*Primary Examiner*—M Tran
(74) *Attorney, Agent, or Firm*—McDermott, Will & Emery

(57) ABSTRACT

A memory cell array is divided into a first and second sub-memory cell arrays. A built-in self-testing circuit is provided with an address replacement determining circuit which is installed in each of the first and second sub-memory cell arrays, and which, assuming that a selection of a memory cell from the first and second sub-memory cell arrays and a replacement thereof to a preliminary memory cell can be carried out mutually in an independent manner, makes a determination as to which preliminary memory cell is used for replacement, and outputs the result of determination.

13 Claims, 30 Drawing Sheets

|  | CAM CELL ARRAY STORAGE DATA | | | REPAIR FAIL |
|---|---|---|---|---|
| CANDIDATE OF REPAIR | SR1: REPLACEMENT ADDRESS | SR2: REPLACEMENT ADDRESS | SCI(II): REPLACEMENT ADDRESS | CSi-RF |
| S11 | A1 | A2 | Aa | L |
| S21 | A1 | A3 | Ab | L |
| ⋮ | ⋮ | ⋮ | ⋮ | ⋮ |

SEMICONDUCTOR INTEGRATED CIRCUIT DEVICE PROVIDED WITH A SELF-TESTING CIRCUIT FOR CARRYING OUT AN ANALYSIS FOR REPAIR BY USING A REDUNDANT MEMORY CELL

BACKGROUND OF THE INVENTION

1. Field of the Invention

The present invention relates to a structure of a semiconductor integrated circuit device, and more specifically, concerns a semiconductor integrated circuit that is provided with a testing circuit for carrying out a test on a semiconductor memory device.

2. Description of the Background Art

Most of semiconductor devices have a redundant memory cell, and when there is a defective memory cell in one portion of the memory cell, it replaces the defective portion with the redundant memory cell so as to repair the defective chip.

FIG. 28 is a schematic block diagram that shows the structure of a redundant circuit that is installed with respect to a memory array section 8010 of such a semiconductor memory device.

One memory cell in memory array 8010 is selected by a row address signal RA0-13 and a column address signal CA0-8 that are externally inputted. In this one memory cell thus selected, during a writing operation, data supplied to a data input/output terminal DQ (not shown) is written. Moreover, during a reading operation, read data is outputted from memory array 8010 to this data input/output terminal DQ.

A row decoder 8020 selects a memory cell corresponding to one row to be read or written in accordance with the inputted row address. Moreover, a column decoder 8030 carries out a selection of one column based upon a column address inputted so that, among memory cells corresponding to one row selected by the row address, one memory cell is further selected.

The above-mentioned detection of a defective memory cell and an analysis for replacing the defective memory cell with a redundant memory cell array are generally carried out by a memory tester that is placed outside of the semiconductor memory device.

In recent years, however, a semiconductor memory device or a semiconductor device having a semiconductor memory device, which is provided with a so-called built-in type testing device that has a build-in signal generator within a semiconductor memory device to be tested or within a semiconductor device on which a semiconductor memory device is installed so that the testing process is carried out without using the memory tester, has been manufactured.

However, in such a semiconductor memory device or a semiconductor device provided with such a build-in testing device, although it is possible to carry out the test for determining as to whether or not any detective memory exists, it is difficult to carry out a test for achieving a redundant analysis on the device itself. This is because, as described earlier, a fail memory for storing the addresses of defective memory cells requires a memory of which capacity is as large as the semiconductor memory device or the built-in the semiconductor memory device in the semiconductor device to be measured; therefore, in fact, it is difficult to install such a fail memory in the semiconductor memory device or the semiconductor device, and consequently, it is not possible to carry out the redundant analysis.

[An Arrangement in Which One Bit Data is Read Out Per One Memory Cell]

In order to solve the above-mentioned problems, Japanese Patent Laying-Open No. 2001-6387 discloses the following arrangement.

FIG. 29 is a schematic block diagram that shows the entire structure of a dynamic-type semiconductor memory device (hereinafter, referred to as DRAM) 9000 disclosed by Japanese Patent Laying-Open No. 2001-6387, where one-bit data is read out per sub-memory alley.

Referring to FIG. 29, DRAM 9000 is provided with a control signal input terminal group 11 for receiving a control signal such as a row address strobe signal/RAS, an address input terminal group 13 for receiving address signals A0 to Ai (i: natural number) and a data input/output terminal group 15 for carrying out data input/output operations.

DRAM 9000 is further provided with a control circuit 26 for generating an internal control signal for controlling the entire operation of DRAM 9000 in accordance with a control signal; an internal control signal bus 72 for transmitting the internal control signal; an address buffer 30 for generating an internal address signal upon receipt of an external address signal from address input terminal group 13; and a memory cell array 100 having a plurality of memory cells MC arranged in a matrix manner.

Here, it is assumed that one-bit data is read out per one memory cell array 100.

The internal address signals refer to, for example, mutually complementary internal row address signals RA0-13 and/RA0-13 generated from external row address signal RA0-13 and mutually complementary internal column address signals CA0-8 and /CA0-8 generated from external row address signal CA0-8.

In the same manner as memory cell array section 8010 shown in FIG. 28, a memory cell array 100 shown in FIG. 29 includes a normal memory cell array 100R, a spare row SR and a spare column SC.

In memory cell array 100 also, with respect to spare rows SR, two spare rows SR1 and SR2 are installed, and with respect to spare columns SC, two spare columns SC1 and SC2 are installed.

DRAM 9000 is further provided with a built-in self test circuit (hereinafter, referred to as BIST circuit) 7000 for detecting a defective memory cell in DRAM 9000 and for carrying out a testing operation for replacing it with a spare row SR or a spare column SC.

During a normal operation, BIST circuit 7000, which is controlled by a control circuit 26, outputs an internal row address signal and an internal column address signal from address buffer 30, as they are, to a row decoder, a spare row decoder 42, a column decoder 50 and a spare column decoder 52 respectively. Moreover, during the normal operation, BIST circuit 7000 receives written data, which has been supplied from data input/output terminal group 15, subjected to a buffer process by an input/output buffer 85, and outputted from a writing driver 80, and outputs the data as it is to a row selection gate 200.

In contrast, during a testing operation, BIST circuit 7000 gives not an internal address signal from address buffer 30, but an internal address signal generated inside BIST circuit 7000, to row decoder 40, spare row decoder 42, column decoder 50 and spare column decoder 52 respectively. Moreover, not data supplied from writing driver 80, but testing-use writing data TD, generated inside BIST circuit 7000, is given to a column selection gate 200 so that the test data is written in memory cell array 100.

Upon completion of the writing operation in such a testing operation, BIST circuit 7000 again generates an internal address signal so as to read out written data successively. In accordance with the results of comparisons between the read data and expected value data ED, BIST circuit 7000 successively detects the position of a defective memory cell in a normal memory cell array 100R, and determines what combination between spare row SR and spare column SC is used for replacing a plurality of defective row addresses and defective column addresses corresponding to such a plurality of defective memory cells.

In accordance with the determination as described above, an external tester gives instructions to a repair device so that, for example, the repair device trims fuse elements in spare row decoder 42 and spare column decoder 52.

FIG. 30 is a schematic block diagram that explains the arrangement of an address replacement determining device 8000 contained in BIST circuit 7000.

First, prior to explaining the structure of address replacement determining device 8000, an explanation will be briefly given of a processing sequence for replacing the defective addresses in memory cell array 100 in FIG. 29 with spare row SR and spare column SC.

In the following description, it is assumed that a defective memory cell distribution that is the same as the defective memory cells in memory cell array section 8010 shown in FIG. 28 occurs also in memory cell array 100.

Therefore, as shown in FIG. 28, in the case when eight defective memory cells, that is, defective memory cells DBM1 to DBM8, exist, if an attempt is made to detect these defective memory cells DBM1 to DBM8 while the row address is being changed with the column address being also changed, the existence of the defective memory cells is detected in the order of detective memory cells DBM1 to DBM8.

Here, in the case when the defective addresses corresponding to these defective memory cells are replaced with two spare rows SR1 and SR2 and two spare columns SC1 and SC2, there are two cases in which all the defective memory cells are repaired and in which they are not repaired, depending on in what order the spare row and spare column are replaced by normal memory cell row or normal memory cell column corresponding to the defective memory cells.

For example, a defective memory cell DBM1 (row address RF1, column address CF1) is replaced by spare row memory cell SRM1, defective memory cells DBM2 to DBM4 (row address is RF2 in common with each other, column addresses, CF2, CF3, CF4) are replaced by the second spare row memory cell SRM2, defective memory cells DBM5 to DBM7 (column address is CF5 in common with each other, row addresses are respectively RF3, RF4 and RF5) are replaced by the first spare column memory cell SCM1, and defective memory cell DBM8 (row address RF8, column address CF8) is replaced by the second spare column memory cell SCM2; thus, in this case, it is possible to replace all the defective memory cells DBM1 to DBM8 by using two spare rows SR1 and SR2 and two spare columns SC1 and SC2.

However, for example, in the case when the following processes are successively carried out: defective memory cell DBM1 is first replaced by the first spare column memory cell SCM1, defective memory cell DBM2 is then replaced by the second spare column memory cell SCM2, the third defective memory cell DBM3 that is successively detected is replaced by the first spare row memory cell SRM1, and the defective memory cell DBM5 that fifth appears is replaced by the second spare row memory cell SRM2; it is not possible to repair all the defective memory cells by replacing them with two spare rows and two spare columns.

As described above, in the process where defective memory cells are replaced by spare rows or spare columns while the defective memory cells are successively detected, there are cases where detective memory cells can be repaired and where they can not repaired depending not only on the distribution of defective memory cells in the normal memory array, but also on what order the replacing process with the spare row and the spare column is carried out in.

Here, in the case when there are two spare rows and two spare columns, with respect to in what order the detective memory cells successively detected are replaced with spare rows and spare columns, there are the following six combinations, depending on in what step in the four steps of replacements they are replaced with spare rows or spare columns.

In the following description, the replacement with a spare row is represented by R, and the replacement with a spare column is represented by C.

Case 1: R→R→C→C
Case 2: R→C→R→C
Case 3: R→C→C→R
Case 4: C→R→R→C
Case 5: C→R→C→R
Case 6: C→C→R→R In the case when all the defective memory cells are finally replaced with two spare rows and two spare columns and repaired, within the above-mentioned 6 orders, the order of the replacing process with spare rows and spare columns, which can carry out the complete repair, is definitely contained.

Address replacement determining device 8000 shown, in FIG. 30, has an arrangement for processing the six systems in parallel with each other so as to discriminate the above-mentioned six cases in parallel with each other.

Referring to FIG. 30, address replacement determining device 8000 is provided with first to sixth replacement determining sections 8100.1 to 8100.6 each of which can determine whether or not the defective addresses may be repaired by replacing them through the replacing process of the defective addresses in accordance with the above-mentioned cases 1 to 6.

Address replacement determining device 8000 is further provided with: row address memory sections RM1 to RM6 for storing row addresses to be replaced with two spare rows in association with the first replacement determining section 8100.1 to the sixth replacement determining section 8100.6, and column address memory sections CM1 to CM6 for storing column addresses to be replaced with the two column addresses.

For example, in the case of the above-mentioned case 1, a row address memory section RM1 and a column address memory section CM1 are respectively provided in association with the first replacement determining section 8100.1 that is prepared for carrying out the replacement with spare columns twice after successively carrying out the replacing processes twice by using spare rows.

Row address storing portion RM1 is provided with a storing cell train MCR11 for storing row addresses to be replaced by the first spare row SR1 and a storing cell train MCR12 for storing row addresses to be replaced by the second spare row SR2.

Here, column address storing portion CM1 is provided with a storing cell train MCC11 for storing column addresses to be replaced with the first spare column SC1 and a storing cell train MCC12 for storing column addresses to be replaced by the second spare column SC2.

The first replacement determining section 8100.1, which corresponds to the case 1 as described above, deals with the storing cell trains within the corresponding row address storing portion RM1 and column address storing portion CM1, and makes a determination as to whether or not the internal address signal is to be written into the storing cell trains in the order of the storing cell train MCR11, storing cell train MCR12, storing cell train MCC11 and storing cell train MCC12 each time the pass/fail signal P/F is activated.

In association with storing cell trains MCR11, MCR12, MCC11 and MCC12, pre-charging circuits CPR11, CPR12, CPC11 and CPC12 are installed. Each of the pre-charging circuits CPR11 to CPC12 pre-charges each of matching determining lines MHLs installed in association with corresponding storing cell trains MCR11 to MCC12 to a "H" level in accordance with a signal ϕ.

Storing cell trains MCR11 and MCR12 are respectively installed in association with 14 pairs of internal row address signals RA0, /RA0 to RA13, /RA13, and are provided with content addressable memory cells (hereinafter, referred to as "CAM cell") for storing the level of these signals.

In the same manner, storing cell trains MCC11 and MCC12 are respectively installed in association with pairs of internal column address signals CA0, /CA0 to CA8, /CA8, and provided with CAM cells for storing the level of these signals.

CAM cells in row address storing portion RM1 and column address storing portion CM1 respectively store the level of the corresponding internal row address signal or internal column address signal in response to the change of the writing activation line TWL to the active level ("H" level) in accordance with the instruction of the corresponding first replacement determining section 8100.1.

Here, the level of the matching determining line MHL that is pre-charged to the "H" level, is maintained at the "H" level, in the case when the level of the address signals that have been stored by the storing cell trains is coincident with the level of the internal address signal RA0, /RA0 to RA13, /RA13 or the internal column address signals CA0, /CA0 to CA8, /CA8 that have been given to the address replacement determining device 8000 at this time. In contrast, if not coincident, the matching determining line MHL is set to the "L" level.

Moreover, in association with storing cell trains MCR11, MCR12, MCC11 and MCC12, flip-flop circuits SFR11, SFR12, SFC11 and SFC12 are respectively installed. The levels of the flip-flop circuits SFR11 to SFC12 have been reset by a reset signal RST before a testing operation is started, and are set in response to the active state ("H") of the writing selection line TWL of the corresponding storing cell train.

The second replacement determining section 8100.2, which corresponds to the case 2, is provided with row address storing portion RM2 and column address storing portion CM2 so as to deal with alternate replacing process by the spare row and replacing process by the spare column. The second replacement determining section 8100.2 deals with the storing cell trains within the corresponding row address storing portion RM2 and column address storing portion CM2, and makes a determination as to whether or not the internal address signal is to be written into the storing cell trains in the order the storing cell train MCR21, storing cell train MCC21, storing cell train MCR22 and storing cell train MCC22 each time the pass/fail signal P/F is activated. The other structure is the same as the first replacement determining section 8100.1.

With respect to each of the third to sixth replacement determining sections 8100.3 to 8100.6, only the corresponding memory cell column and the order of the writing to the corresponding memory cell column are different in accordance with the cases 3 to 6, with the other structures being the same as that of the replacement determining section 8100.1; therefore, the description thereof is omitted.

In the above-mentioned arrangement, a brief explanation will be given of the operation of the replacement determining section 8100.1.

In other words, for example, at the time when the pass/fail signal P/F is activated, the first replacement determining section 8100.1 allows the writing selection line TWL of the storing cell train MCR11 to be activated. Accordingly, the level of flip-flop circuit SFR11 corresponding to storing cell train MCR11 is set so that the writing of an address signal to the storing cell train MCR11 is recorded as data.

Successively, at the time when the pass/fail signal P/F is again activated, the respective CAM cells compare the internal row address signal held in the storing cell train MCR11 with the level of the internal row address signal at this time, and in accordance with the result of the comparison, the level of the matching detection line MHL of the storing cell train MCR11 is driven. Accordingly, the first replacement determining section 8100.1 does not allow the storing cell train MCR12 to activate in the case when the internal row address that has been held in the storing cell train MCR11 is coincident with the internal row address corresponding to a newly detected defective memory cell.

In contrast, in the case when the internal row address that has been stored in the storing cell train MCR11 is not coincident with the internal row address corresponding to a newly detected defective memory cell, the first replacement determining section 8100.1 makes active the writing selection line TWL of the storing cell train MCR12 that is to be second activated.

Then, the internal row address corresponding to the newly detected defective memory cell is written in the second storing cell train MCR12, and the level of the flip-flop circuit SFR12 corresponding to the storing cell train MCR12 is set.

Thereafter, in the same manner, each time a defective memory cell is detected, and in the case when the internal row address or the internal column address that has been held in the storing cell train is not coincident with the internal row address or the internal column address corresponding to the newly detected defective memory cell, the storing cell trains are successively activated in the order of case 1 corresponding to the first replacement determining section 8100.1.

Here, in the case when the internal row address or the internal column address that has been stored in the storing cell train is coincident with the internal row address or the internal column address corresponding to the newly detected defective memory cell, the first replacement determining section 8100.1 does not allow the storing cell train corresponding to the next order to be activated.

Finally, in the case when, after the normal memory cells have been tested in the built-in test, the internal row addresses and the internal column addresses of all the detective memory cells that have been successively detected are coincident with the internal row address and the internal column address that have been stored in the row address storing portion MR1 and the column address storing portion CM1, it is determined that it is possible to replace and repair all the defective memory cells by replacing the defective memory cells with the spare row or the spare column in the order corresponding to the first replacement determining section 8100.1. The result of the determination is outputted from address replacement determining device 8000 as a repair fail signal RF.

As described above, the same structures as the first replacement determining section 8100.1 and the corresponding row address storing portion RM1 and the column address storing portion CM1 are also installed on the second replacement determining section 8100.2 to the sixth replacement determining section 8100.6. Moreover, the second replacement determining section 8100.2 to the sixth replacement determining section 8100.6 respectively correspond to case 2 to case 6 so that the respective replacement determining sections successively activate the storing cell trains of the row address storing portion and the storing cell trains of the column address storing portion in accordance with the corresponding order.

Therefore, as illustrated in FIG. 29, if it is possible to repair the defective memory cells in the normal memory cell array 100R by using two spare rows and two spare columns, the repair fail signal RF from at least any one of the first replacement determining section 8100.1 to the sixth replacement determining section 8100.6 maintains a non-active state ("L" level) even at the time when the last defective memory cell has been detected.

In accordance with this, the repair fail signal RF reads out the internal row address signal and the internal column address signal held in the row address storing portion and column address storing portion corresponding to the replacement determining section in a non-active state. In response to the internal row address signal and the internal column address signal thus read, it is possible to program the row addresses and the column addresses to be replaced in spare row decoder 42 and spare column decoder 52.

In the arrangement of BIST circuit 7000 as described above, even when the memory capacity of the semiconductor memory device to be measured is large, the testing circuit scale can be reduced; therefore, it is easily built inside the semiconductor memory device.

(Problems with the Structure from Which Data Having a Plurality of Bits is Read Per Memory Cell Array)

FIG. 31 is a conceptual drawing that explains a replacing operation by using a redundant memory cell array where the memory cell array 100 is divided into two sub-memory arrays 100.0 and 100.1.

In the embodiment shown in FIG. 31, when one word line WL is activated, data reading operations are simultaneously carried out from the bit lines BL0, /BL0 of the sub-memory cell array 100.0 and bit lines BL1, /BL1 of the sub-memory cell array 100.1.

In the above-mentioned structure, when the above-mentioned replacement of the redundant memory cell array is carried out, the following problems will arise.

In other words, in the case when the replacement to the redundant memory cell is carried out in the order from the redundant memory cell column to the redundant memory cell row, if both of the memory cells DBM1 and DBM2 belonging to the same memory cell row are defective memory cells, for example, it is possible to replace one of the defective memory cells DBM1 by the redundant memory cell column SC.

However, in the structure of the semiconductor memory device 9000 explained in FIG. 29, it is not possible to simultaneously replace the two memory cell columns. Therefore, in the case when, after the process in which the memory cell column containing the detective memory cell DBM1 is replaced by the redundant memory cell column SC, a defective memory cell DBM3 belonging to a memory cell row different from the defective memory cell DBM1 is detected, the memory cell row containing this defective memory cell DBM3 is successively replaced by the redundant memory cell row SR.

However, such a replacing process fails to repair the defective memory cell DBM2. In addition to the failure to repair, since the defective memory cell DBM1 specified by the same row address and the same column address has been repaired with respect to the BIST circuit 2000, an erroneous determination that both the memory cell DBM1 and DBM2 have been repaired might be made although the defective memory cell DBM2 has not been repaired.

In other words, in the case when the memory cell array 100 is divided into two sub-memory cell arrays 100.0 and 100.1 and when in accordance with the activation of one word line WL, data is simultaneously read from a plurality of memory cells (for example, two memory cells), the structure of BIST circuit 2000 simply explained by FIGS. 29 and 30 might fail to correctly determine whether or not the repair by the redundant memory cell array has been successfully made, in some cases.

SUMMARY OF THE INVENTION

The objective of the present invention is to provide a semiconductor integrated circuit device with a built-in test circuit which, in the case when a plurality of memory cells are simultaneously selected in response to an activation of the same word line, detects a defective memory cell, and also carries out an analysis for replacing the defective memory cell with a redundant memory cell.

In short, the present invention is a semiconductor integrated circuit device that is provided with a memory cell array, a normal memory cell selection circuit, a preliminarily memory cell selection circuit and a self testing circuit.

A plurality of memory cells, each storing memory data, are placed in a matrix format on the memory cell array. The memory cell array is divided into at least a first and a second sub-memory cell arrays. With respect to the memory cell array, each of the first and second sub-memory cell arrays is provided with a normal memory cell array containing a plurality of normal memory cells and a preliminarily memory cell array containing a plurality of preliminarily memory cells.

A normal memory cell selection circuit selects at least one of the memory cell row and the memory cell column that is in common with the normal memory cell array in the first and second sub-memory cell array. In the case when a defective memory cell exists in the normal memory cell array, a preliminarily memory cell selection circuit selects either one of the memory cell row and memory cell column in the preliminarily memory cell array commonly from the preliminarily memory cell array of the first and the second sub-memory cell array, in place of either one of the common memory cell row and memory cell column to be selected by the normal memory cell selection circuit.

A self-testing circuit detects a defective memory cell in the normal memory cell, and carries out a test for determining which preliminarily memory cell is used for replacing the defective memory cell. The self-testing circuit is installed in each of the first and second sub-memory cell arrays, and includes a plurality of primary replacement determining circuits which make a determination as to which preliminarily memory cell is used for the replacement, supposing that the selection of a memory cell from the first and second sub-memory cell arrays and the replacement to the preliminarily memory cell are carried out independently from each other, and outputs the results of determination.

More preferably, the self-testing circuit further includes a secondary replacement determining circuit. Based upon the results of determination from the plurality of primary replacement determining circuits, the secondary replacement determining circuit determines a defective row address and a defective column address that form the replacement subjects in the case when the memory cell array is replaced and repaired, under the regulated condition that either one of the memory cell row and the memory cell column in the preliminarily memory cell array is commonly selected by the primarily memory cell array of the first and second sub-memory cell arrays in place of either one of the common memory cell row and memory cell column to be selected by the normal memory cell selection circuit.

Therefore, the advantage of the present invention is that it is possible to detect a defective memory cell and to carry out a redundant analysis by using a comparatively small circuit scale, in the case when one memory cell is simultaneously selected for each of sub-memory cell arrays, and also to install a testing circuit having a redundant analyzing function in a semiconductor integrated circuit device itself.

Another advantage of the present invention is that since the secondary analysis can be executed within the semiconductor integrated circuit device, it becomes possible to further reduce the load of the tester device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
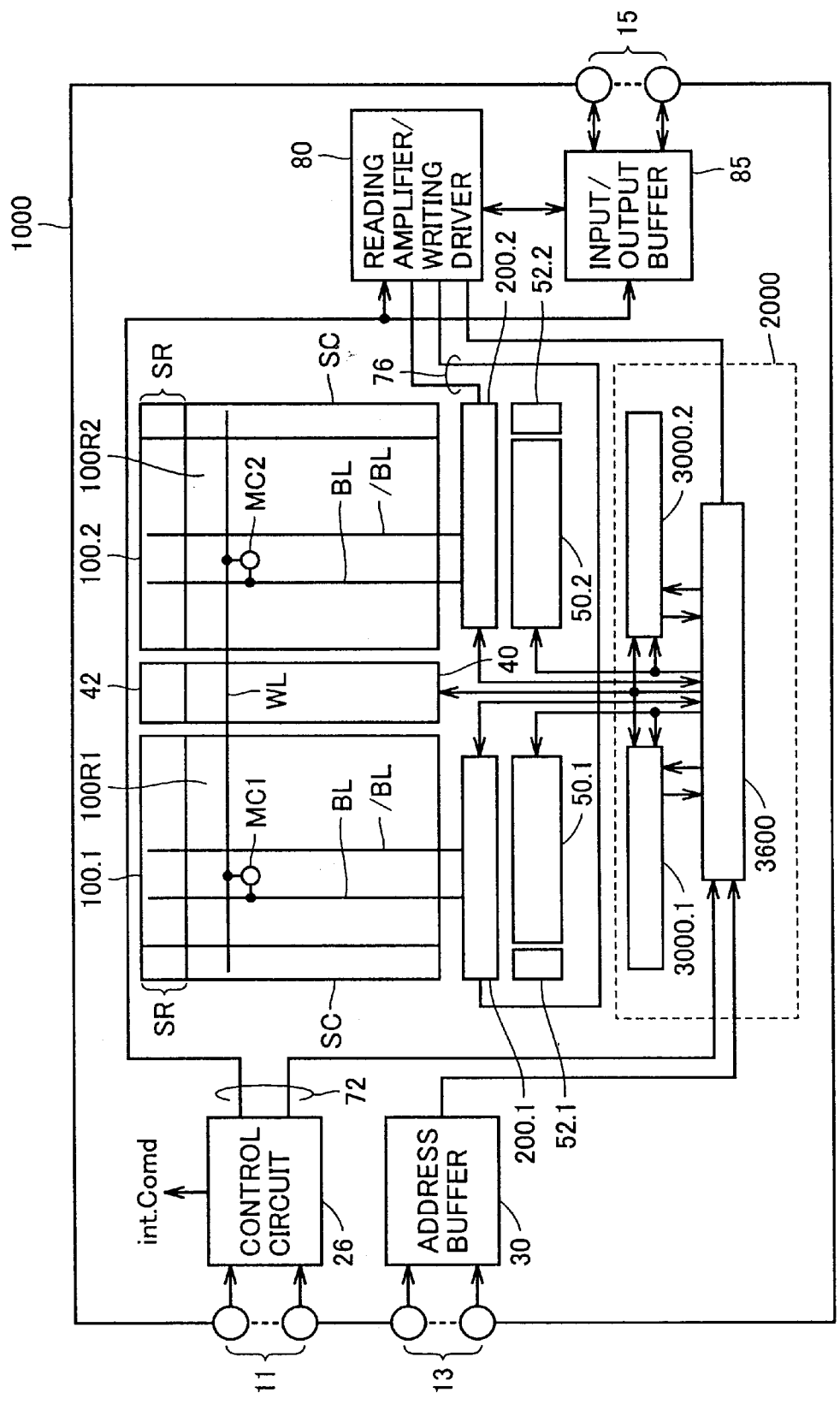
FIG. 1 is a schematic block diagram that shows the entire structure of a dynamic-type semiconductor memory device 1000 in accordance with Embodiment 1 of the present invention.

FIG. 1 is a schematic block diagram that shows the entire structure of a dynamic-type semiconductor memory device (DRAM) 1000 in accordance with Embodiment 1 of the present invention.

In DRAM 1000, a plurality of memory cells, for example, the total 2 bits data consisting of 1 bit per sub-memory array, is read in response to an activation of one word line.

Here, as will be described in the following explanation, a built-in self-testing circuit of the present invention is not intended to be limited by the installation on DRAM 1000 shown in FIG. 1, and is applicable to a testing device for a semiconductor memory device that is installed in a semiconductor integrated circuit device together with a logic circuit, etc.

Referring to FIG. 1, DRAM 1000 is provided with a control signal input terminal group 11 for receiving control signals such as a row address strobe signal/RAS, a column address strobe signal/CAS, a write enable signal/WE, a chip enable signal/CE and a clock enable signal CKE, an address input terminal group 13 for receiving address signals A0 to An (n: natural number) and a data input/output terminal group 15 for carrying out data input/output operations.

Here, with respect to an input system of address signals, row address signals RA0 to RAi (i: natural number) and column address signals CA0 to CAj (j: natural number) are supplied to address input terminal group 13 in a time-divided manner.

DRAM 1000 is further provided with a control circuit 26 for generating an internal control signal int. Comd for controlling the entire operation of DRAM 1000 in accordance with a control signal and an internal timing signal for instructing the operation timing, an internal control signal bus 72 for transmitting the internal timing signal and internal control signal int. Comd, an address buffer 30 for receiving an external address signal from an address input terminal group 13 to generate an internal address signal, and a memory cell array 100 having a plurality of memory cells MC arranged in a matrix manner.

Here, memory cell array 100 is divided into two sub-memory cell arrays 100.1 and 100.2.

Moreover, the internal address signal refers to, for example, mutually complementary internal row address signals RA0–RAi and/RA0–/RAi generated from external row address signals RA0–RAi and mutually complementary internal column address signal CA0–CAj and /CA0–/CAj generated from external column address signals CA0–CAj.

A common word line WL is provided for two sub-memory cell arrays 100.1 and 100.2 to select respective rows in sub-memory arrays 100.1 and 100.2. Moreover, in each of sub-memory cell arrays 100.1 and 100.2, bit lines BL, /BL are provided for each column of the memory cell. For example, in sub-memory cell array 100.1, a memory cell MC1, which is coupled to word line WL and bit line BL, is constituted by a capacitor (not shown) for maintaining data, and an access transistor MTA (not shown) for selectively connecting one end of this capacitor and bit line BL in response to the potential level of word line WL.

The same is true for memory cell MC2 in sub-memory cell array 100.2.

Moreover, sub-memory cell array 100.1 includes a normal memory cell array 100R1, and a spare column SC that is replaced with a memory cell column in normal memory cell array 100R1 in sub-memory cell array 100.1. The same is true for sub-memory cell array 100.2. Moreover, memory cell arrays 100.1 and 100.2 are commonly provided with spare rows SR that are replaced by defective memory cell rows in normal cell arrays 100R1 and 100R2. Spare rows SR correspond to a normal memory cell array 100R1 in sub-memory cell array 100.1 and a normal memory cell array 100R2 in sub-memory cell array 102.2.

In the following description, for convenience of explanation, two spare rows SR1 and SR2 are installed as spare rows SR, with respect to spare columns SC, a spare column SCI is installed in sub-memory cell array 100.1 and a spare column SCII is installed in sub-memory cell array 100.2.

DRAM 1000 is further provided with a built-in self-test circuit (hereinafter, referred to as BIST circuit) 2000 for detecting a defective memory cell of DRAM 1000 and for carrying out a testing operation for determining how to replace the defective memory cells with spare rows SR and spare columns SC.

Moreover, a row decoder 40 and a spare row decoder 42, used for selecting memory cell rows (word lines) in sub-memory cell arrays 100.1 and 100.2, are commonly provided for sub-memory cell arrays 100.1 and 100.2. Row decoder 40 selects memory cell rows in normal memory cell arrays 100R1 and 100R2, and spare row decoder 42 selects spare rows SR.

Moreover, DRAM 1000 comprises a column decoder 50.1 for selecting a memory cell column in normal memory cell array 100R in sub-memory cell array 100.1, and a spare column decoder 52.1 for selecting spare columns SC in sub-memory cell array 100.1. In the same manner, a row decoder 50.2 and a spare column decoder 52.1 are installed in association with sub-memory cell array 100.2.

During a normal operation time, BIST circuit 2000, controlled by a control circuit 26, respectively outputs internal row address signals and internal column address signals from address buffer 30, as they are, to row decoder 40, spare row decoder 42, column decoders 50.1 and 50.2 as well as to spare column decoders 52.1 and 52.2.

Moreover, during a normal operation, BIST circuit 2000 receives writing data that is supplied by data input/output terminal group 15, buffer-processed by input/output buffer 85, and outputted from a writing driver 80. BIST circuit 2000 outputs the received writing data, as it is, to column selection gate/sense amplifier circuits 200.1 and 200.2. The writing data is transmitted to bit paired lines BL, /BL corresponding to selected memory cell column in sub-memory cell array 100.1 through a column selection gate/sense amplifier 200.1, and is also transmitted to bit paired lines BL, /BL corresponding to selected memory column in sub-memory cell array 100.2 through a column selection gate/sense amplifier 200.2.

In contrast, during a testing operation, BIST circuit 2000 gives not an internal address signal from address buffer 30, but an internal address signal generated inside BIST circuit 2000, to row decoder 40, spare row decoder 42, column decoders 50.1 and 50.2 and spare column decoders 52.1 and 52.2 respectively. Moreover, not data supplied from writing driver 80, but testing-use writing data TD, generated inside BIST circuit 2000, is given to a column selection gate/sense amplifier circuit 200 so that the test data is written in memory cell arrays 100.1 and 100.2.

Upon completion of the writing operation in such a testing operation, BIST circuit 2000 again generates an internal address signal so as to read out written data successively. In accordance with the results of comparisons between the read data and expected value data ED, BIST circuit 2000 successively detects the position of a defective memory cell in a normal memory cell arrays 100R1 and 100R2.

Assuming that sub-memory cell array 100.1 and sub-memory cell array 100.2 are respectively repaired by spare rows SR respectively in an independent manner, BIST circuit 2000 determines what combination between spare row SR and spare column SC is used for replacing a plurality of defective row addresses and defective column addresses corresponding to such a plurality of defective memory cells.

In other words, in BIST circuit 2000, the word line WL is commonly installed in sub-memory cell arrays 100.1 and 100.2, and is commonly selected by row decoder 40 and spare row decoder 42. The combination of spare row SR and spare column SC for replacing defective row addresses and defective column addresses is, however, determined under the assumption that row decoder and spare row decoder are installed independently from sub-memory cell arrays 100.1 and 100.2.

Upon completion of the reading operation during such a testing operation, data indicating which combination of the spare row and spare column makes it possible to repair through the replacement, and data of the defective row addresses and the defective column addresses to be replaced by the spare rows and spare columns are read from the data input/output terminal 15 of BIST circuit 2000 through the reading amplifier/writing driver 80 and the input/output buffer 85.

In order to carry out the above-mentioned operation, BIST circuit 2000 is provided with an address replacement determining circuit 3000.1 in association with sub-memory cell array 100.1. Assuming that the spare rows and spare columns in sub-memory cell array 100.1 are respectively installed independently from sub-memory cell array 100.2, address replacement determining circuit 3000.1 makes a determination as to what combination of the spare rows SR1, SR2 and the spare column SC2 needs to be used to replace a plurality of defective row addresses and defective column addresses corresponding to defective memory cells in sub-memory cell array 100.1.

In the same manner, BIST circuit 2000 is further provided with an address replacement determining circuit 3000.2 that carries out the same operation as the address replacement determining circuit 3000.1 in association with sub-memory cell array 100.2, and a self-analysis controlling section 3600 for controlling the analyzing operations of the address replacement determining circuits 3000.1 and 3000.2.

After the completion of the redundant analyzing operation by BIST circuit 2000, a determination is made outside DRAM 1000 as to what replacement can be executed by using spare rows SR1 and SR2 and spare columns SCI and SCII so as to carry out the redundant repair, based upon data read from BIST circuit 2000.

In other words, in the analyzing operation of address replacement determining circuit 3000.1, supposing that there is no limiting condition that the word line WL is selected commonly by sub-memory cell arrays 100.1 and 100.2 in response to an address signal, a determination is made as to in what order the replacement is made among the spare rows SR1 and SR2 and the spare column SCI to carry out the repair. The same is true for the analyzing operation in address replacement determining circuit 3000.2. Thereafter, outside DRAM 1000, based upon the results of analyses of address replacement determining circuit 3000.1 and address replacement determining circuit 3000.2, supposing that the above-mentioned limiting condition is imposed, a determination is made as to in what order the replacement is made among the spare rows SR1 and SR2 and the spare columns SCI and SCII to carry out the repair.

In accordance with the results of analysis of address replacement determining circuit 3000.1 and address replacement determining circuit 3000.2, an external tester gives an instruction to a repair device so that the repair device trims the fuse elements of the spare row decoder 42, the spare column decoders 52.1 and 52.2, thereby programming the redundant replacement.

After the completion of the redundant analyzing operation of BIST circuit 2000 and the programming operation by the external repair device of DRAM 1000, normal reading operation and writing operation are carried out.

In the normal reading operation and writing operation, in accordance with the output from the row decoder 40 obtained by decoding the internal row address signal from the address buffer 30, the word line driver (not shown) selectively activates the corresponding word line WL. At this time, in the case when the defective row address that has been non-volatilely (in a non-volatile manner) stored is coincident with the internal row address from the address buffer, the spare row decoder 42 activates the word line SWL of the spare row SR, and instructs the row decoder 40 so as not to carry out the row selecting operation.

Here, column decoders 50.1 and 50.2 decode internal column address signals from address buffer 30 to activate the column selection signal. At this time, in the case when the internal column address signal from the address buffer 30 is coincident with the defective column address non-volatilely stored, spare column decoders 52.1 and 52.2 activate the column selection signal corresponding to the spare column SC, and give instructions to column decoders 50.1 and 50.2 so as not to carry out the selecting operation.

The column selecting signal is given to column-selection/sense amplifier circuits 200.1 and 200.2 by column selection lines. The column-selection/sense amplifier circuits 200.1 and 200.2 amplify data of bit paired lines BL, /BL by using the sense amplifier, and transmits the amplified signal to an I/O line 76 in accordance with a column selection signal.

The I/O line 76 transmits and receives memory data to and from the data input/output terminal 15 through the reading-amplifier/writing driver 80 and the input/output buffer 85. Thus, in the normal operation, memory data is transmitted and received between the data input/output terminal 15 and the memory cell MC.

As described above, for example, the control circuit 26 controls the starting and finishing processes of the testing operation in BIST circuit 2000, or generates, for example, internal control signals int. Comd including signals SON, ZSOP, etc., for amplifying the sense amplifier so as to control the internal operation of DRAM 1000, in the case when the reading operation is specified by the combination of the external control signals.

Structure of BIST Circuit 2000

Figure 2:
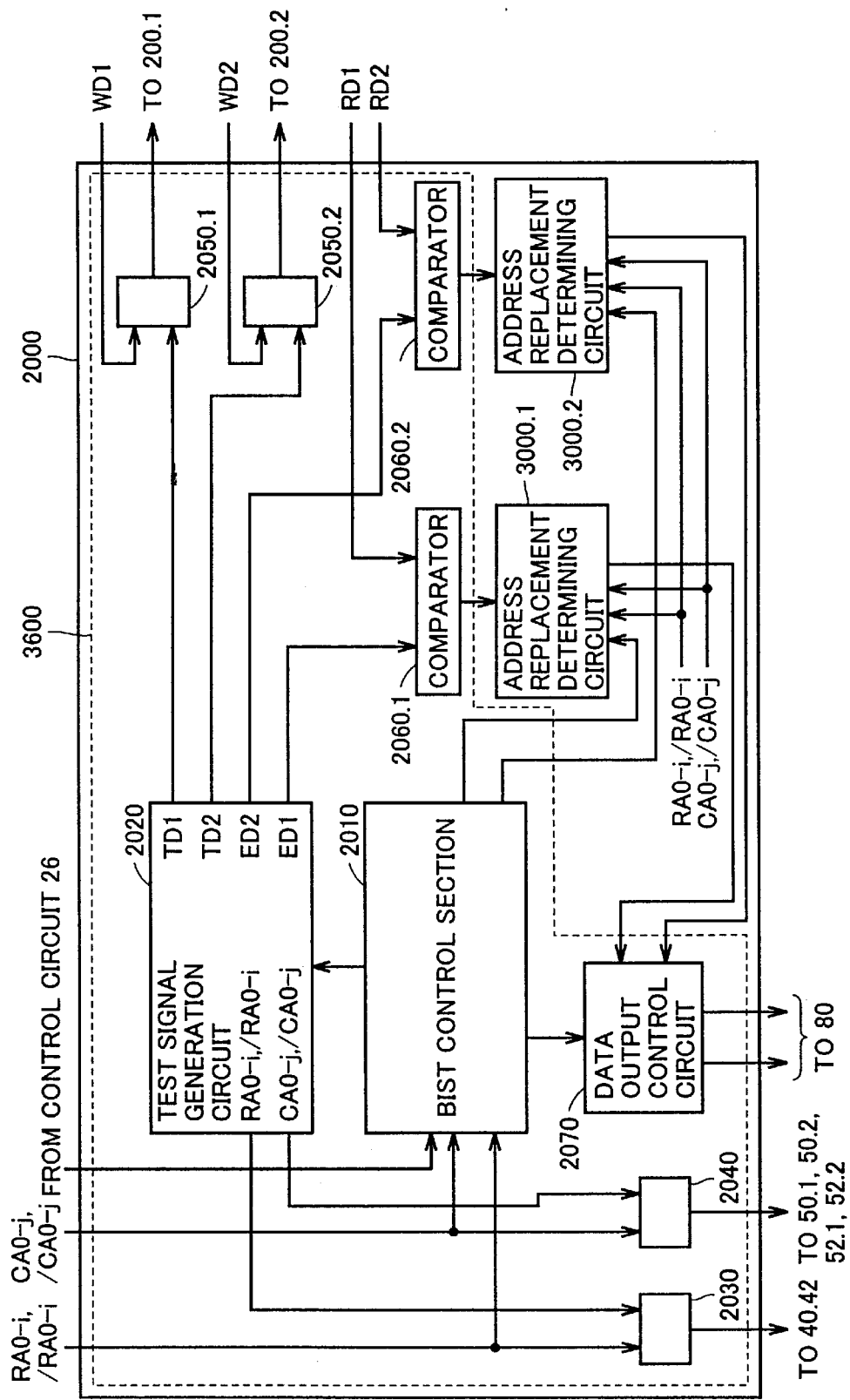
FIG. 2 is a schematic block diagram that explains the structure of a BIST circuit 2000 shown in FIG. 1.

FIG. 2 is a schematic block diagram that explains the structure of a BIST circuit 2000 shown in FIG. 1.

Referring to FIG. 2, a self-analyzing control section 3600 in BIST circuit 2000 is provided with a BIST control section 2010 for controlling the built-in testing operation in accordance with the control from the control circuit 26, and a test signal generator 2020 which is controlled by BIST control section 2010 to generate internal row address signals RA0–RAi, /RA0–/RAi and internal column address signals CA0–CAj, /CA0–/CAj, test writing data TD1, TD2 and expectation value data ED1, ED2 respectively corresponding to sub-memory cell arrays 100.1 and 100.2, during the built-in test operation.

Self-analyzing control section 3600 further comprises a multiplexer 2030 which is controlled by BIST control section 2010, receives the internal row address signals RA0–RAi, /RA0–/RAi from the address buffer 30 and the internal row address signal from the test signal generator, selectively supplies either one of the received internal row address signals to row decoder 40 and spare row decoder 42 in accordance with the operation mode, a multiplexer 2040 which is controlled by BIST control section 2010, receives the internal column address signals CA0–CAj, /CA0–/CAj from the address buffer 30 and the internal column address signal from the test signal generator 2020, and outputs either one of the received internal column signal in accordance with the operation mode to column decoders 50.1 and 50.2 as well as to spare column decoders 52.1 and 52.2, and multiplexers 2050.1 and 2050.2 which are controlled by BIST control section 2010, receives writing data pair WD1 and WD2 from the writing driver 80 and test writing data pair TD1 and TD2 from the test signal generator 2020, and give either of the pairs to column selection gates 200.1 and 200.2 in accordance with the operation mode.

In the reading operation in the built-in test mode, self-analyzing control section 3600 is further provided with a comparator 2060.1 which receives reading data RD1 from sub-memory cell array 100.1 through the column collection/sense amplifier circuit 200.1, and compares this with the expected value data ED1, and outputs a pass/fail signal P/F in accordance with the coincidence and non-coincidence of the result of comparison, and a comparator 2060.2 which receives reading data RD2 from sub-memory cell alley 100.2 through the column selection/sense amplifier circuit 200.2, compares this with the expected value data ED from the test signal generator 2020, and outputs a pass/fail signal P/F in accordance with the coincidence and non-coincidence of the result of comparison.

Address replacement determining circuit 3000.1 in BIST circuit 2000 receives the internal row address and the internal column address signals outputted from the test signal generator during the built-in test mode, compares a defective address in normal memory cell array 100R1 in response to the activation (the case in which data ED and data RD is not coincident with each other) of the pass/fail signal P/F from comparator 2060.1 with a defective address that has been previously stored, and stores the defective address, and determines the defective addresses to be replaced by the spare rows SR and spare columns SC. In response to the activation of pass/fail signal P/F from the comparator 2060.2, address replacement determining circuit 3000.2 compares a defective address in the normal memory cell array 100R2 with the defective address previously stored, stores new defective address, and determines the defective addresses to be replaced by the spare rows SR and spare columns SCII.

Self-analyzing control section 3600 is further provided with a data output control circuit 2070, which is controlled by BIST control 2010. The data output control circuit 2070, after the completion of the testing operation in BIST circuit 2000 in response to the instruction from the control circuit 26, outputs defective row addresses and defective column addresses as well as data indicating the availability of the repair by the replacement, which are all stored in address replacement determining circuits 3000.1 and 3000.2, to the data input/output terminal 15 through the reading amplifier/writing driver 80 and the input/output buffer 85. Here, the data output from the data output control circuit 2070 is successively read out from address replacement determining circuits 3000.1 and 3000.2 in accordance with an external instruction when BIST circuit 2000 enters into the data output mode in the test mode in accordance with, for example, the data given to the control signal input terminal group 11 and the address input terminal group 13.

Figure 3:
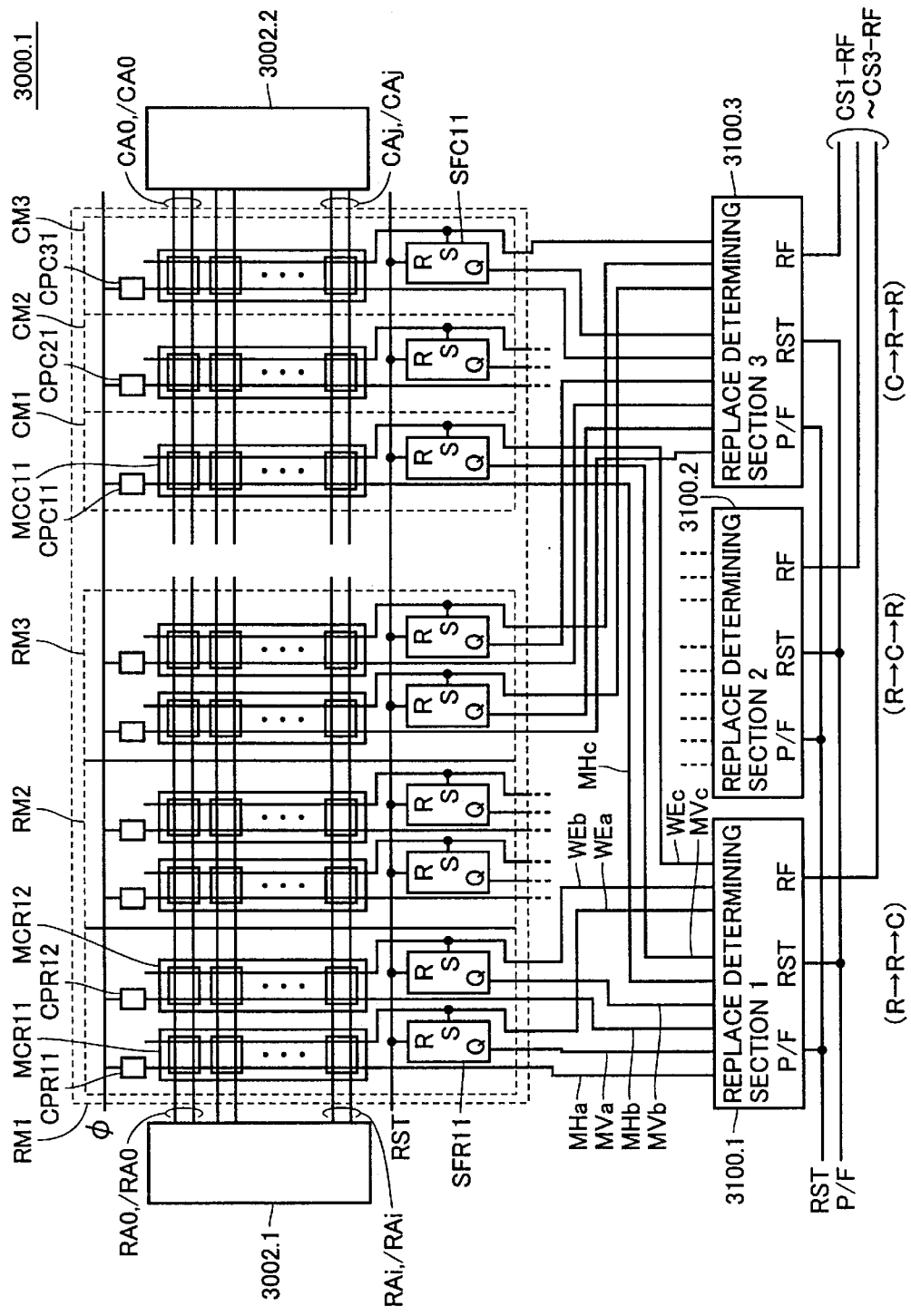
FIG. 3 is a schematic block diagram that explains the structure of a first displacement determining section 3100.1 shown in FIG. 2.

FIG. 3 is a schematic block diagram that explains the structure of address replacement determining circuit 3000.1 shown in FIG. 2. The structure of address replacement determining circuit 3000.2 is basically the same.

Prior to explaining the structure of address replacement determining circuit 3000.1, a brief explanation will be given of the processing sequence in which a defective address in sub-memory cell array 100.1 in FIG. 1 is replaced by spare rows SR1 and SR2 as well as spare columns SCI.

Here, as described above, since there are two spare rows in sub-memory cell array 100.1 with one spare column, the following three combinations are possible as to in what order the defective memory cells successively detected are replaced by spare rows and spare columns, depending on what step among the three steps for carrying out the respective replacements is used for carrying out the replacement with the spare row or the spare column.

In the following description also, the replacement with the spare row is represented by R, and the replacement with the spare column is represented by C.

Case 1: R→R→C
Case 2: R→C→R
Case 3: C→R→R

In other words, when a determination is made as to what number of step among the three steps is used for making the replacement with the spare column, such a combination is determined; thus, the total number of such combinations is represented by the number of combinations in the case when one is taken out from three (spare rows 2+spare column 1), that is, the number of combinations $_{(2+1)}C_1 = (2+1)!/\{2! \cdot 1!\} = 3$.

Here, with respect to a natural number k, k! represents a factorial of the natural number k.

In general, in the case of m-number of spare rows with n-number of spare columns, such a number of combinations is represented by $_{(m+n)}C_n = _{(m+n)}C_m = (m+n)!/(m! \times n!)$.

In the case when all the defective memory cells are finally replaced and repaired by using two spare rows and one spare column, it is certain that there is an order of replacing processes between spare rows and spare columns that makes the repair available among the above-mentioned three orders.

In address replacement determining circuit 3000.1 shown in FIG. 3, parallel processes are carried out with respect to the three systems so that the above-mentioned three cases are respectively checked in parallel with each other.

Referring to FIG. 3, address replacement determining circuit 3000.1 is provided with first to third replacement determining sections 3100.1 to 3100.3 for respectively determining whether or not the repair is available by replacing the defective addresses when replacement processes of defective addresses are respectively carried out in accordance with cases 1 to 3.

Address replacement determining circuit 3000.1 is provided with row address storing portions RM1 to RM3, each storing row addresses to be replaced by two spare rows in association with the first replacement determining section 3100.1 to the third replacement determining section 3100.3, and column address storing portions CM1 to CM3 for storing a column address to be replaced by one spare column.

For example, in the above-mentioned case 1, with respect to the first replacement determining section 3100.1 that is installed for processes which carry out the replacement by using a spare column after having carried out replacing processes twice by using spare rows, row address storing portion RM1 and column address storing portion CM1 are respectively installed.

Row address storing portion RM1 is provided with a storing cell train MCR11 for storing row addresses to be replaced by the first spare row SR1 and a storing cell train MCR12 for storing row addresses to be replaced by the second row SR2.

Here, column address storing portion CM1 is provided with a storing cell train MCC11 for storing column addresses to be replaced by the first spare column SC1.

The transmission of address signals to the storing cell trains is carried out by driving the level of the address signal lines (CAM cell bit lines) using the driver/sense amplifier circuit 3002.1 or 3002.2.

As described earlier, the first replacement determining section 3100.1 is related to the case 1; therefore, each time the pass/fail signal P/F activates the corresponding row address storing portion RM1 and the storing cell train of the column address storing portion CM1 in the order of the storing cell train MCR11, the storing cell train MCR12 and the storing cell train MCC11, it makes a determination as to whether or not the internal address signal at that time should be taken into the storing cell train.

In association with the storing cell trains MCR11, MCR12 and MCC11, pre-charge circuits CPR11, CPR12 and CPC11 are respectively installed. The pre-charge circuits CPR11 to CPC11 pre-charge matching determining lines MHL, installed in association with the corresponding storing cell trains MCR11 to MCC11, to a "High" level in response to a signal φ from BIST control section 2010.

Storing cell trains MCR11 to MCR12 include content addressable memory cells (referred to as "CAM" cells) that are respectively installed in association with pairs of internal row address signals RA0, /RA0 to RAi, /RAi, and store the levels of these signals.

In the same manner, the storing cell train MCC11 is installed in association with pairs of the internal column address signals CA0, /CA0 to CAj, /CAj, and includes CAM cells for storing these signal levels.

Each of CAM cells in the row address storing portion RM1 and column address storing portion CM1 stores the level of the corresponding internal row address signal or internal address signal in response to the level of the CAM cell word line TWL that is set to the active level ("H" level) in accordance with the instruction from the corresponding first replacement determining section 3100.1.

Here, the level of the matching determining line MHL, which has been preliminarily pre-charged to the "H" level, is allowed to maintain the "H" level in the case when the level of the address signal that has already stored by the storing cell train is coincident with the level of the internal address signal RA0, /RA0 to RA0i, /RAi or the internal column address signal CA0, /CA0 to CAj, /CAj. In contrast, if it is not coincident, the level of the matching determining line MHL is set to the "L" level.

Moreover, in association with the storing cell trains MCR11, MCR12 and MCC11, flip-flop circuits SFR11, SFR12 and SFC11 are respectively installed. The levels of the flip-flop circuits SFR11 to SFC11 are reset by a reset signal RST prior to the start of the testing operation. The levels of the flip-flop circuits SFR11 to SFC11 are set in response to the CAM word line TWL of the corresponding storing cell train is set to an active state ("H" level).

The second replacement determining section 3100.2, which corresponds to the case 2, is provided with row address storing portion RM2 and column address storing portion CM2 so as to deal with the process for alternately carrying out the replacing operation by using spare rows and the replacing operation by using spare columns. The second replacement determining section 3100.2 deals with the storing cell trains within the corresponding row address storing portion RM2 and column address storing portion CM2, and makes a determination as to whether or not the internal address signal thereof is to be written in the storing cell train each time the pass/fail signal P/F is activated in the order of the storing cell train MCR21, storing cell train MCC21 and storing cell train MCR22. The other structure is the same as the first replacement determining section 3100.1.

With respect to the third replacement determining section 3100.3 also, only the corresponding storing cell trains and the order of the writing to the corresponding storing cell trains are different in accordance with the case 3, with the other structure being the same as that of the replacement determining section 3100.1; therefore, the description thereof is omitted.

Figure 30:
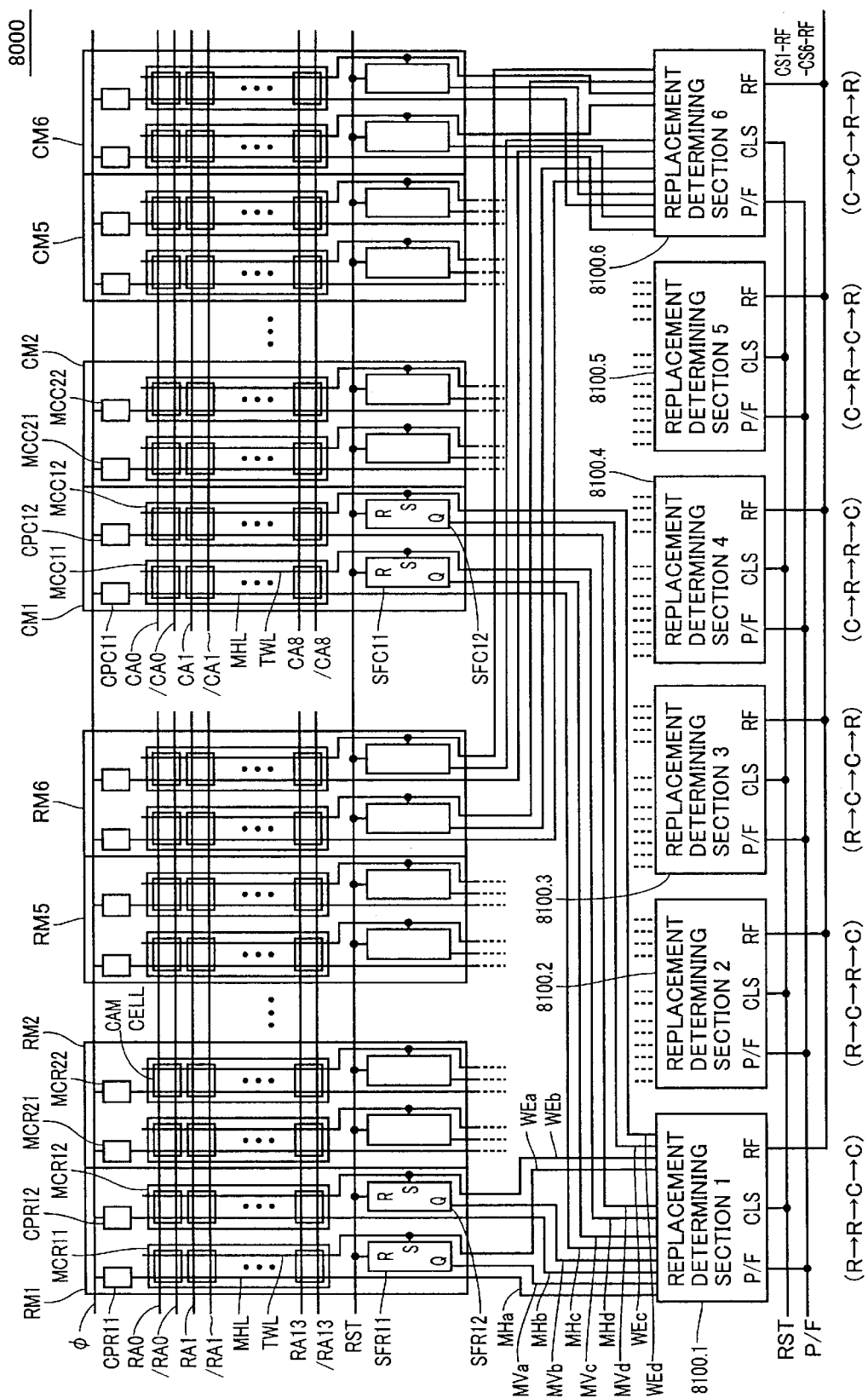
FIG. 30 is a schematic block diagram that explains the structure of an address replacement determining device 8000 contained in a conventional BIST circuit 7000.
Figure 31:
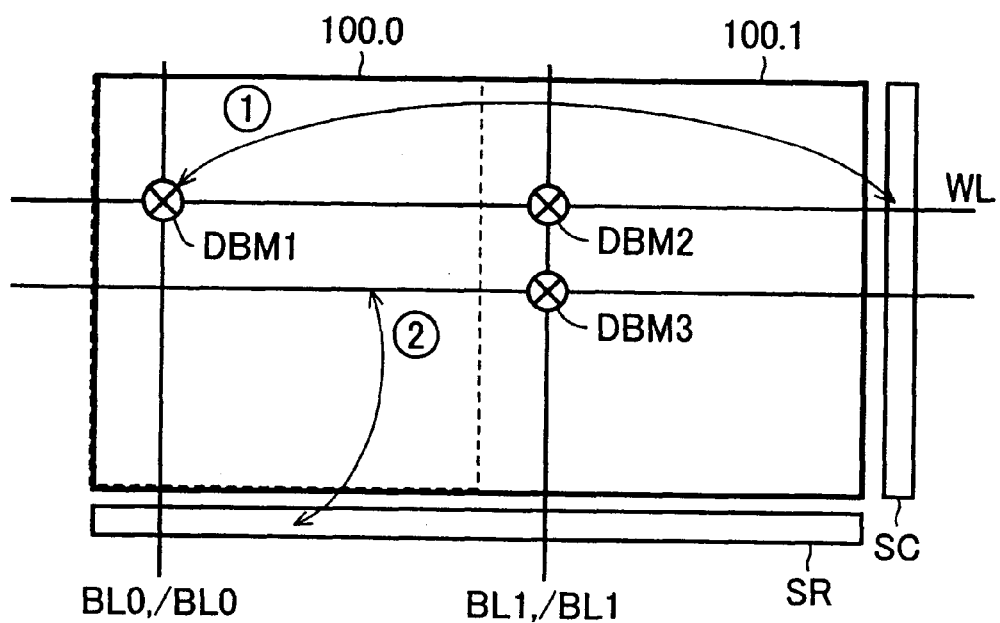
FIG. 31 is a conceptual drawing that explains the replacing operation by a redundant memory cell array in the case when the memory cell array 100 is divided into two sub-memory arrays 100.0 and 100.1.

Moreover, in the above-mentioned structure, the operation of the replacement determining section 3100.1 during the determining process is the same as that explained in FIG. 30; therefore, the explanation thereof is omitted.

Figure 4:
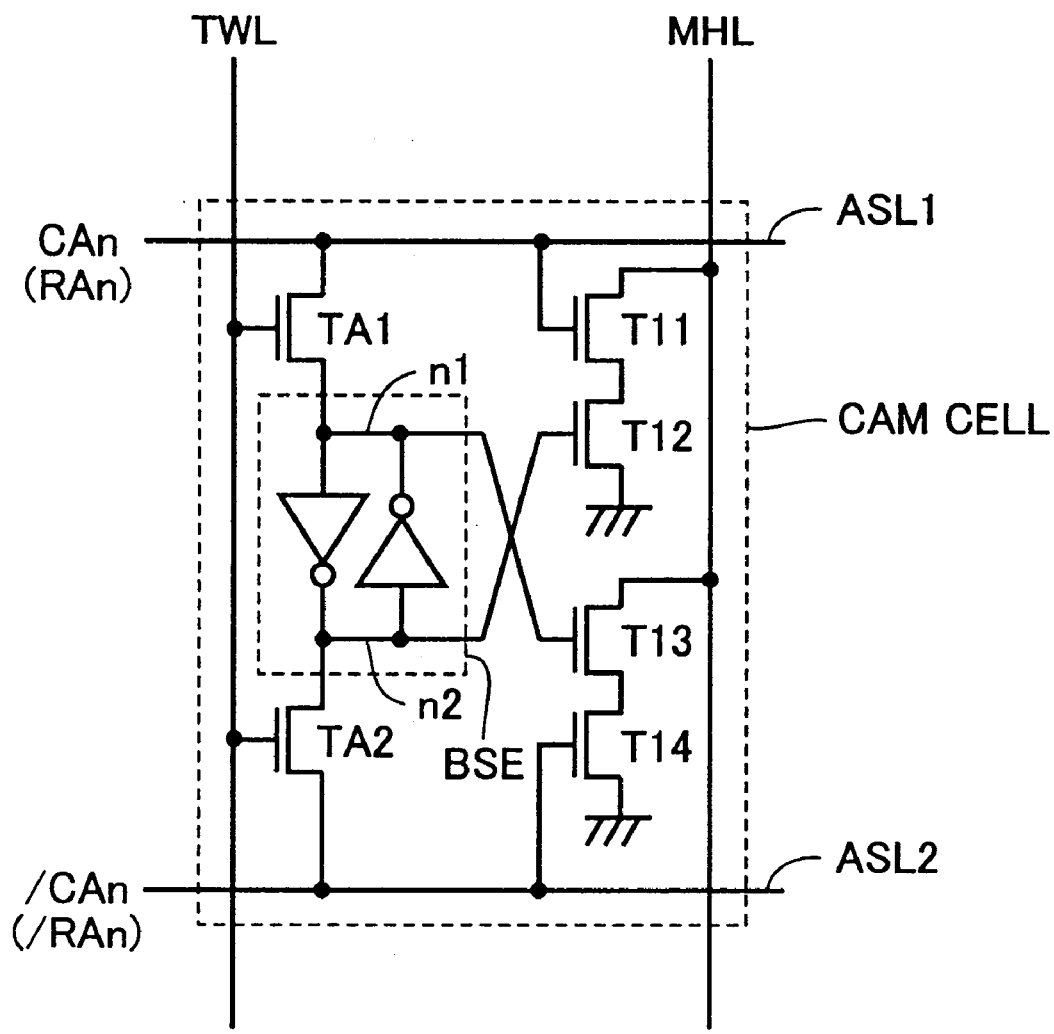
FIG. 4 is a circuit diagram that shows the structure of a CAM cell shown in FIG. 3.

FIG. 4 is a circuit diagram that shows the structure of a CAM cell shown in FIG. 3.

The CAM cell is provided with a memory element BSE including an address signal line (CAM cell bit line) ASL1 for transmitting an internal column address signal CAn or an internal row address signal RAn (n: natural number) and two inverters INV1 and INV2, an N-channel-type access transistor TA1 for connecting the memory node n1 of the memory element BSE and the address signal line ASL1 in accordance with the level of signal line TWL, an address signal line (CAM cell bit line) ASL2 for transmitting an internal address signal/CAn or /RAn that is complementary to an address signal CAn or RAn, an N-channel-type access transistor TA2 for connecting the memory node n2 of memory element BSE to address signal line ASL2 in accordance with the level of line TWL, N-channel transistors T11 and T12 that are series-connected between matching detection line MHL and the ground potential, and transistors T13 and T14 that are series-connected between matching detection line MHL and the ground potential.

The gate of transistor T11 is connected to address signal line ASL1, and the gate of transistor T12 is connected to the memory node n2 of memory element BSE.

The gate of transistor T13 is connected to the memory node n1 of memory element BSE, and the gate of transistor T14 is connected to address signal line ASL2.

In other words, in response to the activation of writing selection line TWL, memory element BSE is connected to address signal lines ASL1 and ASL2. Here, in the case when the data held in memory element BSE is not coincident with the internal address signal on address signal lines ASL1 and ASL2, matching detection line MHL is connected to the ground potential and discharged through either the path of transistors T11 and T12 or the path of transistors 13 and T14.

Figure 5:
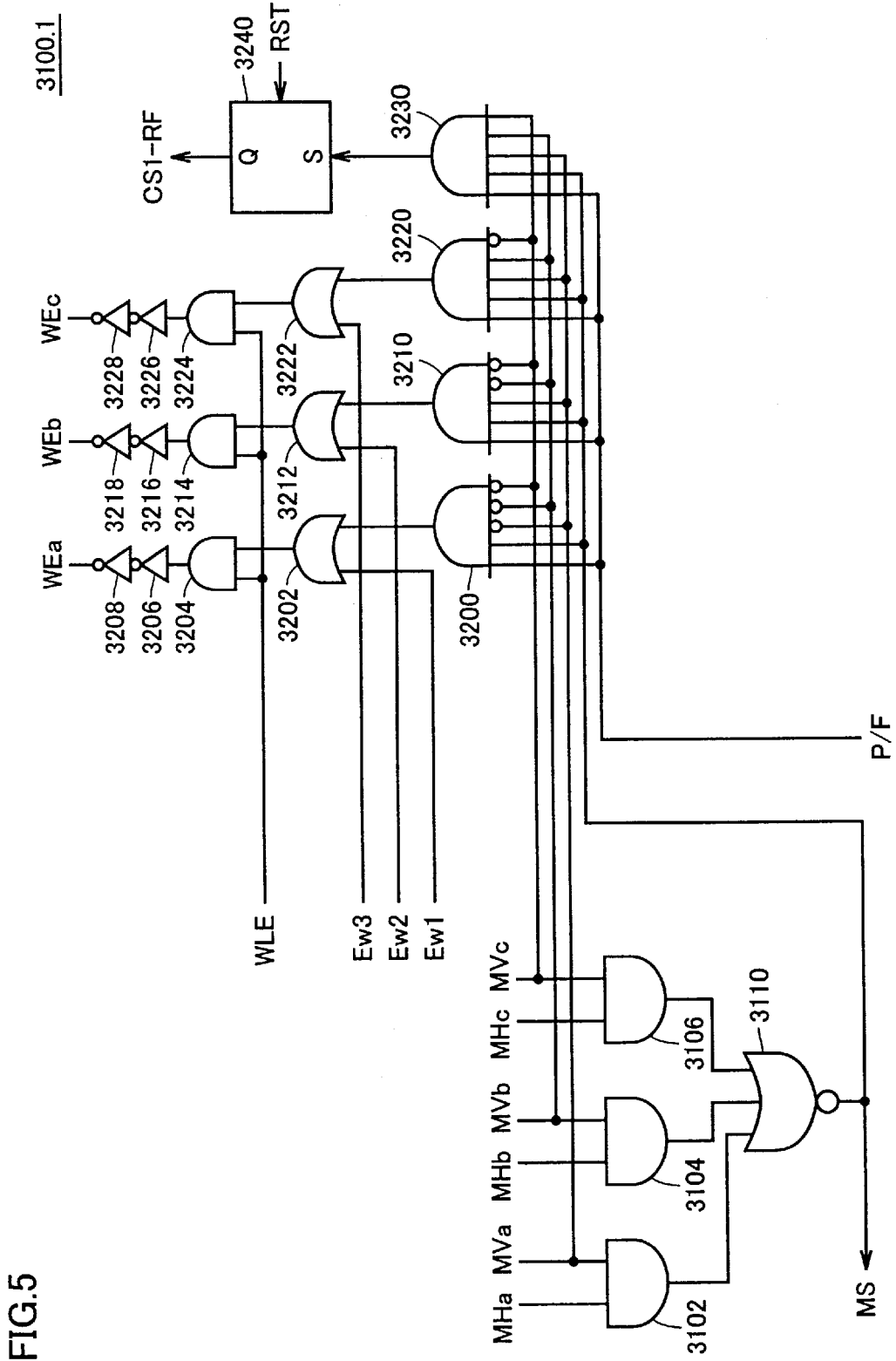
FIG. 5 is a schematic block diagram that explains the structure of a first replacement determining device 3100.1 shown in FIG. 3.

FIG. 5 is a schematic block diagram that explains the structure of the first replacement determining section 3100.1 shown in FIG. 3.

The structures of the second replacement determining section 3100.2 and the third replacement determining section 3100.3 are basically the same except that different storing cell trains are connected.

The first replacement determining section 3100.1 is provided with an AND circuit 3102 the input node of which is connected to the matching detection line MHL of storing cell train MCR11 and the output of flip-flop circuit SFR11, an AND circuit 3104 the input node of which is connected a matching detection line MHL of storing cell train MCR12 and the output of flip-flop circuit SFR12, an AND circuit 3106 the input node of which is connected to the matching detection line MHL of storing cell train MCR11 and the output of flip-flop circuit SFC11, and a 3-input NOR circuit 3110 for outputting a signal MS upon receipt of an output from AND circuits 3102 to 3106.

In the following description, among the input nodes of AND circuits 3102 to 3106 of the first replacement determining section 3100.1, those input nodes to be connected to matching detection line MHL are respectively represented by MHa, MHb and MHc, and those input nodes to be connected to outputs of flip-flop circuits SFR11 to SFC11 are represented by MVa, MVb and MVc.

The first replacement determining section 3100.1 is further provided with a logical gate 3200 which receives a level inversion signal of node MVa, a level inversion signal of node MVb, a level inversion signal of node MVc, signal MS and pass/fail signal P/F, and outputs a logical product of these signals, an OR circuit 3202 which receives the output of logical gate 3200 and a signal Ew1 that is given from BIST control section 2010 and that is made active upon reading data after the completion of the testing operation, an AND circuit 3204 for receiving outputs of an activation signal WLE given from BIST control section 2010 and the output of OR circuit 3202, an inverter 3206 for inverting the output of AND circuit 3204, and an inverter 3208 which inverts the output of inverter 3206 to output a selection signal WEa to be given to CAM cell word line TWL of storing cell train MCR11.

The first replacement determining section 3100.1 is further provided with a logical gate 3210 which receives a level signal of node MVa, a level inversion signal of node MVb, a level inversion signal of node MVc, signal MS and pass/fail signal P/F, and outputs a logical product of these signals, an OR circuit 3212 which receives the output of logical gate 3210 and a signal Ew2 that is given from BIST control section 2010, an AND circuit 3214 for receiving outputs of an activation signal WLE given from BIST control section 2010 and the output of OR circuit 3212, an inverter 3216 for inverting the output of AND circuit 3214, and an inverter 3218 which inverts the output of inverter 3216 to output a selection signal WEb to be given to CAM cell word line TWL of storing cell train MCR12.

The first replacement determining section 3100.1 is further provided with a logical gate 3220 which receives a level signal of node MVa, a level signal of node MVb, a level inversion signal of node MVc, signal MS and pass/fail signal P/F, and outputs a logical product of these signals, an OR circuit 3222 which receives the output of logical gate 3220 and a signal Ew3 that is given from BIST control section 2010, an AND circuit 3212 for receiving outputs of an activation signal WLE given from BIST control section 2010 and the output of OR circuit 3222, an inverter 3226 for inverting the output of AND circuit 3224, and an inverter 3228 which inverts the output of inverter 3226 to output a selection signal WEc to be given to CAM cell word line TWL of storing cell train MCC11.

The first replacement determining section 3100.1 is further provided with a 5-input AND circuit 3230 which receives a level signal of node MVa, a level signal of node MVb, signal MS and pass/fail signal P/F, and outputs a logical product of these signals and a flip-flop circuit 3240 which is reset in response to a reset signal RST, and set in response to the output from AND circuit 3230 so that a repair fail signal CS1-RF for the case 1 is outputted.

Therefore, the repair fail signal CS1-RF is set to "L" level in the case when, within the range of two spare rows and one spare column, a defective memory cell in the corresponding sub-memory cell array 100.1 is repaired by the replacement in the order of R→R→C, while in the case when no replacement is available, it is set to "H" level.

Figure 6:
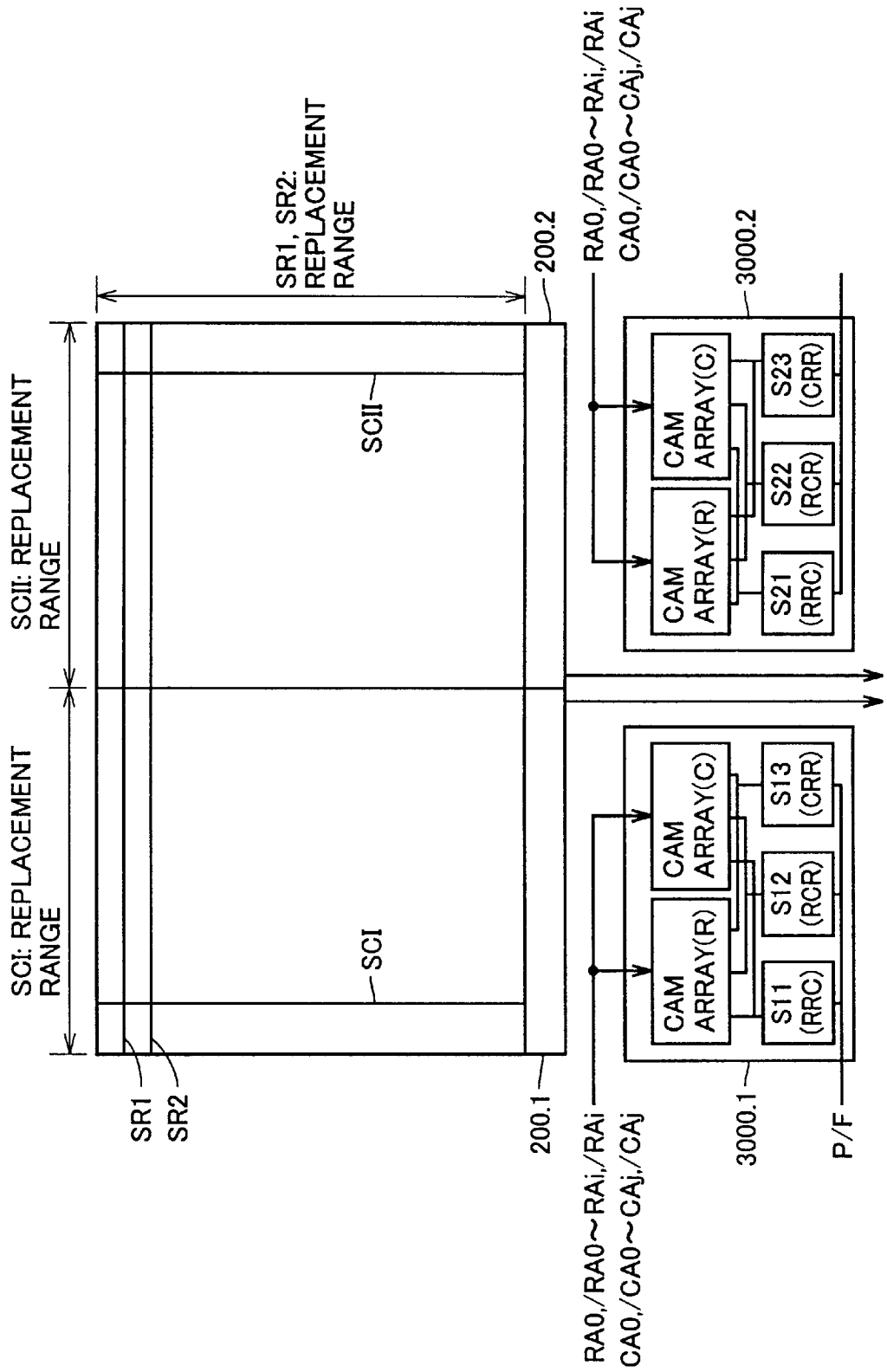
FIG. 6 is a schematic block diagram that shows the structures of sub-memory cell arrays 100.1 and 100.2, and address replacement determining circuits 3000.1 and 3000.2 in an extracted manner.

FIG. 6 is a schematic block diagram that shows the structure of sub-memory cell alleys 100.1 and 100.2 and address replacement determining circuits 3000.1 and 3000.2 in an extracted manner among the structure shown in FIG. 1.

As illustrated in FIG. 6, spare column SCI, installed in association with sub-memory cell array 100.1, replaces by a defective memory cell column within the range of sub-memory cell array 100.1, and spare column SCII, installed in association with sub-memory cell array 100.2, replaces a defective memory cell column within the range of sub-memory cell array 100.2.

In contrast, spare memory cell rows SR1 and SR2 carry out replacements of defective memory cell rows commonly with respect to sub-memory cell arrays 100.1 and 100.2.

Here, as described earlier, address replacement determining circuit 3000.1 makes a determination as to the possibility of repair by the replacement on the assumption that spare rows SR1 and SR2 are allowed to carry out the replacing process independently on sub-memory cell array 100.1 and sub-memory cell array 100.2.

In other words, address replacement determining circuit 3000.1 makes a determination as to the possibility of repair by the replacement on the assumption that the replacement by spare column SCI is available within an address space of sub-memory cell array 100.1 and that the replacement by spare rows SR1 and SR2 is available only within the address space of sub-memory cell array 100.1. Therefore, after the completion of a self-redundant analyzing process that is executed in parallel with the built-in self test, from replacement determining sections 3100.1 to 3100.3 in address replacement determining circuit 3000.1 are outputted repair fail signals CS1-RF to CS3-RF that show the possibility of repair on the assumption that spare rows SR1 and SR2 and spare column SCI can carry out replacements within sub-memory cell array 100.1 independent of the replacement in sub-memory cell array 100.2.

In the same manner, at the time when the results of the self-redundant analyzing operation carried out in parallel with the built-in self test are given, from replacement determining sections 3100.1 to 3100.3 in address replacement determining circuit 3000.2 are outputted repair fail signals that show the possibility of repair on the assumption that spare rows SR1 and SR2 and spare column SCII can carry out replacements within sub-memory cell array 100.2 independent of the replacement in sub-memory cell array 100.1.

Figures 7, 8:
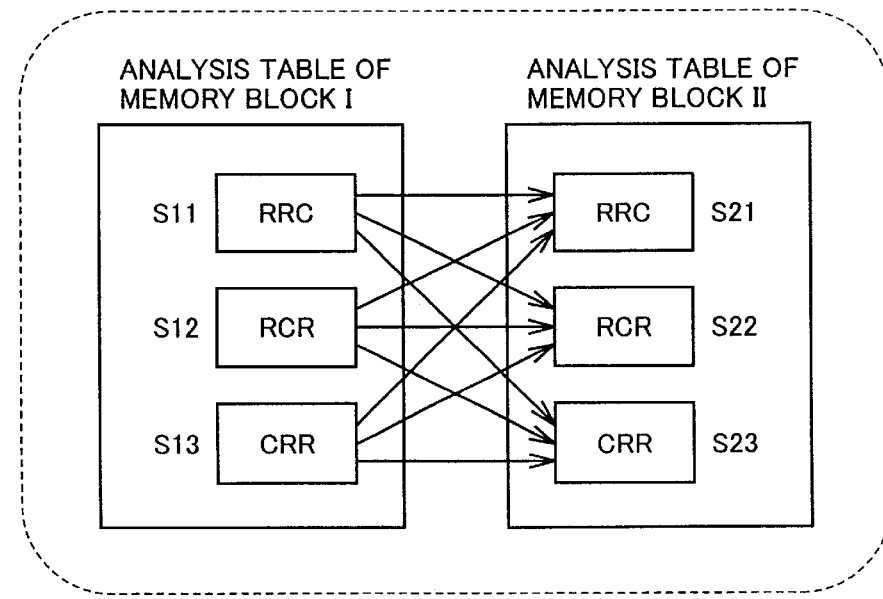
FIG. 7 is a conceptual drawing that shows a set of a defective row address and a defective column address to be replaced and a repair fail signal, that correspond to each of cases 1 to 3 in the order of redundant replacements.
FIG. 8 is a conceptual drawing that shows the results of a self-redundant analysis that is carried out in parallel with a built-in self test for detecting a defective memory cell.

FIG. 7 is a conceptual drawing that shows a set of a defective row address and a defective column address that are to be replaced and a repair fail signal that correspond to each of the cases 1 to 3 in the redundant replacing order, stored in address replacement determining circuits 3000.1 and 3000.2 in this manner at the time of the completion of the self redundant analyzing process.

In FIG. 7, candidates S11 of the repair solution refers to a repair fail signal in redundant replacement determining section 3100.1 and the corresponding defective row addresses and defective column addresses stored in CAM array that correspond to the replacing order "RRC" in the address replacement determining circuit 3000.1.

In the same manner, candidates S21 of the repair solution refers to a repair fail signal in redundant replacement determining section 3100.1 and the corresponding defective row addresses and defective column addresses stored in CAM array that correspond to the replacing order "RRC" in the address replacement determining circuit 3000.2.

With respect to another combination in the replacement order, the same set of data is obtained upon completion of the self-redundant analyzing process.

FIG. 8 is a conceptual drawing that shows the self-redundant analyzing process (hereinafter, referred to as "primary analysis") that is carried out in parallel with the built-in self test for detecting a defective memory cell.

With respect to sub-memory cell array 100.1 (memory block I), candidates S11, S12 and S13 for the repair solution are obtained in association with the respective replacement orders "RRC", "RCR" and "CRR".

In the same manner, with respect to sub-memory cell array 100.2 (memory block II), candidates S21, S22 and S23 for the repair solution are obtained.

The candidates S11 to S23 are found on the assumption that spare rows SR1 and SR2 are independently selectable from sub-memory arrays 100.1 and 100.2 respectively, although as described above, they are commonly selected from sub-memory arrays 100.1 and 100.2.

Here, it is assumed that, under the condition that spare rows SR1 and SR2 are commonly selected with respect to sub-memory cell arrays 100.1 and 100.2, all the defective memory cell rows and defective memory cell columns within memory cell arrays 100 (sub-memory cell arrays 100.1 and 100.2) can be repaired finally by spare rows SR1 and SR2 as well as spare columns SCI and SCII. In this case, it is supposed that among candidates S11 to S13 for the repair solution by the primary analysis with respect to sub-memory array 100.1, the corresponding final repair solution to be obtained on the assumption that spare rows SR1 and SR2 are commonly selected with respect to two sub-memory cell arrays is present.

In the same manner, it is supposed that if it finally can be repaired, among candidates S21 to S23 for the repair solution by the primary analysis with respect to sub-memory array 100.2, the corresponding final repair solution to be obtained on the assumption that spare rows SR1 and SR2 are commonly selected with respect to two sub-memory cell arrays is present.

Therefore, it is supposed that if it finally can be repaired, among a set of candidates S11 to S13 and a set of candidates S21 to S23 one is selected to form a pair, and comparison is made with respect to this pair in a round-robin system, it is supposed that the pair of the repair solutions in which both of the two defective row addresses to be repaired by spare rows are equal to each other are present.

Here, the searching process for the final solution in such a round-robin system is referred to as "secondary analysis". In this case, the range of candidates for the repair solution that are to be subjected to the secondary analysis can be limited to candidates for the repair solution that are determined as successful ones as a result of the primary analysis.

In the secondary analysis, if a pair of candidates for the repair solution in which two defective row addresses to be replaced are mutually equal to each other, for example, candidates S11 and S22 for the repair solution, are found, this case shows that the redundant repair is possible by using spare rows SR1 and SR2 as well as spare columns SCI and SCII.

Here, in the secondary analysis, if there is no pair in which two defective row addresses to be repaired are equal to each other in any of pairs of candidates for the repair solution, it is not possible to completely repair detective memory cells by using spare rows SR1 and SR2 as well as spare columns SCI and SCII.

Figure 9:
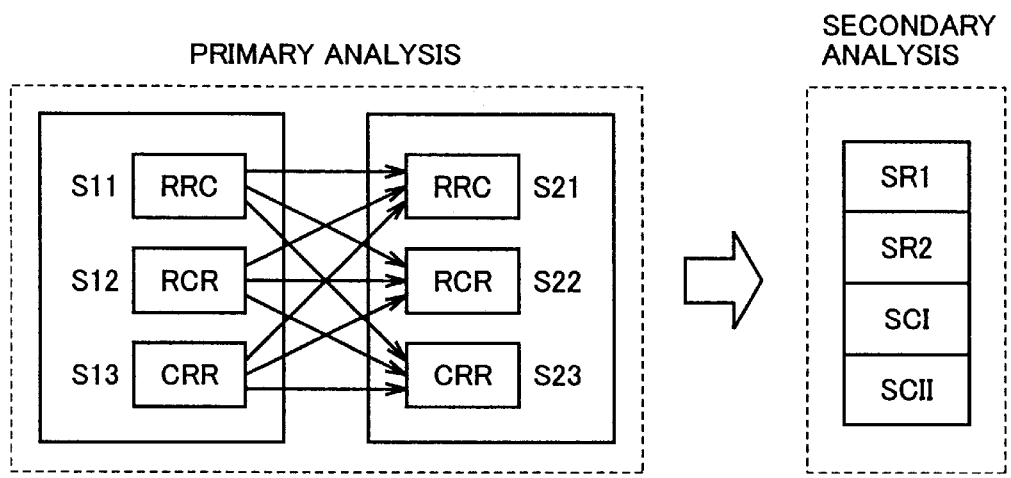
FIG. 9 is a conceptual drawing that shows sequences of a primary analysis and a secondary analysis.

FIG. 9 is a conceptual drawing that shows sequences of these primary analysis and secondary analysis.

As described above, in the primary analysis, candidates S11 to S23 and S21 to S23 are obtained in the primary analysis. With respect to the resulting repair solutions, in the secondary analysis, since the rows are commonly selected in a round-robin system on the sub-memory cell arrays, a searching process is carried out in a round-robin system for pairs of repair solutions in which defective memory cell rows to be replaced are mutually equal to each other.

In Embodiment 1, the results of the primary analysis are read by an external device outside DRAM 1000 so that the secondary analysis is carried out by an external device outside DRAM 1000, for example, a tester device, by means of software.

Figure 10:
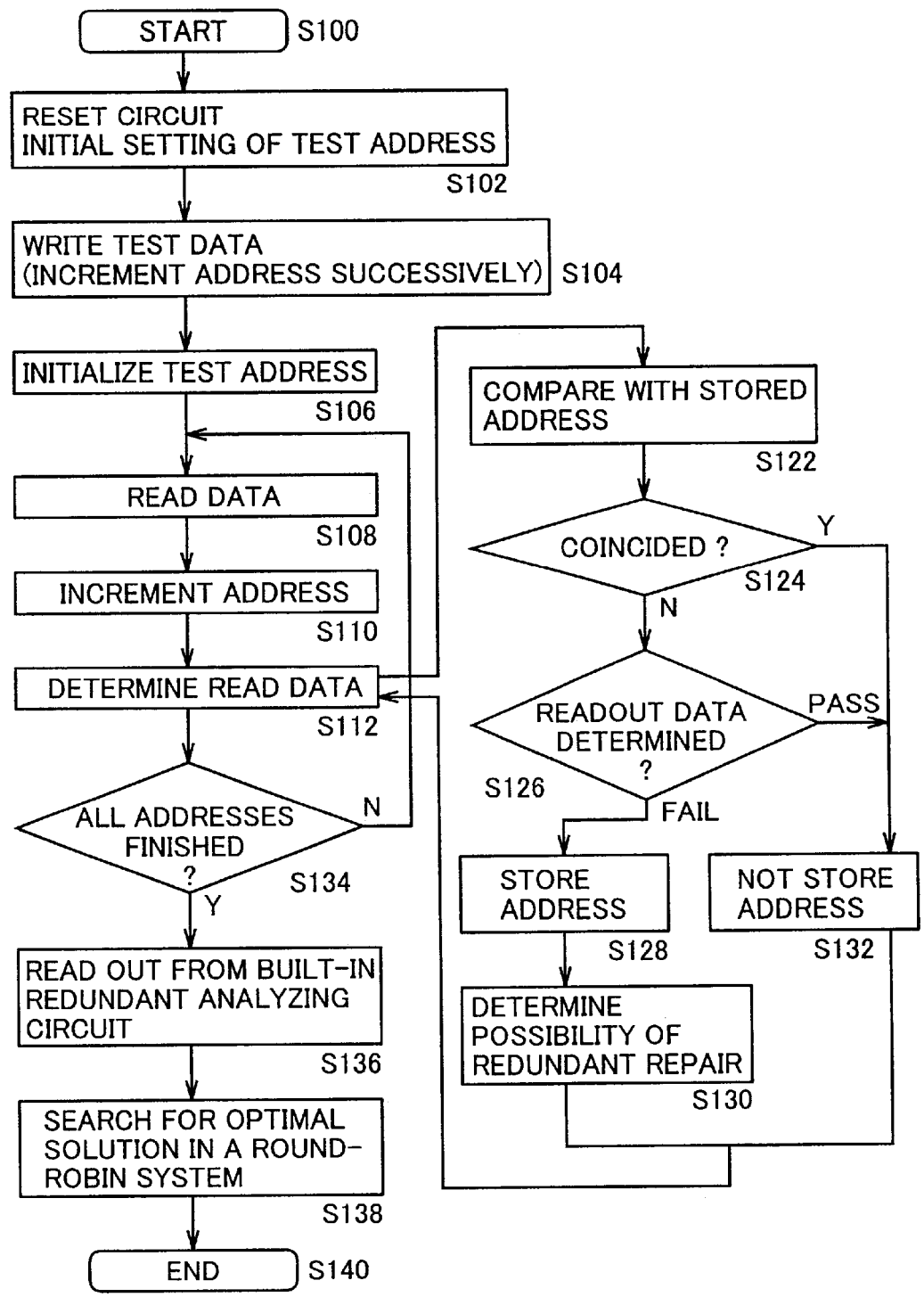
FIG. 10 is a flow chart that explains the sequence of a redundant analysis of Embodiment 1.

FIG. 10 is a flow chart that explains the sequence of the redundant analysis as explained in Embodiment 1.

First, when the built-in self test and the self-redundant analyzing process, which is carried out in parallel with this test, are started (step S100), a resetting process in BIST circuit 2000 and an initializing process for the test address are carried out (step S102).

Successively, built-in self test circuit 2000 carries out a test data writing operation on both of sub-memory cell arrays 100.1 and 100.2, while successively incrementing the address therein (step S104).

Upon completion of all the writing process of the testing operation, the initializing operation of the test address is again carried out (step S106).

Successively, data-reading operations are carried out from both of sub-memory cell arrays 100.1 and 100.2 (step S108). After the data-reading operations, the test address is incremented (step S110).

The data thus read out is compared with expected value data within BIST circuit 2000 so that a determination is carried out as to proper/defective states of memory cells MC1 and MC2 from which data have been read out, and in accordance with this operation, a pass/fail signal P/F is outputted (step S112).

Here, in accordance with the determination of these read-out data, the detected defective address is compared with addresses that have already been stored, in address replacement determining circuits 3000.1 and 3000.2 (step S122).

In the case when the stored address and the defective address newly detected are coincident with each other (step S124), no storing process is carried out (step S132), and the sequence proceeds to the next step S134.

In the case when the stored address and the defective address newly detected are not coincident with each other (step S124), if the result of determination of read-out data is normal (step S126), no storing process is carried out (step S132), and the sequence proceeds to the next step S134.

In contrast, the result of determination of read-out data shows defective bits (step S126), the activation signal of the word line with respect to CAM sell is activated so that the storing process of the address is carried out (step S128); thus, in response to the fact as to whether or not the output level (level of the repair fail signal) of flip-flop circuit 3240 is altered, a determination as to the possibility of redundant repair is made (step S130), and the sequence proceeds to a step S134.

At step S134, a determination is made as to whether or not the process has been completed with respect to all the addresses, and if not completed with respect to all the addresses, the sequence returns to step S108.

In contrast, in the case when the process has been completed with respect to all the addresses (step S134), in response to an instruction from an external device, defective row address and defective column address as well as repair fail signals, stored therein, are read out from address replacement determining circuits 3000.1 and 3000.2 in built-in test circuit 2000 (step S136).

Based upon the data thus read out, for example, in the tester circuit that is an external device of the DRAM, with respect to candidates for the repair resolution that are determined as those that can be repaired with the repair fail signal RF being set to "L" level, a search is made for an optimal solution in a round-robin system (step S138).

With the above-mentioned steps, the self-redundant analyzing process is completed (step S140).

Therefore, the load required for the redundant analyzing process on the tester side is reduced in a great degree, and it is possible to carry out the redundant analyzing process without the necessity of installing a large-scale, high-speed memory on the tester side.

Moreover, since BIST circuit 2000 requires a memory capacity that is much smaller as compared with the memory capacities in sub-memory cell arrays 100.1 and 100.2, a smaller circuit scale can be used. This makes it possible to install BIST circuit 2000 on a semiconductor integrated circuit.

Here, in the above explanation, during the built-in self-testing operation, test addresses and test data are generated in BIST circuit 2000; however, the writing data to be written as the test addresses and test data may be supplied from an external device outside DRAM 1000.

In the above-mentioned explanation, it is assumed that two sub-memory cell arrays 100.1 and 100.2 are installed in DRAM 1000; however, a plurality of pairs of sub-memory arrays that have the same structures as the pair of sub-memory arrays 100.1 and 100.2 and a plurality of pairs of the corresponding address replacement determining sections 3000.1 and 3000.2 may be installed.

Embodiment 2

Figure 11:
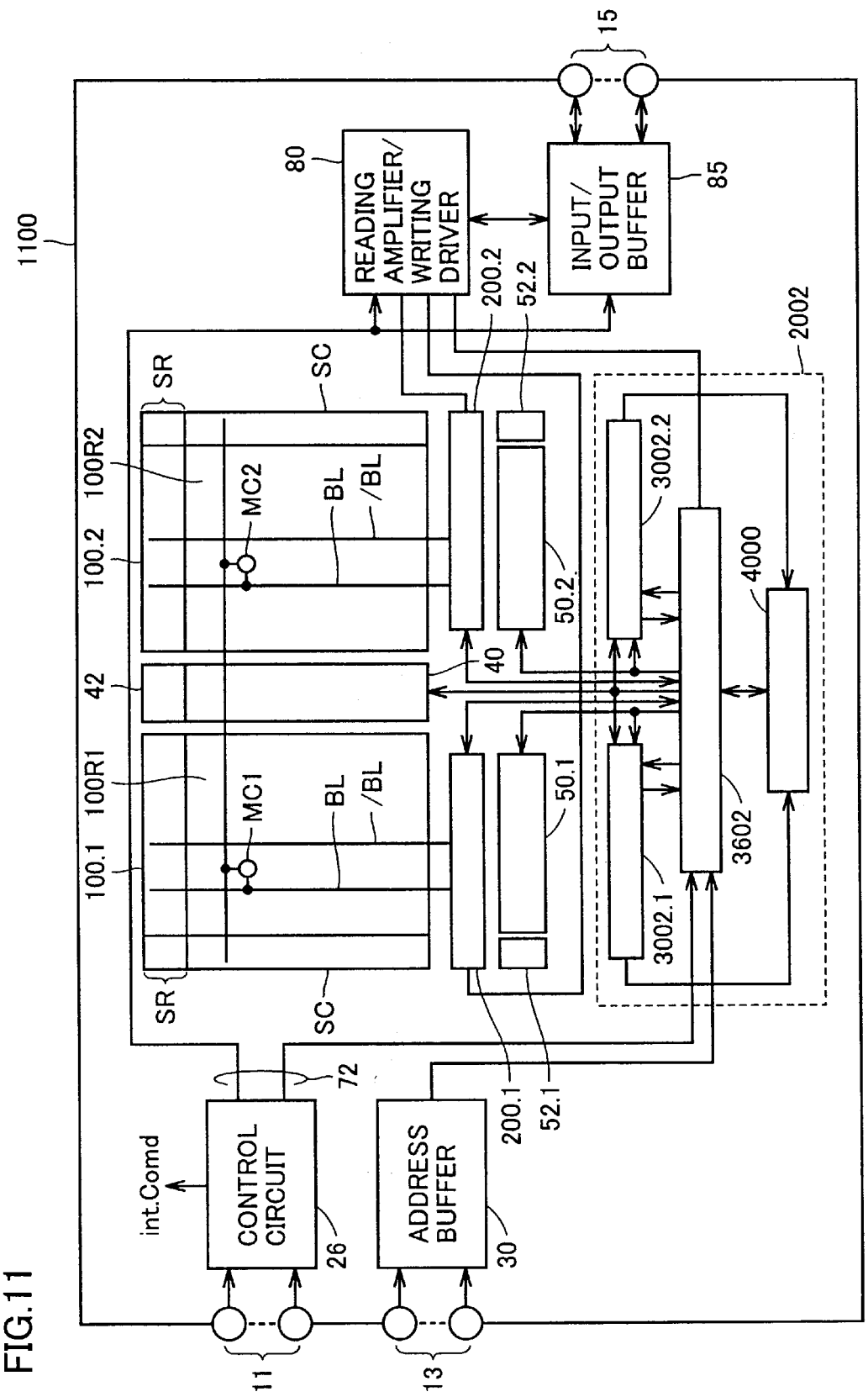
FIG. 11 is a schematic block diagram that explains the structure of a DRAM 1100 of Embodiment 2 of the present invention.

FIG. 11 is a schematic block diagram that shows the structure of a DRAM 1100 in accordance with Embodiment 2 of the present invention.

In DRAM 1000 of Embodiment 1 shown in FIG. 1, the secondary analyzing process is carried out outside DRAM 1000, by reading data concerning candidates for the repair solution from BIST circuit 2000 installed therein after the completion of the built-in self test.

In contrast, in DRAM 1100 in Embodiment 2, BIST circuit 2002, installed in DRAM 1100, makes it possible to carry out the processes up to the secondary analyzing process.

Instead of address replacement determining circuits 3000.1 and 3000.2 in DRAM 1000 in Embodiment 1, DRAM 1100 of Embodiment 2 is provided with address replacement primary determining circuits 3002.1 and 3002.2 for storing defective row addresses and defective column addresses in CAM cell arrays installed in the same region, as will be described later. Additionally, in Embodiment 1 also, instead of address replacement determining circuits 3000.1 and 3000.2, address replacement primary determining circuits 3002.1 and 3002.2 may be installed for the primary analyzing process.

BIST circuit 2002 of Embodiment 2 is further provided with an address replacement secondary determining circuit 4000 for receiving data relating to candidates for the repair solution from address replacement primary determining circuits 3002.1 and 3002.2 and for carrying out the secondary analyzing process. Moreover, in BIST circuit 2002, in place of self-analyzing control section 3600, a self-analyzing control section 3602 is installed, and self-analyzing control section 3602 outputs the results of analyses of address replacement primary determining circuits 3002.1 and 3002.2 not to the reading-amplifier/writing driver 80, but to address replacement secondary determining circuit 4000.

The other structures are the same as those of DRAM 1000 in Embodiment 1 shown in FIG. 1; therefore, the same parts are indicated by the same reference numerals, and the description thereof is omitted.

Figure 12:
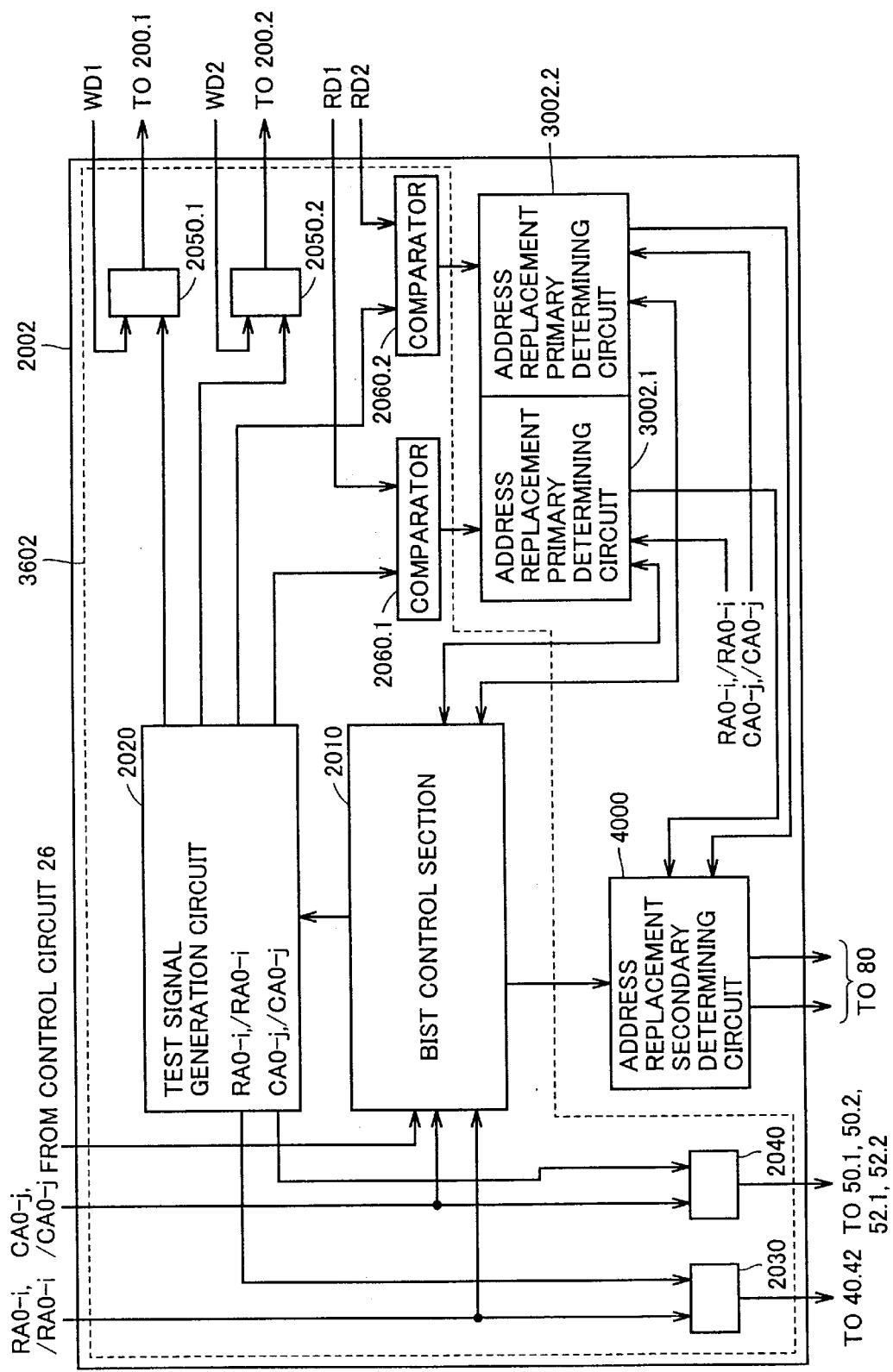
FIG. 12 is a schematic block diagram that explains the structure of a BIST circuit 2002 shown in FIG. 11.

FIG. 12 is a schematic block diagram that explains the structure of BIST circuit 2002 shown in FIG. 11.

In BIST circuit 2002, in comparison with BIST circuit 2000 of Embodiment 1, address replacement secondary determining circuit 4000 is installed in place of data output control circuit 2070. Address replacement secondary determining circuit 4000 receives the solution for repair from address replacement primary determining circuits 3002.1 and 3002.2, and carries out the secondary analyzing process.

The other structures are the same as those of BIST circuit 2000 in Embodiment 1 shown in FIG. 2; therefore, the same parts are indicated by the same reference numerals, and the description thereof is omitted.

Figure 13:
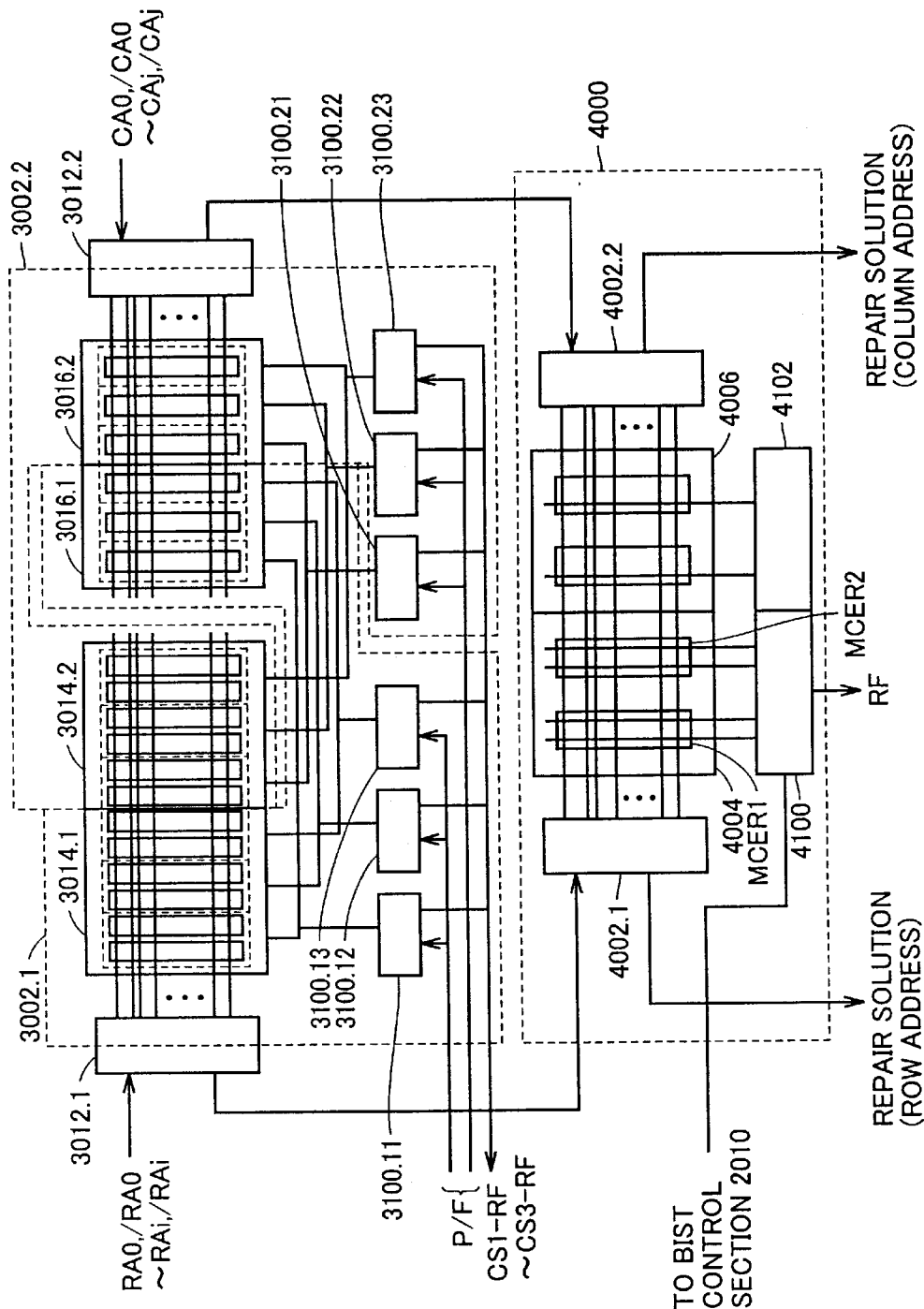
FIG. 13 is a schematic block diagram that shows the structures of address replacement primary determining circuits 3002.1 and 3002.2 and an address replacement secondary determining circuit 4000.

FIG. 13 is a schematic block diagram that explains the structures of address replacement primary determining circuits 3002.1 and 3002.2 and address replacement secondary determining circuit 4000, shown in FIG. 12.

In Embodiment 1 of FIG. 3, CAM cell array installed in association with sub-memory cell array 100.1 and CAM cell array installed in association with sub-memory cell array 100.2 are individually placed.

In contrast, in FIG. 13, CAM cell array 3014.1 for storing defective row addresses in sub-memory cell array 100.1 and CAM cell array 3014.2 for storing defective row addresses in sub-memory cell array 100.2 are installed in the vicinity of each other. Paired address signal lines (CAM cell bit paired lines) for writing and reading internal address signals are commonly installed in both of CAM cell array 3014.1 and CAM cell array 3014.2.

In the same manner, CAM cell array 3016.1 for storing defective row addresses in sub-memory cell array 100.1 and CAM cell array 3016.2 for storing defective row addresses in sub-memory cell array 100.2 are installed in the vicinity of each other. Paired address signal lines (CAM cell bit paired lines) are commonly installed in both of CAM cell array 3016.1 and CAM cell array 3016.2.

Writing driver/sense amplifier circuit 3012.1 carries out the data writing and data reading processes to and from CAM cell arrays 3014.1 and 3014.2, and writing driver/sense amplifier circuit 3012.2 carries out the data writing and data reading processes to and from CAM cell arrays 3016.1 and 3016.2.

Here, address replacement primary determining circuits 3002.1 and 3002.2 comprise the same circuits as replacement determining sections 3100.1 to 3100.3 explained by reference to FIG. 3. In the following description, replacement determining sections, installed in address replacement primary determining circuit 3002.1, are referred to as replacement determining sections 3100.11 to 3100.13, and replacement determining sections, installed in address replacement primary determining circuit 3002.2, are referred to as replacement determining sections 3100.21 to 3100.23 in a classified manner from each other.

As will be described later, first, controlled by BIST control section 2010, address replacement primary determining circuits 3002.1 and 3002.2 carry out primary analyzing processes. Upon completion of the primary analyzing processes, also controlled by BIST control section 2010, candidates for the repair solution determined as successful ones (combinations of the replacement order made by spare rows and spare columns) are selectively read from CAM cell arrays 3014.1 and 3014.2, as well as from 3016.1 and 3016.2, and transmitted to address replacement secondary determining circuit 4000.

In other words, address replacement secondary determining circuit 4000 is provided with a CAM cell array 4004 for storing defective row addresses to be replaced by spare rows SR1 and SR2 and a writing driver/sense amplifier 4002.1 which writes defective row addresses read out from writing driver/sense amplifier circuit 3002.1 in CAM sense amplifier 4004 and also carries out the reading operation.

In Embodiment 1, among pairs of candidates for the repair solution that have been determined as successful ones, the pairs of candidates for the repair solution from which the same defective row address is to be replaced are selected in an external device of DRAM 1000, for example, an external tester device, etc.

In contrast, in Embodiment 2, CAM cell array 4004 is used for detecting as to whether or not there are pairs of candidates for the repair solution that contain the same defective row address as described above.

In other words, in the same manner as CAM cell array 3014.1, etc., CAM cell array 4004 is provided with a storing cell train MCER1 for storing defective row addresses to be replaced by spare row SR1 and a storing cell train MCER2 for storing defective row addresses to be replaced by spare row SR2.

Here, in the secondary analyzing process, controlled by BIST control section 2010, defective row addresses in the candidates for the repair solution obtained through the primary analyzing process are read out by writing driver/sense amplifier circuit 3012.2 from CAM cell arrays 3016.1 and 3016.2, and stored in a column address storing register 4006 by a writing driver/sense amplifier circuit 4002.2 in address replacement secondary determining circuit 4000.

The storing process to column address storing register 4006 is controlled by register control circuit 4102.

For example, in the case when, with respect to candidate S11 for the repair solution with respect to the sub-memory cell array 100.1 and candidate S21 for the repair solution with respect to the sub-memory cell array 100.2, defective row addresses corresponding to the respective candidates for the repair solution are compared, data is read out from storing cell trains corresponding to replacement determining section 3100.11 and replacement determining section 3100.21 in CAM cell arrays 3014.1 and 3014.2, and transmitted to CAM cell array 4004.

Here, in CAM cell arrays 3016.1 and 3016.2, detective column addresses are read out from memory cell columns corresponding to replacement determining sections 3100.11 and 3100.21 in CAM cell arrays 3016.1 and 3016.2, and written in column address storing register 4006.

Replacement determining section 4100 makes a determination as to coincidence/non-coincidence of detective row addresses successively read out from CAM cell arrays 3014.1 and 3014.2, and makes a determination as to the possibility of the replacement by using spare rows SR1 and SR2.

Figure 14:
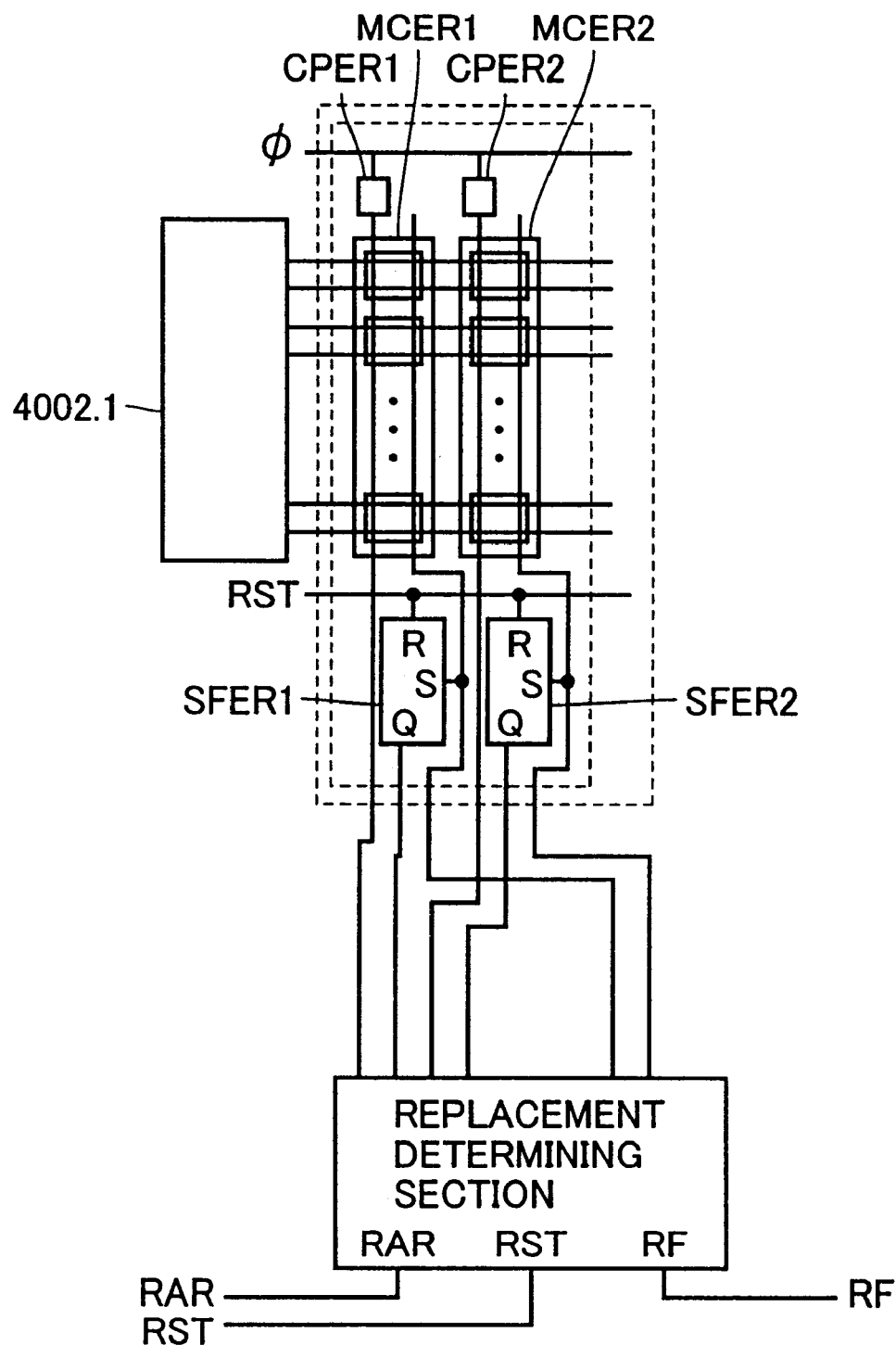
FIG. 14 is a block diagram that explains the structure of a CAM cell array 4004 in more detail.

FIG. 14 is a block diagram that explains the structure of CAM cell array 4004 in detail.

As described above, a storing cell train MCER1 in CAM cell array 4004 stores a row address to be replaced by the first spare row SR1, and a storing cell train MCER2 stores a column address to be replaced by the second spare row SR2.

Each of storing cell trains MCER1 and MCER2 includes CAM cells the number of which is sufficiently set to store defective row addresses.

The transmission of the address signal to the memory cell column is carried out by allowing driver/sense amplifier circuit 4002.1 to drive the level of the address signal line (CAM cell bit line).

In the order of storing cell train MCER11 and storing cell train MCER12, replacement determining section 4100 makes a determination as to whether or not the internal address signal at that time is to be taken into the storing cell train each time a signal RAR from BIST control section 2010 is activated.

Pre-charging circuits CPER1 and CPER2 pre-charge matching determining lines MHL installed in association with the corresponding storing cell trains MCER1 to MER2 to a "H" level in accordance with a signal φ from BIST control section 2010.

Storing cell trains MCER1 and MCER2 are installed in association with the respective pairs of internal row address signals RA0, /RA0 to RAi, /RAi, and include CAM cells for storing the level of these signals.

Moreover, in association with storing cell trains MCER1 and MCER2, flip-flop circuits SFER1 and SFER2 are respectively installed. The output levels of the flip-flop circuits SFER1 and SFER2 are reset by a reset signal RST before the start of the data transfer from CAM cell arrays 3014.1 and 3014.2. The output levels of the flip-flop circuits SFER1 and SFER2 are set in response to an active state ("H" level) of the CAM word line TWL of the corresponding memory cell column.

In contrast, column address storing register 4006, shown in FIG. 13, is installed in association with pairs of internal column address signals CA0, /CA0 to CAj, /CAj, and includes memory cells for storing the level of these signals.

The operations of replacement determining section 4100 and CAM cell array 4004 are basically the same as the operations of replacement determining section 3100.1 and row address storing portion RM1 explained by reference to FIG. 3; therefore, the explanation thereof is omitted.

Figure 15:
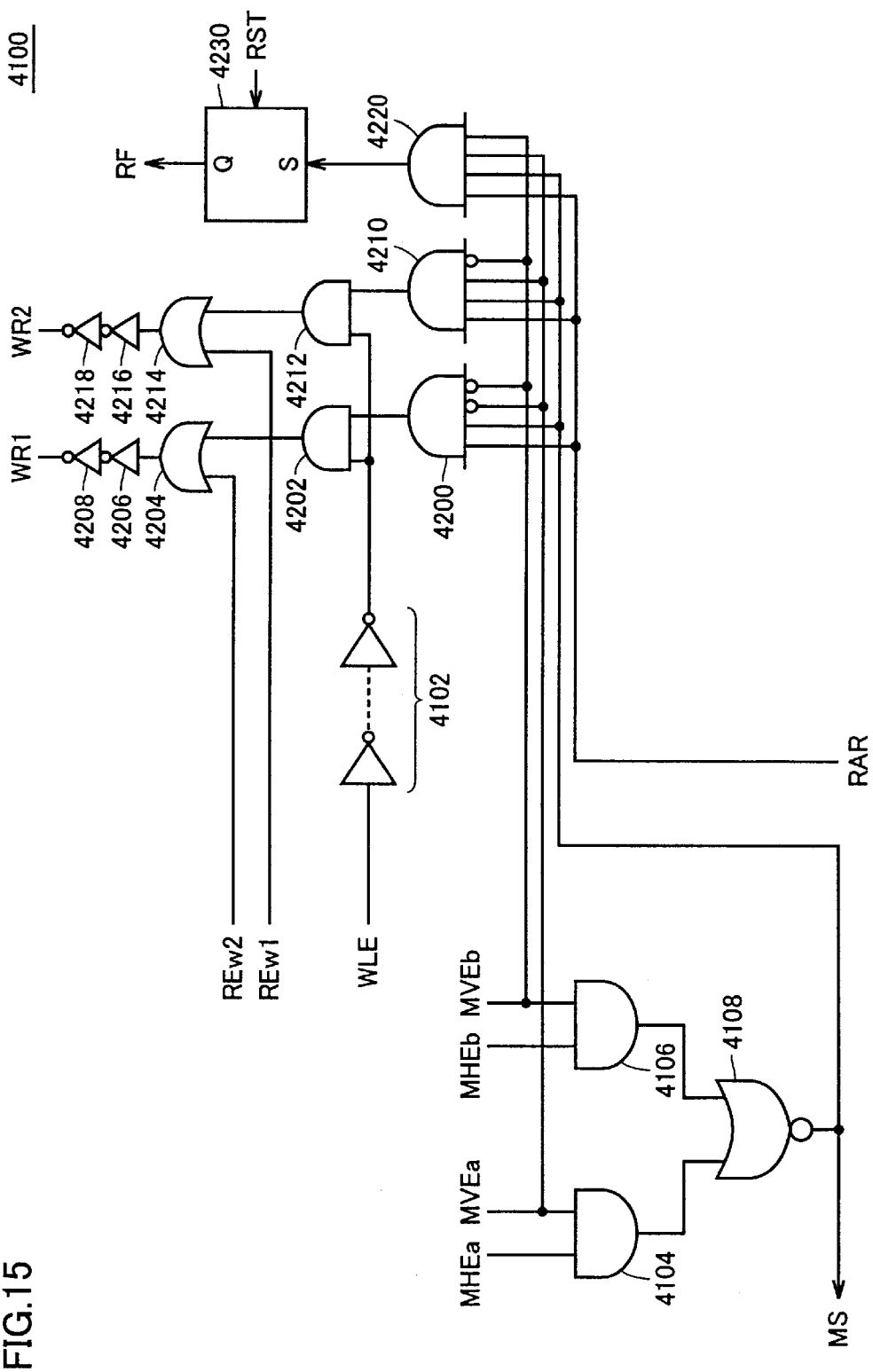
FIG. 15 is a circuit diagram that explains the structure of the replacement determining section 4100 shown in FIG. 14.

FIG. 15 is a circuit diagram that explains the structure of replacement determining section 4100 shown in FIG. 14.

Referring to FIG. 15, replacement determining section 4100 is provided with: a delay circuit 4102 which receives a signal WLE given from BIST control section 2010 and delays it by a predetermined time so as to instruct the activation of the word line, an AND circuit 4104 the input node of which is connected to matching detection line MHL of storing cell train MCER1 and the output of flip-flop circuit SFER1, an AND circuit 4106 the input node of which is connected to matching detection line MHL of storing cell train MCR2 and the output of flip-flop circuit SFR2, and a 2-input NOR circuit 4108 which outputs signal MS upon receipt of the output from AND circuits 4104 and 4106.

In the following description, among input nodes of AND circuits 4104 and 4106 in replacement determining section 4100, input nodes to be connected to matching detection line MHL are respectively represented by nodes MHEa and MHEb, and input nodes to be connected to outputs of flip-flop circuits SFER1 and SFER2 are represented by nodes MVEa and MVEb.

Replacement determining section 4100 is further provided with a logical gate 4200 which receives a level inversion signal of node MVEa, a level inversion signal of node MVEb, signal MS and signal RAR, and outputs a logical product of these signals, an AND circuit 4202 for receiving the output of logical gate 4200 and the output of delay circuit 4102, an OR circuit 4204 which receives a signal REw1 that is given by BIST control section 2010 and which is set to an active state at the time of the data reading upon completion of the secondary analyzing operation and the output of AND circuit 4202, an inverter 4206 for inverting the output of OR circuit 4204, and an inverter 4208 which inverts the output of inverter 4206 and outputs a selection signal WR1 for giving the resulting signal to CAM cell word line TWL of storing cell train MCER1.

The first replacement determining section 4100 is further provided with a logical gate 4210 which receives a level signal of node MVEa, a level inversion signal of node MVEb, signal MS and signal RAR, and outputs a logical product of these signals, an AND circuit 4212 for receiving the output of logical gate 4210 and the output of delay circuit 4102, an OR circuit 4214 which receives a signal REw2 that is given from BIST control section 2010 and becomes an activated state at the time of data reading after the completion of the secondary analyzing process, and the output of AND circuit 4212, an inverter 4216 that inverts the output of OR circuit 4214, and an inverter 4218 that inverts the output of inverter 4216, and outputs a selection signal WR2 to be given to CAM cell word line TWL of storing cell train MCER2.

A first replacement inversion section 3100.1 is further provided with a 4-input AND circuit 4220 that receives a level signal of node MVEa, a level signal of node MVEb, signal MS and signal RAR, and outputs a logical product of these, and a flip-flop circuit 4230 that is reset in response to a reset signal RST, set in response to the output of AND circuit 4220, and outputs a repair fail signal RF corresponding to the result of the secondary analyzing process.

Therefore, in the case when, for example, maximum four defective row addresses corresponding to candidates S11 and S21 for the repair solution are read out from CAM cell arrays 3014.1 and 3014.2, if the number of the mutually different defective row addresses, which is four at the maximum, is not more than 2, the repair fail signal RF outputted from flip-flop circuit 4230 is maintained at the "L" level.

In contrast, in the case when the number of mutually different defective row addresses exceeds 2, the repair fail signal RF outputted from flip-flop circuit 4230 is set to the "H" level.

In other words, when the repair by replacement of defective memory cells in the corresponding sub-memory cell arrays 100.1 and 100.2 is available within the range of two spare rows and two spare columns, the repair fail signal RF is set to the "L" level, while in the case when no replacement is available, it is set to the "H" level.

Figure 16:
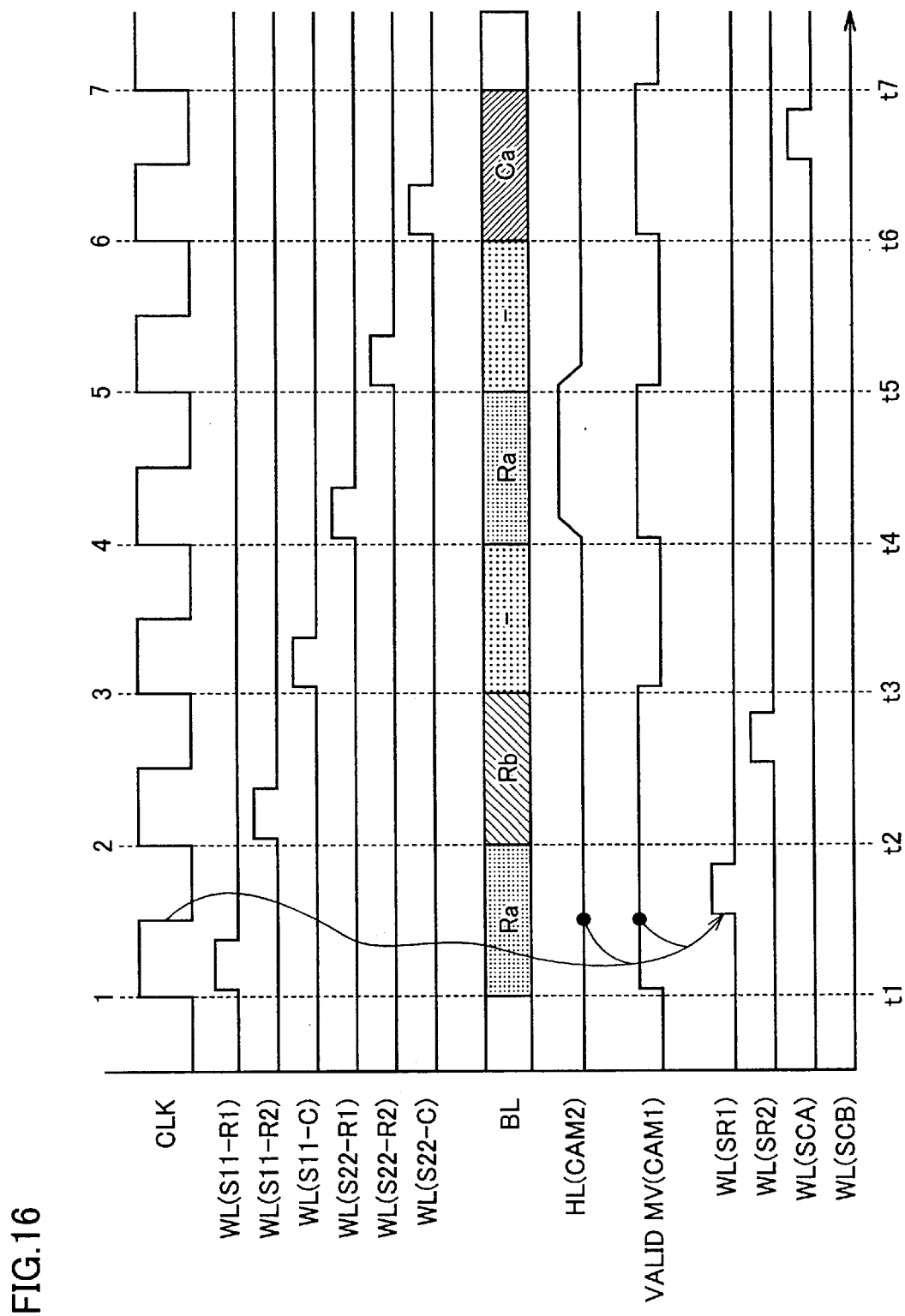
FIG. 16 is a timing chart that explains the operation of the replacement determining section 4100.

FIG. 16 is a timing chart that explains the operation of replacement determining section 4100 explained by reference to FIGS. 13 to 15.

For example, with respect to candidate S11 for the repair solution, only two defective row addresses Ra and Rb are stored, and it is assumed that these two have completed to repair sub-memory cell array 100.1. In contrast, with respect to sub-memory array 100.2, it is assumed that the repair is available by repairing defective row address Ra and defective column address Ca in association with candidate S22 for the repair solution.

In the following description, an explanation will be given of a process for making a determination as to whether or not the repair is available by using replacement determining circuit 4100 with respect to such a pair of candidate S11 for the repair solution and candidate S22 for the repair solution.

At time t1, first, controlled by BIST control section 2010, a word line WL (S11-R1) corresponding to the first defective row address of candidate S11 for the repair solution in CAM cell array 3014.1 is activated. In response to this, the reading process of defective row addresses is carried out from writing driver/sense amplifier 3012.1. At this time, a row address Ra is read out. The read-out defective row address Ra is transmitted to a CAM cell array 4004 by writing driver/sense amplifier 4012.1.

In CAM cell array 3014.1, a valid signal MVa from flip-flop circuit SFR11 is set in an active state ("H" level) in accordance with the fact that the defective row address Ra has been stored. In contrast, since any addresses have not been stored in CAM cell array 4004, matching detection line MHL in CAM cell array 4004 is set in the "L" level. In response to this, a word line WL (SR1) corresponding to storing cell train MCER1 in CAM cell array 4004 is activated so that a defective row address Ra is written in storing cell train MCER1.

Successively, at time t2, a word line WL (S11-R2) corresponding to storing cell train MCR12 in association with replacement determining section 3100.11 is activated so that a row address Rb is read out from writing driver/sense amplifier circuit 3012.1. Since row address Rb is different from row address Ra that has been stored in CAM cell array 4004, matching detection line MHL of storing cell train MCR1 is set to the "L" level, thereby activating matching detection line MHL of storing cell train MCER1, as well as activating a word line WL (SR2) corresponding to storing cell train MCER2. In response to this, a defective row address Rb is written in storing cell train MCER2.

Successively, at time t3, a word line WL (S11-C) corresponding to storing cell train MCC1 in CAM cell array 3016.1 is activated; however, since no data have been stored in storing cell train MCC1, and since the valid signal outputted from flip-flop circuit SFC1 is set to the "L" level, no data writing process is carried out to column address storing register 4006.

Successively, at time t4, a word line WL (S22-R1) in storing cell train in CAM cell array 3014.2 corresponding to replacement determining section 3100.22 is activated so that row address Ra is read by writing driver/sense amplifier circuit 3012.1. At this time, this defective row address Ra is coincident with the defective row address that has been stored in CAM cell array 4004 so that the level of matching detection line MHL is set to the "H" level; thus, no word line in CAM cell array 4004 is activated, thereby allowing no row address to be written.

Successively, at time t5, a word line WL (S22-R2) of storing cell train MCR22 in CAM cell array 3014.2 corresponding to replacement determining section 3100.22 in association with candidate S22 for the repair solution is activated. Here, as described above, since no row address is stored in storing cell train MCR22 of CAM cell array 3004.2, the valid signal MV is set to the "L" level so that no data is stored in column address storing register 4006.

Then, at time t6, in accordance with replacement determining section 3100.22, defective column addresses are read out by writing driver/sense amplifier circuit 3012.2 from storing cell train MCC22 in CAM cell array 3016.2, and written in column address storing register 4006 by writing driver/sense amplifier circuit 4002.2.

With the above-mentioned processes, since the output of flip-flop circuit 4230 is maintained at the "L" level after the completion of the operation of replacement determining section 4100 with respect to the pair of candidates S11 and S22 for the repair solution; therefore, it is determined that the redundant repair of sub-memory cell arrays 100.1 and 100.2 is available by replacing defective row addresses Ra and Rb and defective column address Ca, obtained from the combination of candidates S11 and S22 for the repair solution, with spare rows and spare columns.

Figure 17:
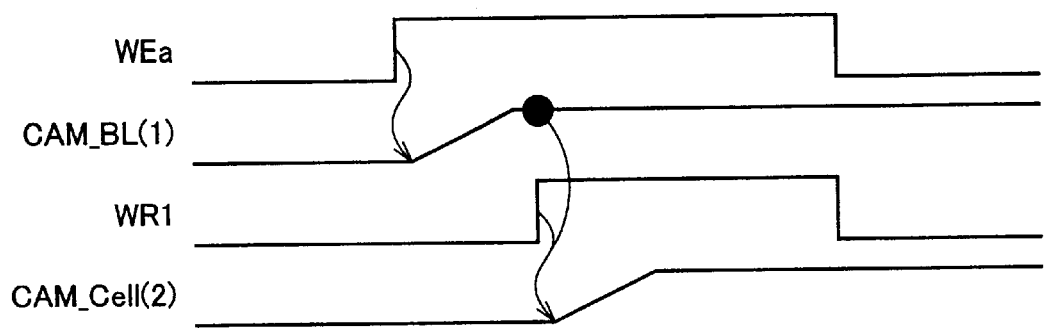
FIG. 17 is a schematic block diagram that explains the operation of the replacement determining section 4100 of FIG. 15 in more detail.

FIG. 17 is a schematic block diagram that explains the operation of replacement determining section 4100 shown in FIG. 15 in detail.

For example, after a lapse of a predetermined time since an activation signal WEa in word line has been activated in replacement determining section 3100.11 so that data have been read out on a bit line CAM_BL (1) of CAM cell array 3014.1, a word line activation signal WR1 from replacement determining section 4100 is activated. In response to this, detective row addresses are transferred and written in storing cell train CAM_Cell (2) in CAM cell array 4004.

Figure 18:
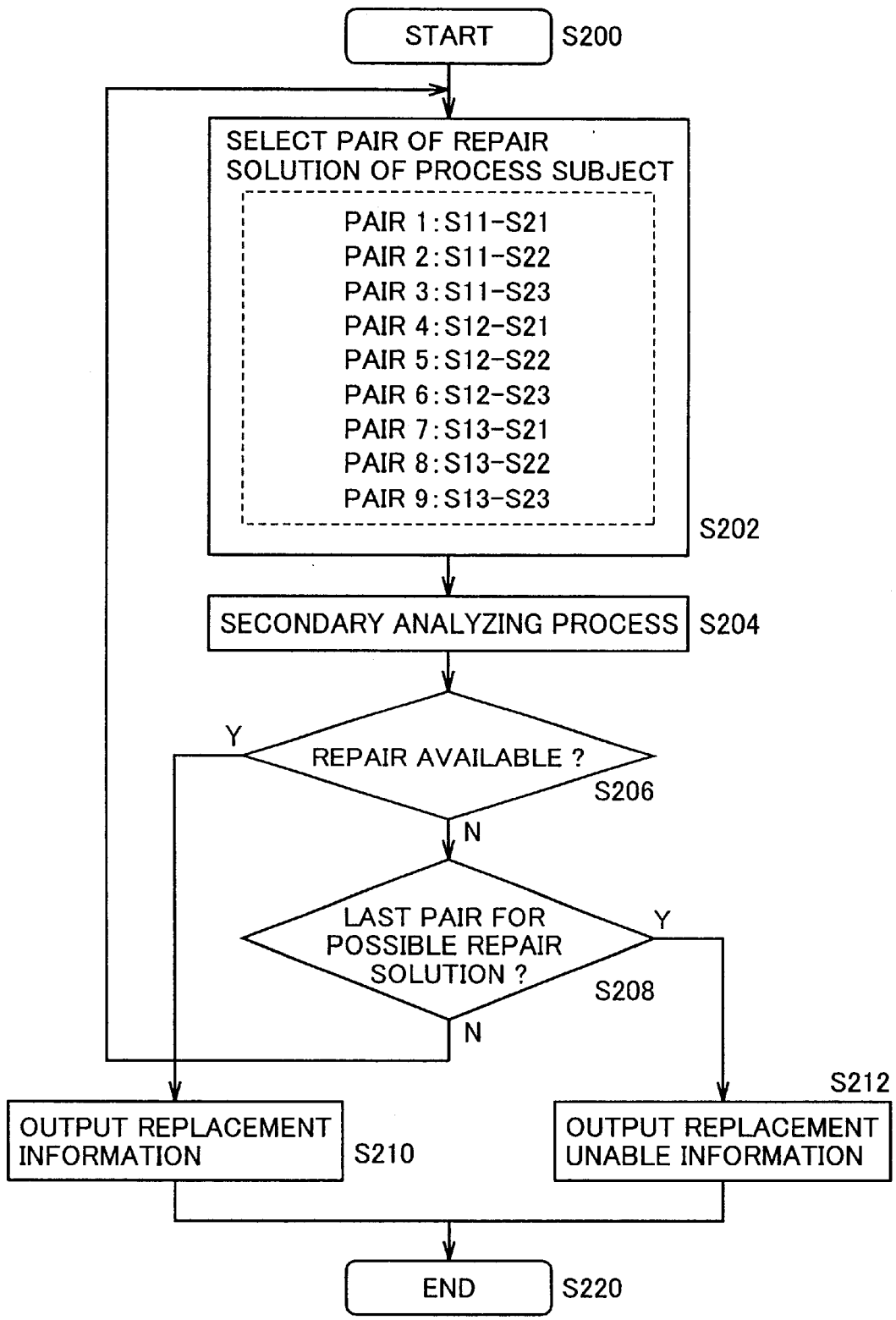
FIG. 18 is a flow chart that explains the secondary analysis of the self-redundant analysis of Embodiment 2.

FIG. 18 is a flow chart that explains the secondary analyzing process of the self-redundant analysis of Embodiment 2 as described above.

When the secondary analyzing process is started by the control of BIST control section 2010 (step S200), first, among pairs of candidates for the repair solution available (9 pairs in the present embodiment), pairs to be subjected to determinations as to the possibility of repair are selected. For example, both of the two repair solutions have been determined in the primary analyzing process as those that can be repaired, the pair of candidates S11 and S21 for the repair solution are selected as those that are to be determined as to the possibility of repair in the secondary analyzing process.

Next, with respect to the pairs of repair solutions thus selected, a determination is made as to whether or not the repair is finally available in the secondary analysis (step S204).

As the result of the secondary analysis, if it is determined that the repair is available (step S206), data indicating that the repair is available (repair fail signal RF) and defective addresses to be repaired are externally outputted from DRAM 1100 (step S210), thereby completing the processes (step S220).

Here, at step S206, in the case when the result of the secondary analysis shows that no repair is available, a determination is made as to whether or not processes have been carried out on all the pairs of candidates for the repair solution (step S208). In the case when the processes have been completed on all the pairs of combinations available, BIST control section 2010 outputs data indicating that no repair is available outside of DRAM 1100 (step S212).

Here, at step S208, if it is determined that the processes have not been completed to the last pair, the sequence again returns to step S202 so as to process the next pair of candidates for the possible repair solution.

Figure 19:
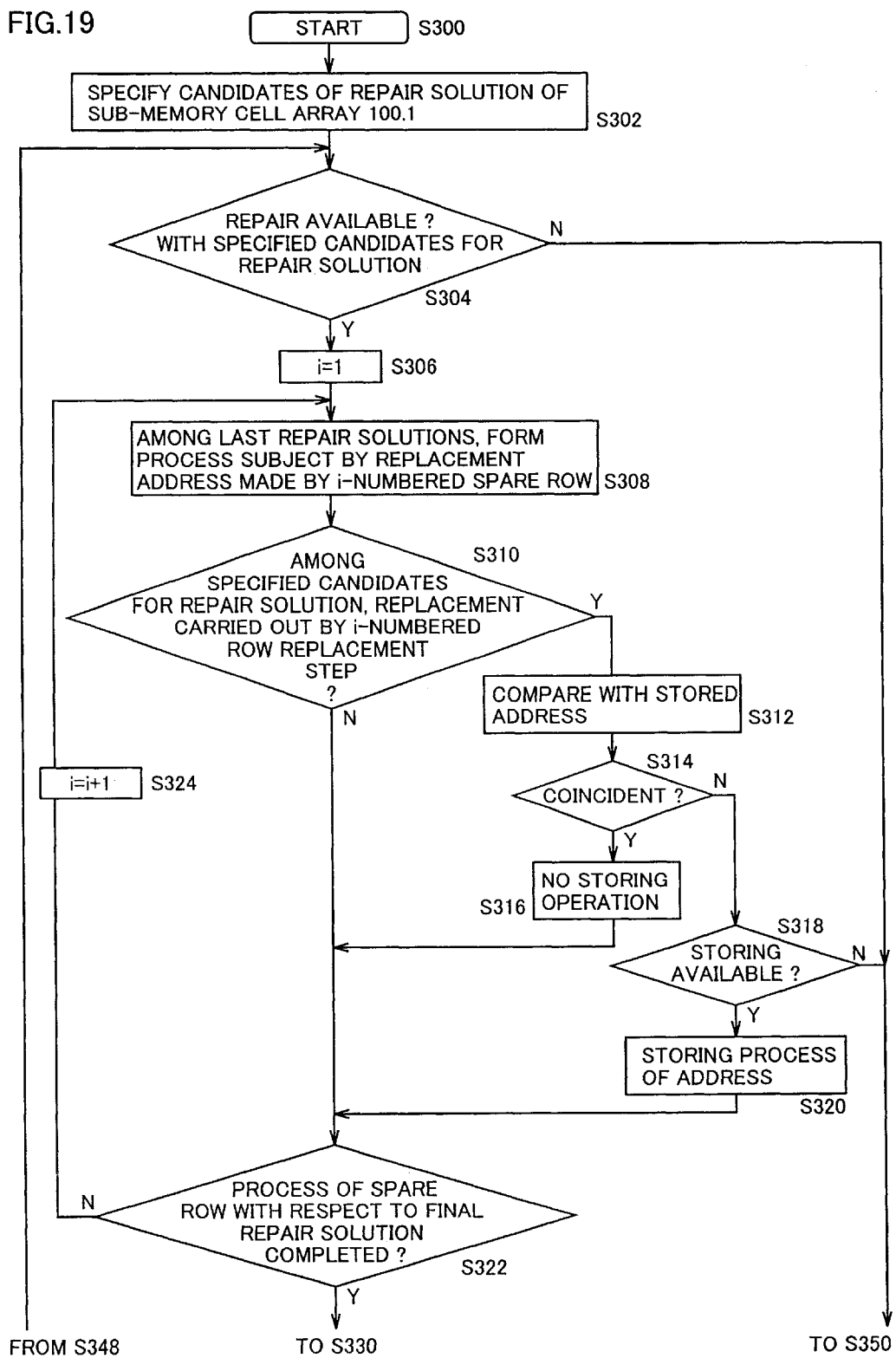
FIG. 19 is a first flow chart that more specifically explains the contents of the secondary analyzing process.
Figure 20:
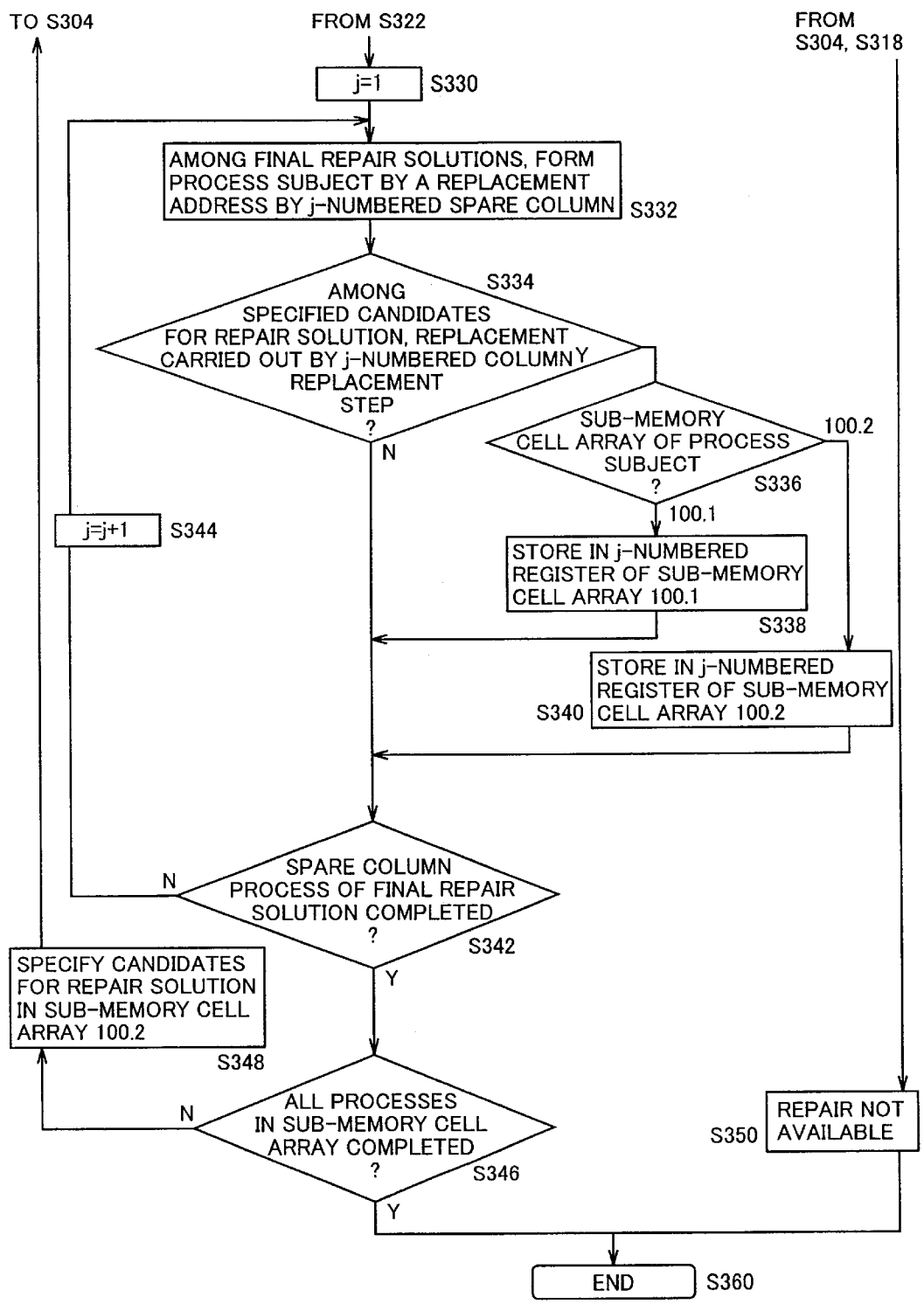
FIG. 20 is a second flow chart that more specifically explains the contents of the secondary analyzing process.

FIGS. 19 and 20 are flow charts that explain in detail the contents of processes of the secondary analyzing process (step S204) explained in FIG. 18 (step S204).

First, as illustrated in FIG. 19, when the secondary analyzing process is started (step S300), among pairs of candidates for the repair solution selected in step S202, a candidate for the repair solution corresponding to sub-memory sell array 100.1, for example, candidate S11 for the repair solution is specified as a subject to be processed (step S302).

With respect to the candidate for the repair solution thus specified, a determination is made as to whether or not the primary analysis has made a determination that the repair is possible (step S304), and if the determination shows that the repair is not possible, it is determined that the selected pair of candidates for the repair solution fails to obtain the final repair solution, and that the repair is not available (step S350), thereby completing the process of step S204 (step S360).

Here, at step S304, when it has been determined that the result of determination in the primary analyzing process shows the repair is available, the value of variable i is successively initialized to "1" (step S306).

Next, in the replacement step of the final repair solution (for example, the solution in which the repair is carried out in the order of SR1→SR2→SCI→SCII), among steps in which the replacement is made by using spare row, the defective address to be replaced by the i-numbered spare row is set as a subject to be processed (step S308).

Successively, a determination is made as to whether or not the replacement is made at the i-numbered row-replacement step (step S310) in specified candidates for the repair solution. In other words, in CAM cell array 3014.1 (or 3014.2) shown in FIG. 13, a defective row address is stored in i-numbered memory cell column, and a determination is made as to whether or not the output of a flip-flop circuit SFR11, etc., corresponding to this i-numbered memory cell column is activated.

In the case when the replacement has been made (step S310), successively, this stored defective row address is compared with the defective row address that has been stored in CAM cell array 4004 (step S312).

In the case when it is coincident with the defective row address that has been stored (step S314), no storing process is newly carried out (step S316), and the sequence proceeds to the step S322.

In contrast, in the case when it is not coincident with the defective row address that has been stored (step S314), it is determined whether or not this new defective row address can be stored in CAM cell allay 4004 (step S318). In the case when any memory cell column having no address stored therein still remains in CAM cell array 4004, the address is stored (step S320), and the sequence proceeds to step S322. When any of memory cell columns in CAM cell array 4004 has already stored defective row address, it is determined that the selected pairs of candidates for the repair solution fail to provide the final repair solution so that the repair is not possible (step S350), thereby completing the process of step S204 (step S360).

At step S322, in the replacing step for the final repair solution, a determination is made as to whether or not all the steps in which the replacement is made by using spare row have become subjects for the treatments, and in the case when all the steps have not become subjects for the treatments, the value of the variable i is incremented by 1 (step S324), and the sequence returns to step S308.

In contrast, in the case when all the steps in which the replacement is made by using spare row have become subjects for the treatments (step S322), the value of variable j is successively initialized to "1" (step S330).

Next, in the replacement step of the final repair solution (for example, the solution in which the repair is carried out in the order of SR1→SR2→SCI→SCII), among steps in which the replacement is made by using spare column, the defective address to be replaced by the j-numbered spare row is set as a subject to be processed (step S332).

Successively, a determination is made as to whether or not the replacement is made at the j-numbered column-replacement step (step S334) in specified candidates for the repair solution. In other words, in CAM cell array 3016.1 (or 3016.2) shown in FIG. 13, a defective column address is stored in j-numbered memory cell column, and a determination is made as to whether or not the output of a flip-flop circuit SFC11, etc., corresponding to this j-numbered memory cell column is activated.

In the case when the replacement has been made (step S334), successively, a determination is made as to whether or not the sub-memory cell array to be processed is 100.1 or 100.2 (step S336).

In the case when the sub-memory cell array to be processed is 100.1, the defective column address is stored in the j-numbered register corresponding to sub-memory cell array 100.1 in column address storing register 4006 (step S338), and the sequence proceeds to the step S342.

Here, in the case when the sub-memory cell array to be processed is 100.2, the defective column address is stored in the j-numbered register corresponding to sub-memory cell array 100.2 among the row address storing register 4006 (step S340), and the sequence proceeds to step S342.

At step S342, in the replacing step for the final repair solution, a determination is made as to whether or not all the steps in which the replacement is made by using spare column have become subjects for the treatments, and in the case when all the steps have not become subjects for the treatments, the value of the variable j is incremented by 1 (step S344), and the sequence returns to step S332.

In contrast, in the case when all the steps in which the replacement is made by using spare column have become subjects for the treatments (step S342), all the sub-memory cell arrays are successively allowed to form process subjects, and a determination is made as to whether or not the process has been completed (step S346).

In the case when all the sub-memory cell arrays have not become subjects for the treatments, the next sub-memory cell array, that is, in this case, the candidate for the repair solution for sub-memory cell array 100.2, is allowed to form the subject for the treatments (step S348), and the sequence returns to step S304.

In contrast, in the case when all the sub-memory cell arrays have become subjects for the treatments, the process of the step S204 is completed (step S360).

Here, at step S304, with respect to both of the pair for the repair solution that are the subjects for the treatments, a determination may be made as to whether or not it has been determined in the primary analysis that the repair is possible.

Moreover, in the above-mentioned explanation, it is assumed that the secondary analysis is carried out by hardware shown in FIG. 13; however, the secondary analysis may be carried out by a logical operation circuit using software in DRAM 1100 or a semiconductor integrated circuit device in which DRAM 1100 is installed.

Here, in the above-mentioned explanation, it is assumed that two sub-memory cell arrays 100.1 and 100.2 are installed in DRAM 1000; however, a pair of sub-memory cell arrays having the same arrangement as the pair of sub-memory cell arrays 100.1 and 100.2 and a pair of the corresponding address replacement determining sections 3000.1 and 3000.2 and address replacement secondary determining section 4000 are prepared, and a plurality of sets of these may be installed.

Embodiment 3

Figure 21:
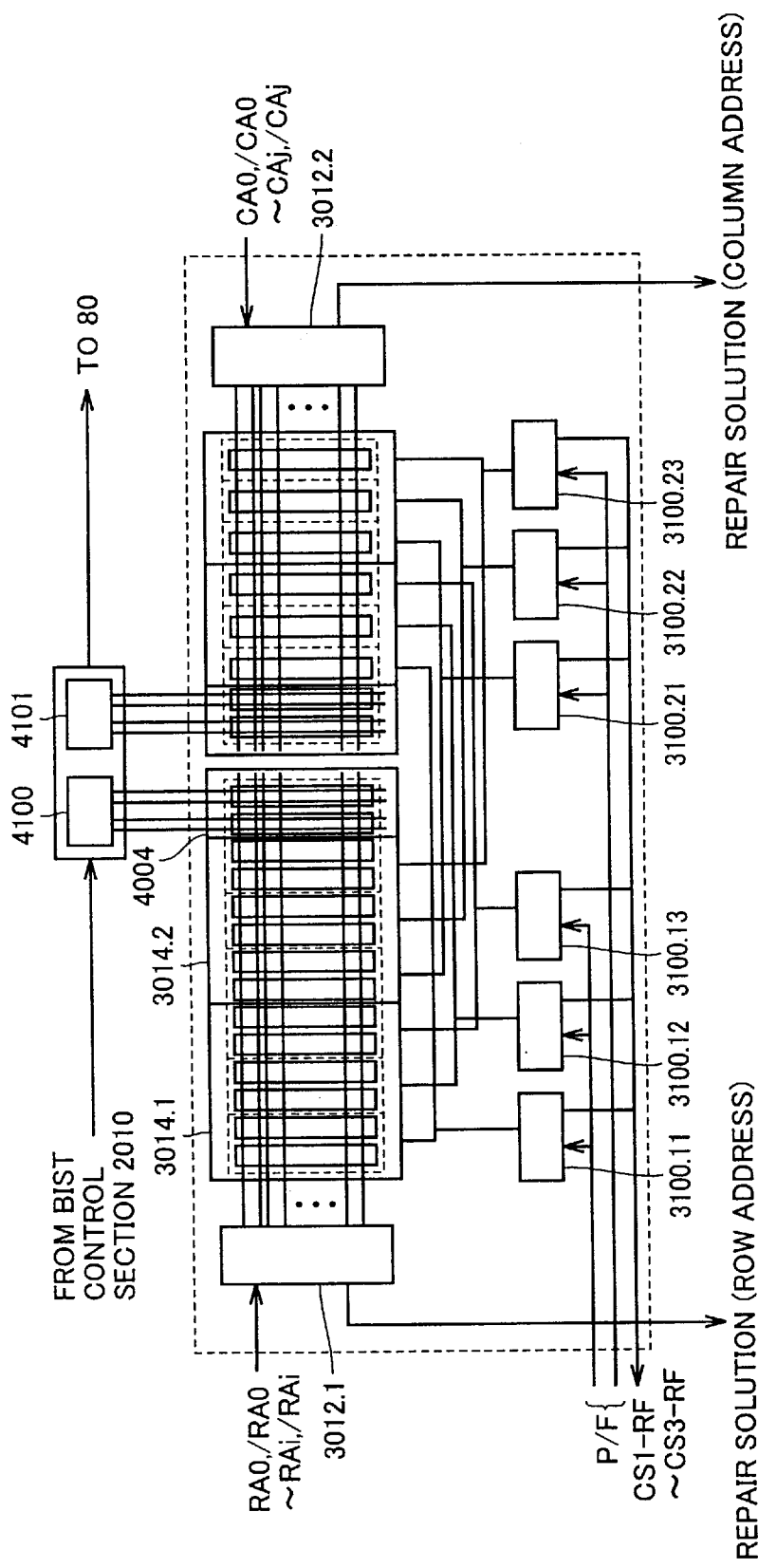
FIG. 21 is a drawing that shows the structures of an address replacement primary determining circuit and an address replacement secondary determining circuit in a BIST circuit of Embodiment 3 of the present invention.

FIG. 21 is a drawing that shows the structures of an address replacement primary determining circuit and an address replacement secondary determining circuit in a BIST circuit in accordance with Embodiment 3 of the present invention, and that is compared with FIG. 13 of Embodiment 2.

In Embodiment 2 shown in FIG. 13, CAM cell arrays 3014.1 and 3014.2 used for the primary analyzing process are installed in a separated manner from CAM cell array 4004 used for the secondary analyzing process.

In contrast, in FIG. 21, CAM cell arrays 3014.1 and 3014.2 and CAM cell array 4004 are placed in the proximity of each other. Further, address signal paired lines (CAM cell bit paired lines) for writing and reading internal address signals are commonly installed in both of CAM cell arrays 3014.1 and 3014.2 and CAM cell array 4004.

In FIG. 13, the replacement column address of the final repair solution in the secondary analysis is stored in column address storing register 4006. In contrast, in FIG. 21, the replacement column address of the final repair solution is also stored in CAM cell array 4005 having the same structure as CAM cell array 4004.

Moreover, CAM cell arrays 3016.1 and 3016.2 and CAM cell array 4005 are also placed in the proximity of each other. Further, address signal paired lines (CAM cell bit paired lines) for writing and reading internal address signals are commonly installed in both of CAM cell arrays 3016.1 and 3016.2 and CAM cell array 4005.

The data writing and data reading operations to and from CAM cell arrays 3014.1, 3014.2 and 4004 are carried out by writing driver/sense amplifier circuit 3012.1, and the data writing and data reading operations to and from CAM cell arrays 3016.1, 3016.2 and 4005 are carried out by writing driver/sense amplifier circuit 3012.2.

Moreover, in order to control CAM cell word line of CAM cell array 4005, a replacement determining circuit 4101 having the same structure as replacement determining circuit 4100 is installed. Here, defective column addresses to be written in CAM cell array 4005 are originally different from defective column addresses that have already been stored therein; however, formally, the defective column addresses that have already been stored are compared with defective column addresses to be newly read from CAM cell array 3016.1 or 3016.2, and stored in CAM cell array 4005.

With the above-mentioned arrangement, CAM cell arrays can be formed in one place in a collective manner; therefore, it is advantageous to reduce the area of the CAM cell arrays as a whole. Moreover, writing driver/sense amplifier circuits 3012.1 and 3012.2 can be commonly used by CAM cell array for the primary analyzing process and CAM cell array for the secondary analyzing process; therefore, this is also beneficial in reducing the circuit area.

Embodiment 4

Figure 22:
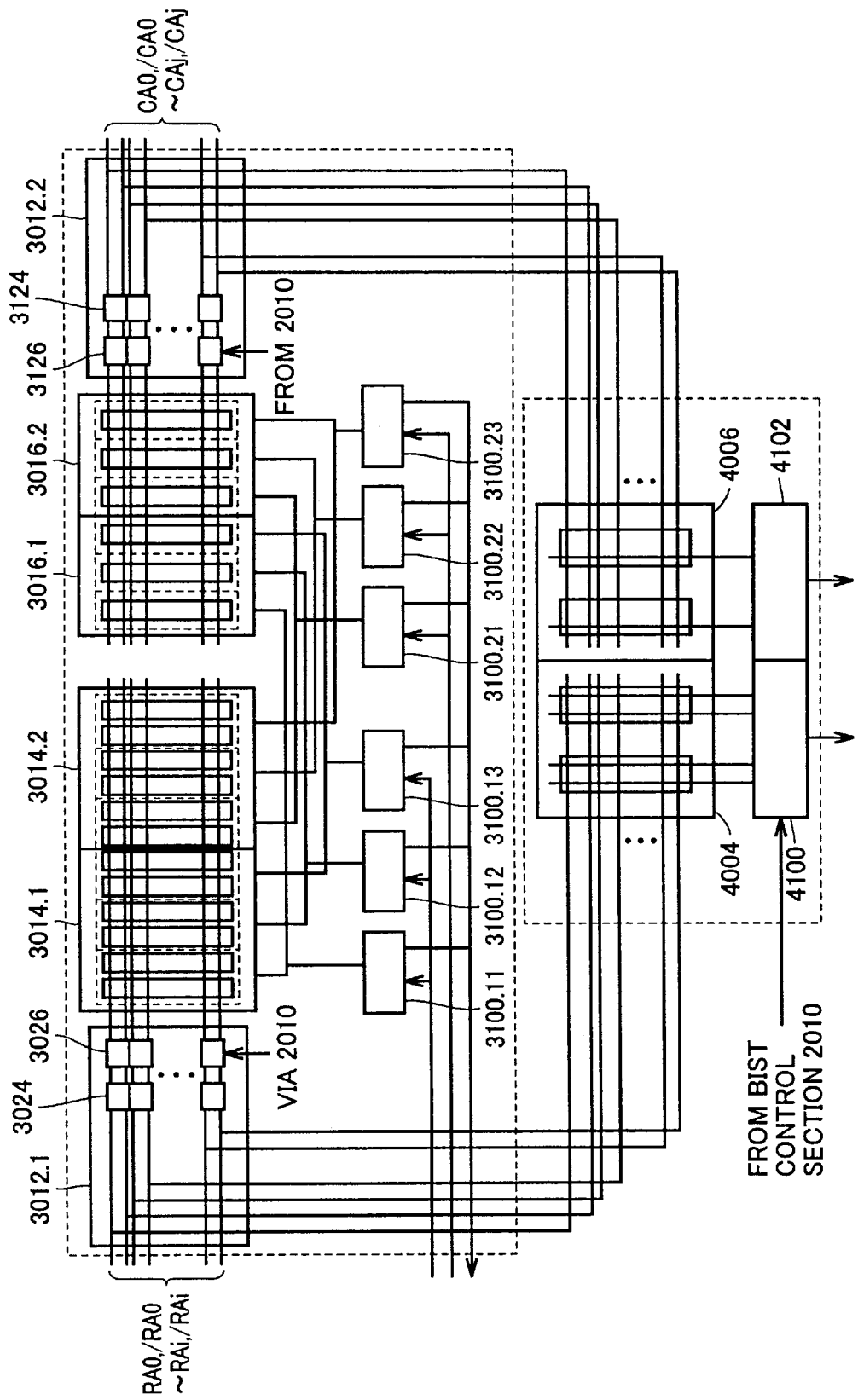
FIG. 22 is a drawing that shows the structures of an address replacement primary determining circuit and an address replacement secondary determining circuit in a BIST circuit of Embodiment 4 of the present invention.

FIG. 22 is a drawing that shows the structures of an address replacement primary determining circuit and an address replacement secondary determining circuit in a BIST circuit in accordance with Embodiment 4 of the present invention, and that is compared with FIG. 13 of Embodiment 2.

In Embodiment 2 shown in FIG. 13, with respect to CAM cell arrays 3014.1 and 3014.2 used for the primary analyzing process and CAM cell array 4004 used for the secondary analyzing process, writing driver/sense amplifier circuits 3012.1 and 4002.1 are respectively installed in a separated manner.

In contrast, in FIG. 21, with respect to CAM cell arrays 3014.1, 3014.2 and CAM cell array 4004, a writing driver/sense amplifier circuit 3012.1 is commonly installed. Then, with respect to CAM cell arrays 3016.1, 3016.2 and column address storing register 4006, a writing driver/sense amplifier circuit 3012.2 is commonly installed.

Here, writing driver/sense amplifier circuit 3012.1 is provided with a plurality of sense amplifiers 3024 in association with CAM cell bit paired lines of CAM cell arrays 3014.1 and 3014.2. Sense amplifier circuits 3024 are also shared by CAM cell bit paired lines of CAM cell array 4004 and the corresponding CAM cell bit paired lines of CAM cell arrays 3014.1, 3014.2.

Moreover, a plurality of switch circuits 3026, respectively controlled by BIST control section 2010, are installed between CAM cell bit paired lines of CAM cell arrays 3014.1, 3014.2 and sense amplifier circuit 3024.

A switch circuit 3026 is set to a conductive state in the case of writing data to CAM cell arrays 3014.1 and 3014.2 and in the case of reading data from CAM cell arrays 3014.1 and 3014.2.

Moreover, switching circuit 3026 is also set to the conductive state in the case of writing data from CAM cell arrays 3014.1 and 3014.2 to CAM cell array 4004. In contrast, switching circuit 3026 is set to a cut-off state in the data reading process from CAM cell array 4004.

In contrast, writing driver/sense amplifier circuit 3012.2 is provided with a plurality of sense amplifiers 3124 and switching circuits 3126 in association with CAM cell bit paired lines of CAM cell arrays 3016.1, 3016.2. Sense amplifier circuits 3124 are also shared by bit paired lines of column address storing registers 4006 and the corresponding CAM cell bit paired lines of CAM cell arrays 3016.1, 3016.2.

Switch circuit 3126 is also controlled by BIST control section 2010. Switch circuit 3126 is set to a conductive state in the case of writing data to CAM cell arrays 3016.1 and 3016.2 and in the case of reading data from CAM cell arrays 3016.1 and 3016.2. Moreover, switch circuit 3126 is also set to the conductive state in the case of writing data from CAM cell arrays 3016.1 and 3016.2 to column address storing register 4006. In contrast, switching circuit 3126 is set to the cut-off state in the case of reading data from column address storing register 4006.

With this arrangement, since writing driver/sense amplifier circuits 3012.1 and 3012.2 are commonly used in CAM cell array for the primary analysis and CAM cell array for the secondary analysis; therefore, this is beneficial in reducing the circuit area. Moreover, in the case of reading data from CAM cell array 4004 and column address storing register 4006, switch circuits 3026 and 3126 are set to the cut-off state; therefore, the load imposed when driving sense amplifiers 3024 and 3124 is reduced, and the reading speed is thus improved.

Embodiment 5

Figure 23:
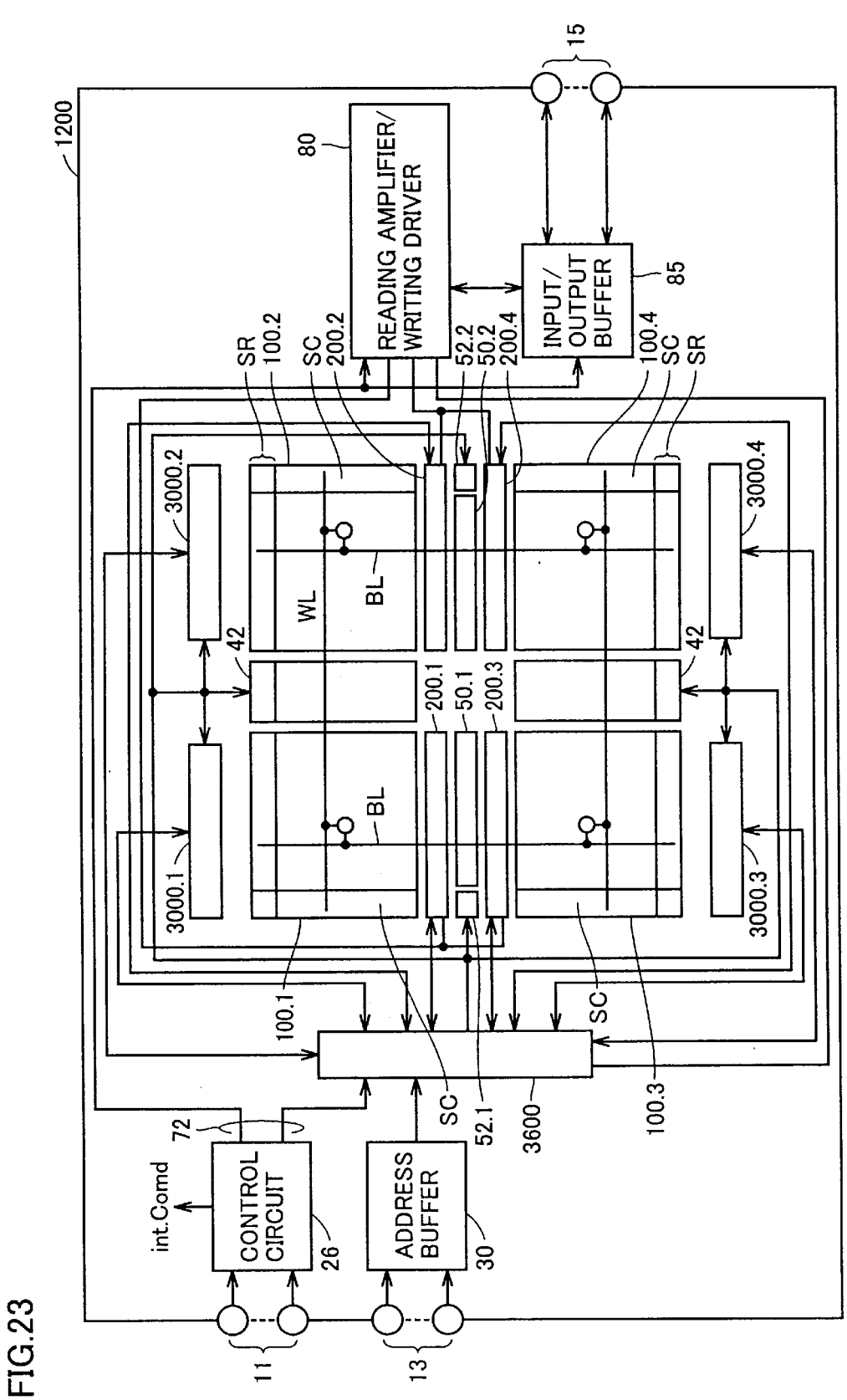
FIG. 23 is a schematic block diagram that shows the entire structure of a DRAM 1200 in Embodiment 5 of the present invention.

FIG. 23 is a schematic block diagram that shows the entire structure of DRAM 1200 in Embodiment 5 of the present invention.

This arrangement is different from the structure of DRAM 1000 in Embodiment 1 shown in FIG. 1 in that memory set array 100 is divided into four sub-memory cell arrays 100.1 to 100.4, and in association with the respective sub-memory cell arrays 100.1 to 100.4, address replacement determining circuits 3000.1 to 3000.4 are installed.

In DRAM 1200, in accordance with an activation of one word line that is in common with sub-memory cell arrays 100.1 and 100.2, a plurality of memory cells, for example, one bit per sub-memory array, that is, the total 2-bits data, is read out. Moreover, in response to an activation of one common word line with respect to sub-memory cell arrays 100.3 and 100.4, for example, the total 2-bits data, that is, one bit per sub-memory, is read out.

Moreover, in response to the activation of one common column selection line with respect to sub-memory arrays 100.1 and 100.3, data is read out from bit line BL that corresponds to the common memory cell column of sub-memory cell arrays 100.1 and 100.3. In response to the activation of one common column selection line with respect to sub-memory cell arrays 100.2 and 100.4, data is read out from bit line BL that corresponds to the common memory cell column of sub-memory cell arrays 100.2 and 100.4.

Moreover, self-analysis control section 3600 controls the operations of these four address replacement determining circuits 3000.1 to 3000.4, and upon completion of the primary analysis, receives the results of the primary analysis from the respective address replacement determining circuits 3000.1 to 3000.4, and externally outputs from a data input/output terminal 15 through reading amplifier/writing driver 80 and input/output buffer 85.

The other structures are basically the same as the structure of DRAM 1000 shown in FIG. 1; therefore, the same parts are indicated by the same reference numerals, and the description thereof is omitted.

Figure 24:
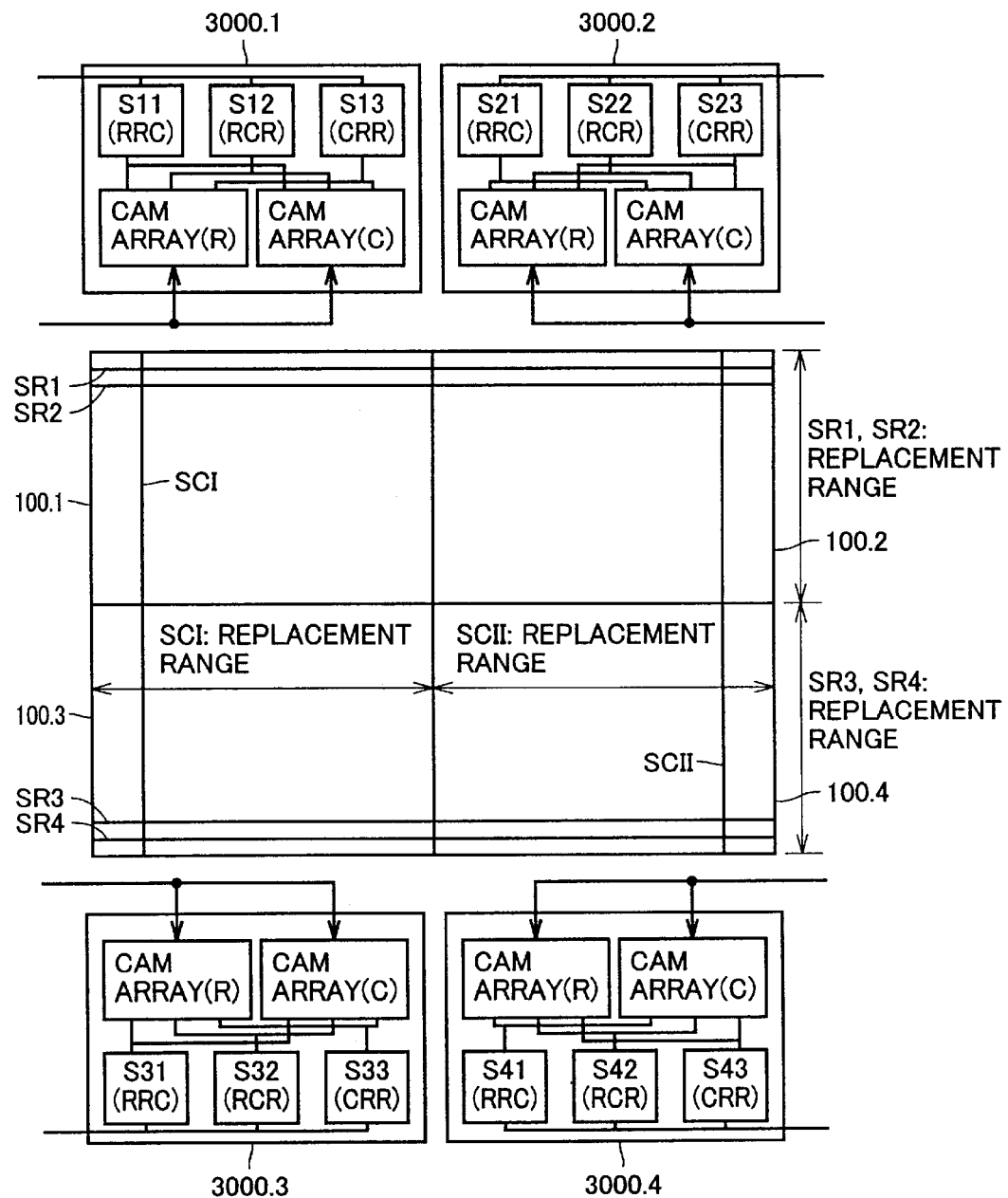
FIG. 24 is a schematic block diagram that shows the structures of sub-memory cell arrays 100.1 and 100.4, and address replacement determining circuits 3000.1 and 3000.4 in an extracted manner.

FIG. 24 is a schematic block diagram that shows the structures of sub-memory cell arrays 100.1 to 100.4 and address replacement determining circuits 3000.1 to 3000.4 in an extracted manner among the structures shown in FIG. 23.

As illustrated in FIG. 24, spare column SCI, installed in association with sub-memory cell arrays 100.1 and 100.3, is replaced with defective memory cell columns within the range of sub-memory cell arrays 100.1 and 100.3, and spare column SCII, installed in association with sub-memory cell columns 100.2 and 100.4, is replaced with defective memory cell columns within the range of sub-memory cell columns 100.2 and 100.4.

In contrast, each of the spare memory cell rows SR1 and SR2 is replaced with defective memory cell rows in common with sub-memory cell arrays 100.1 and 100.2. Moreover, each of spare memory cell rows SR3 and SR3 is replaced with defective memory cell rows in common with sub-memory cell arrays 100.3 and 100.4.

Here, on the assumption that spare rows SR1 and SR2 independently carry out replacing processes on sub-memory cell array 100.1 and sub-memory cell array 100.2, address replacement determining circuit 3000.1 makes a determination as to the possibility of the repair by replacement. In the same manner, with respect to other address replacement determining sections 3000.2 to 3000.4, on the assumption that spare column SCI or SCII, spare row SR1 and spare row SR2, or SR3 and SR4 have replaceable address spaces within the corresponding sub-memory cell arrays, the primary analyzing process is carried out.

Therefore, after the completion of the self-redundant analyzing process that is carried out in parallel with the built-in self test, for example, from replacement determining sections 3100.1 to 3100.3 in address replacement determining circuits 3000.1 are outputted repair fail signals CS1-RF to CS3-RF that show the possibility of repair in the case when spare row SR1 and SR2 and spare column SCI carry out replacements within sub-memory cell array 100.1 independent of other sub-memory cell arrays 100.2 to 100.4.

Figure 25:
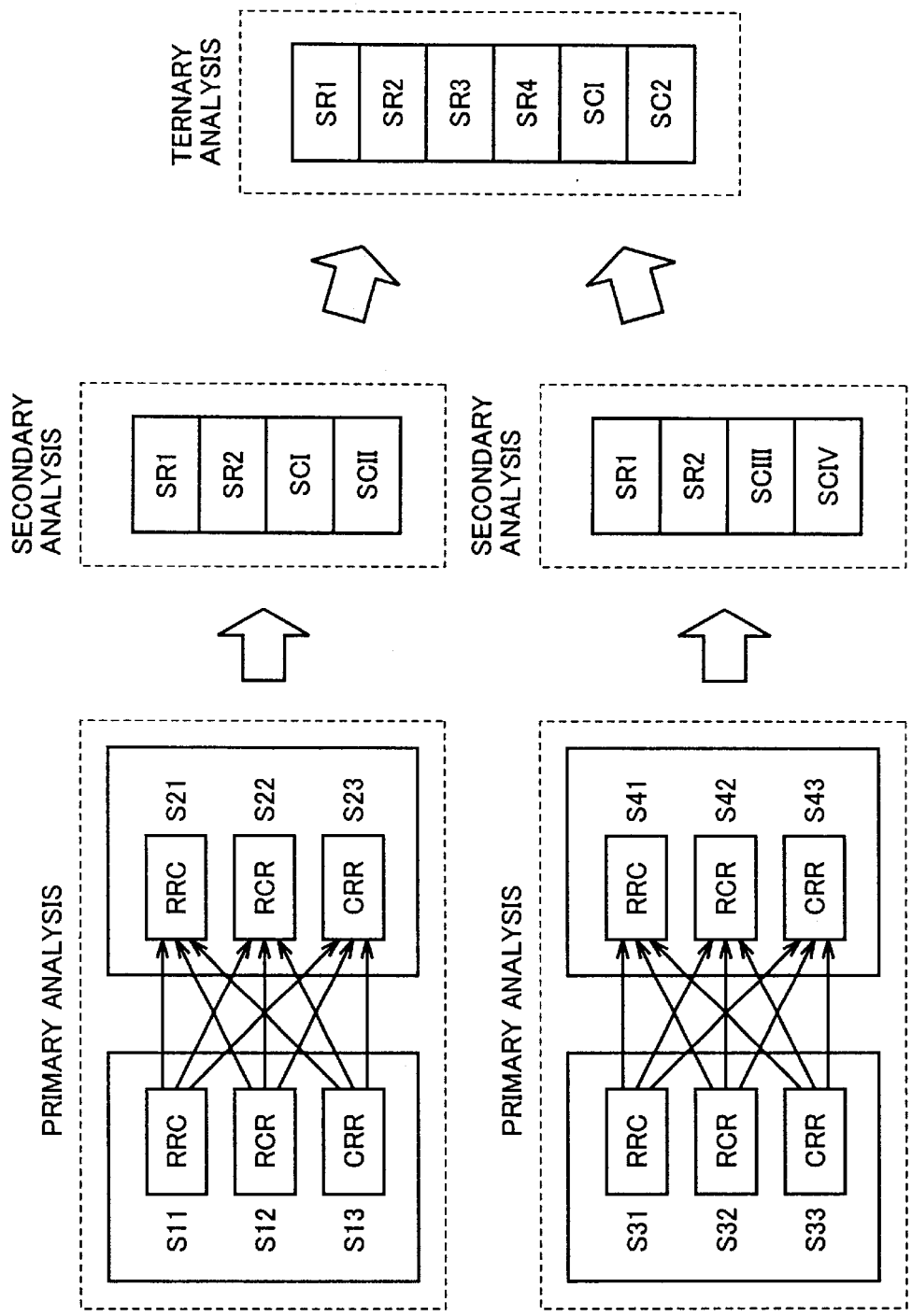
FIG. 25 is a conceptual drawing that shows a self-redundant analyzing process that is carried out in parallel with a built-in self test for detecting a defective memory cell, and the succeeding sequences for finding the final repair solution.

FIG. 25 is a conceptual drawing that shows the sequence of the self-redundant analyzing process carried out in parallel with the built-in self test for detecting defective memory cells and the succeeding process for finding the final repair solution.

With respect to sub-memory cell array 100.1, candidates S11, S12 and S13 for the repair solution are obtained in association with the respective replacement orders "RRC", "RCR" and "CRR". In the same manner, with respect to the sub-memory cell array 100.2, candidates for the repair solution S21, S22 and S23 are obtained, with respect to sub-memory cell array 100.3, candidates for the repair solution S31, S32 and S33 are obtained, and with respect to sub-memory cell array 100.4, candidates for the repair solution S41, S42 and S43 are obtained.

In the same manner as Embodiment 1, first, on the assumption that sub-memory cell arrays 100.1 and 100.2 are independent from sub-memory cell arrays 100.3 and 100.4, if the repair is available, one pair is respectively selected from pairs of candidates S11 to S13 and pairs of candidates S21 to S23, and comparison is made with respect to this pair in a round-robin system (secondary analysis), it is supposed that the pair of repair solutions in which two defective row addresses to be repaired by spare row are equal to each other should be present. In contrast, assuming that sub-memory cell arrays 100.3 and 100.4 are independent from sub-memory cell arrays 100.1 and 100.2, if the repair is available, it is supposed that the pair of repair solutions in which two defective row addresses to be repaired by spare row are equal to each other should be present.

At this time, the range of candidates for the repair solution that form the subjects for the secondary analysis can be limited to candidates for the repair solution that are determined as those that can be repaired as the result of the primary analysis.

Moreover, finally, under the limited condition that sub-memory cell arrays 100.1 and 100.2 need to be replaced by spare column SCI or SCII in common with sub-memory cell arrays 100.3 and 100.4 with respect to memory cell columns, the sequence (third analysis) for finding the final repair solution should be carried out.

In this ternary analysis, one is respectively selected from pairs of candidates for the repair solution with respect to sub-memory cell arrays 100.1 and 100.2 and from pairs of candidates for the repair solution 100.1 and 100.2 so as to form a pair, and comparisons may be carried out on this pair in a round-robin system. If in the ternary analysis, a pair of candidates for the repair solution in which two defective column addresses to be replaced are mutually equal to each other can be found, this case shows that the redundant repair is available by using spare rows SR1 to SR4 and spare columns SCI and SCII.

At this time, the range of candidates for the repair solution that are to be subjected to the ternary analysis can be limited to candidates for the repair solution that are determined as those that can be repaired as a result of the secondary analysis.

As the result of the ternary analysis, as the final solution, for example, in the order of SR1→SR2→SR3→SR4→SCI→SCII, pairs of defective row addresses and defective column addresses to be replaced are obtained.

In Embodiment 5 also, the results of the primary analysis are read by an external device outside DRAM 1200 so that the secondary analysis and the ternary analysis are carried out by an external device outside DRAM 1200, for example, a tester device, by means of software.

Figure 26:
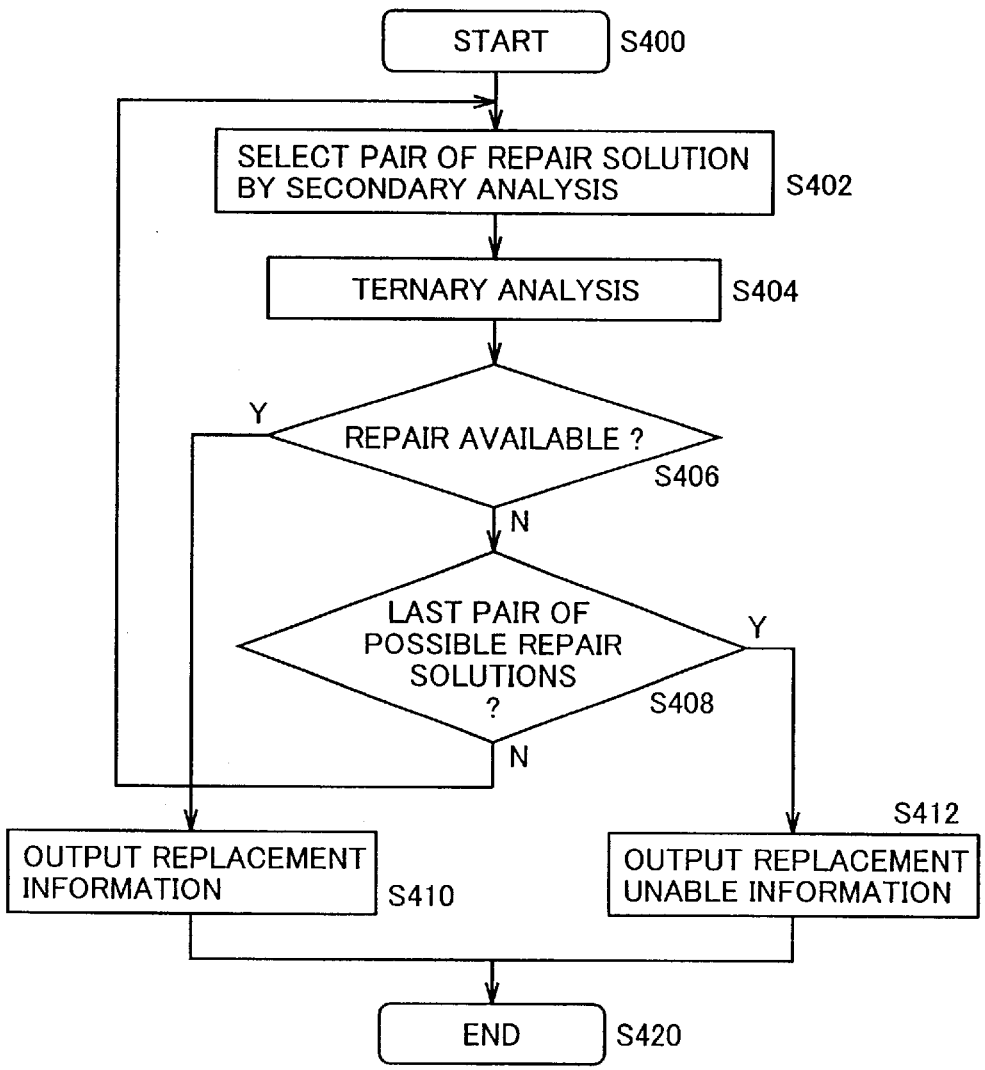
FIG. 26 is a flow chart that explains a ternary analysis of the self-redundant analysis of Embodiment 5.

FIG. 26 is a flow chart that explains the ternary analysis of the self-redundant analysis in Embodiment 5 as described above.

Here, in the same manner as the explanation given in Embodiment 1, it is supposed that the results up to the secondary analysis have been obtained. However, in Embodiment 5, in the secondary analysis, it is supposed that not only one repair solution is found, but also all the candidates for repair solution that are to be repaired in the secondary analysis are searched for.

Referring to FIG. 26, when the ternary analysis is started (step S400), first, among the possible pairs of candidates for the repair solution obtained in the secondary analysis, a selection of pairs is carried out so as to determine the possibility of repair (step S402).

Next, with respect to the pairs for repair solution thus selected, it is determined whether or not the repair is finally available in the ternary analysis (step S404).

As the result of the ternary analysis, if it has been determined that the repair is available (step S406), data indicating that the repair is available and defective addresses to be repaired are externally outputted from, for example, a tester device (step S410), thereby completing the processes (step S420).

In contrast, at step S406, in the case when the result of the ternary analysis shows that the repair is not available, a determination is successively made as to whether or not the process has been carried out on all the pairs of candidates for the repair solution (step S408). In the case when the process has been finished with respect to all the pairs of possible combinations, the tester device outputs data indicating that no repair is available (step S412).

In contrast, at step S408, it is determined that the process has not been finished up to the last pair, the sequence returns to step S402, and the process is applied to the next possible pair of candidates for the repair solution.

Figure 27:
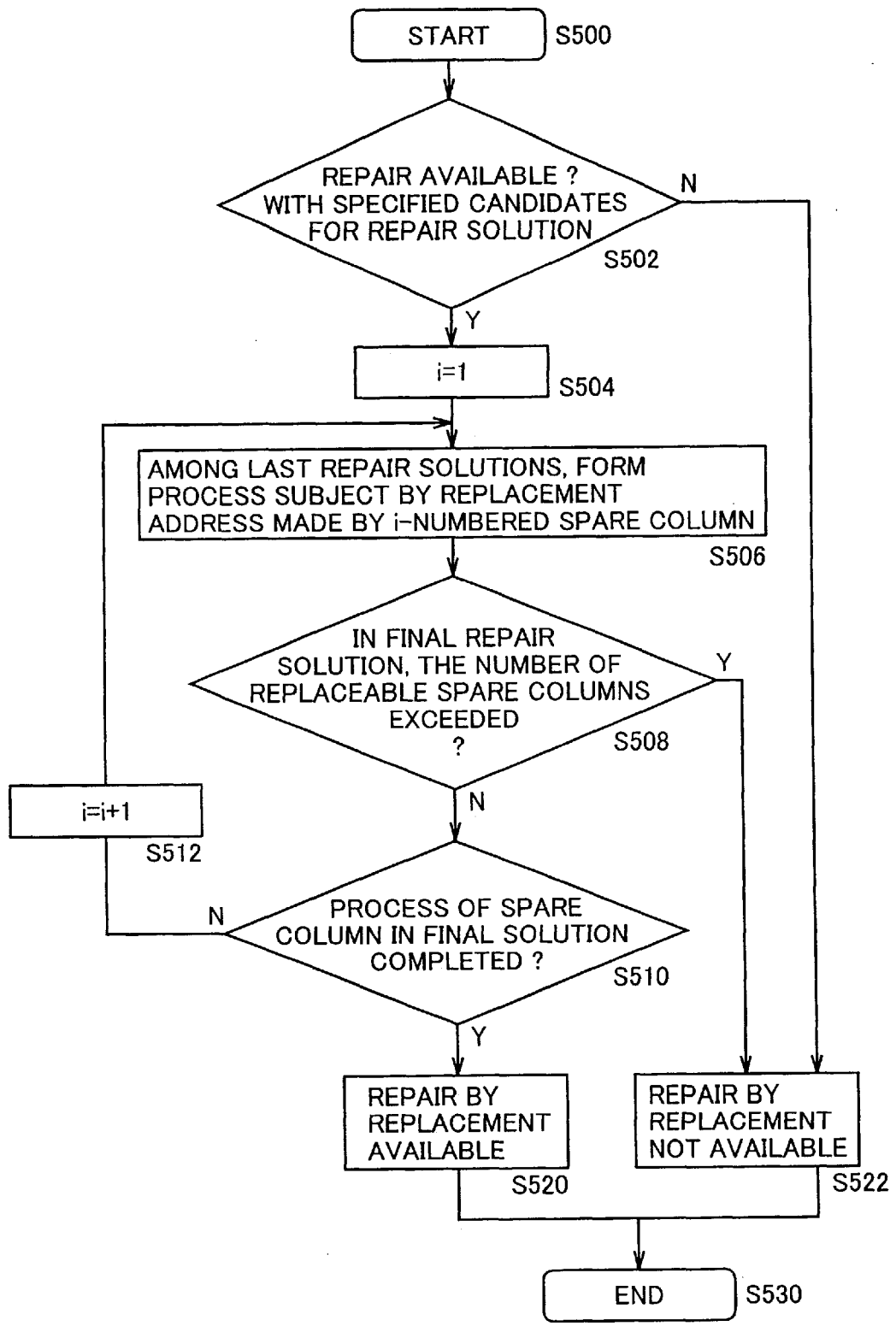
FIG. 27 is a flow chart that more specifically explains the contents of the ternary analyzing processes.
Figure 28:
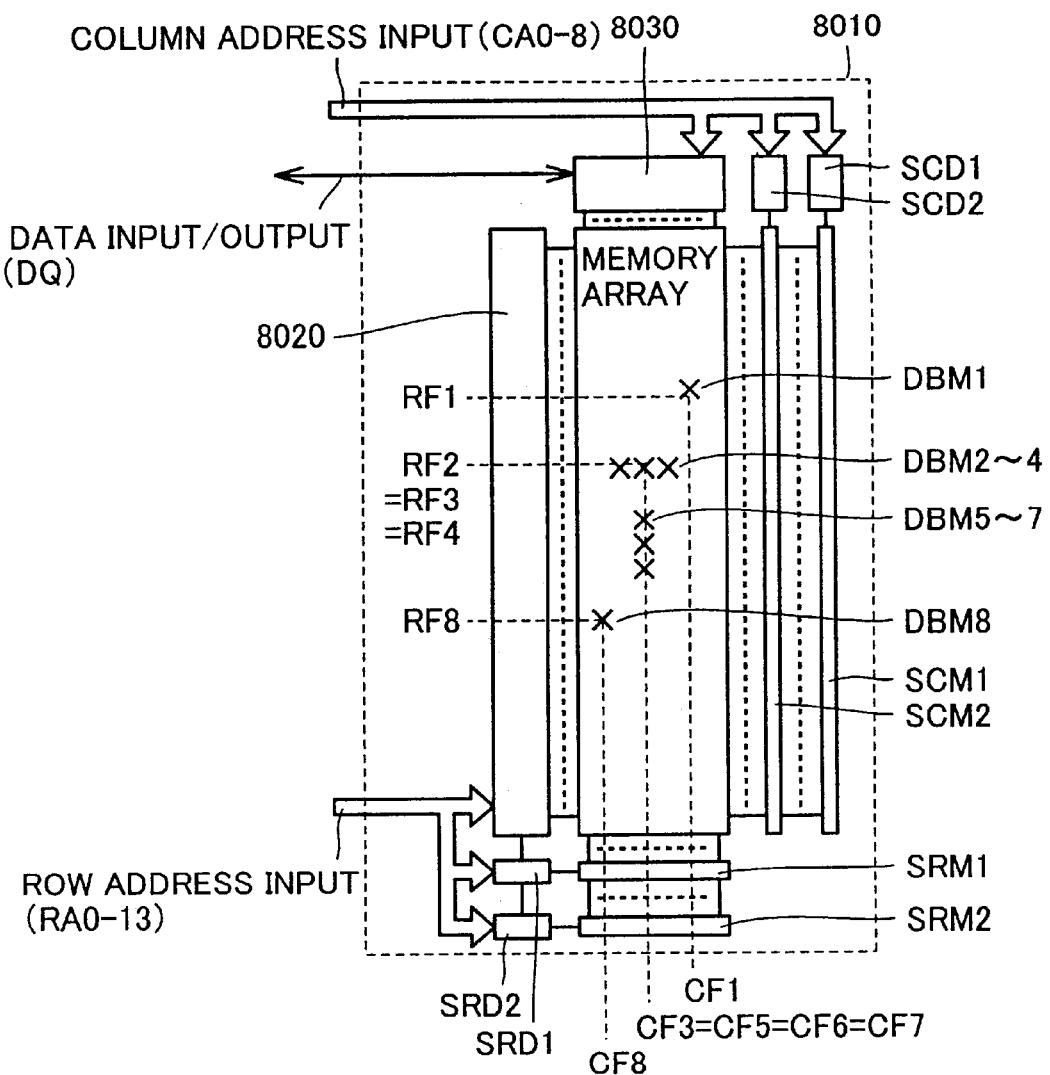
FIG. 28 is a schematic block diagram that shows the structure of a redundant circuit that is installed in the memory array section 8010 of the semiconductor memory device.
Figure 29:
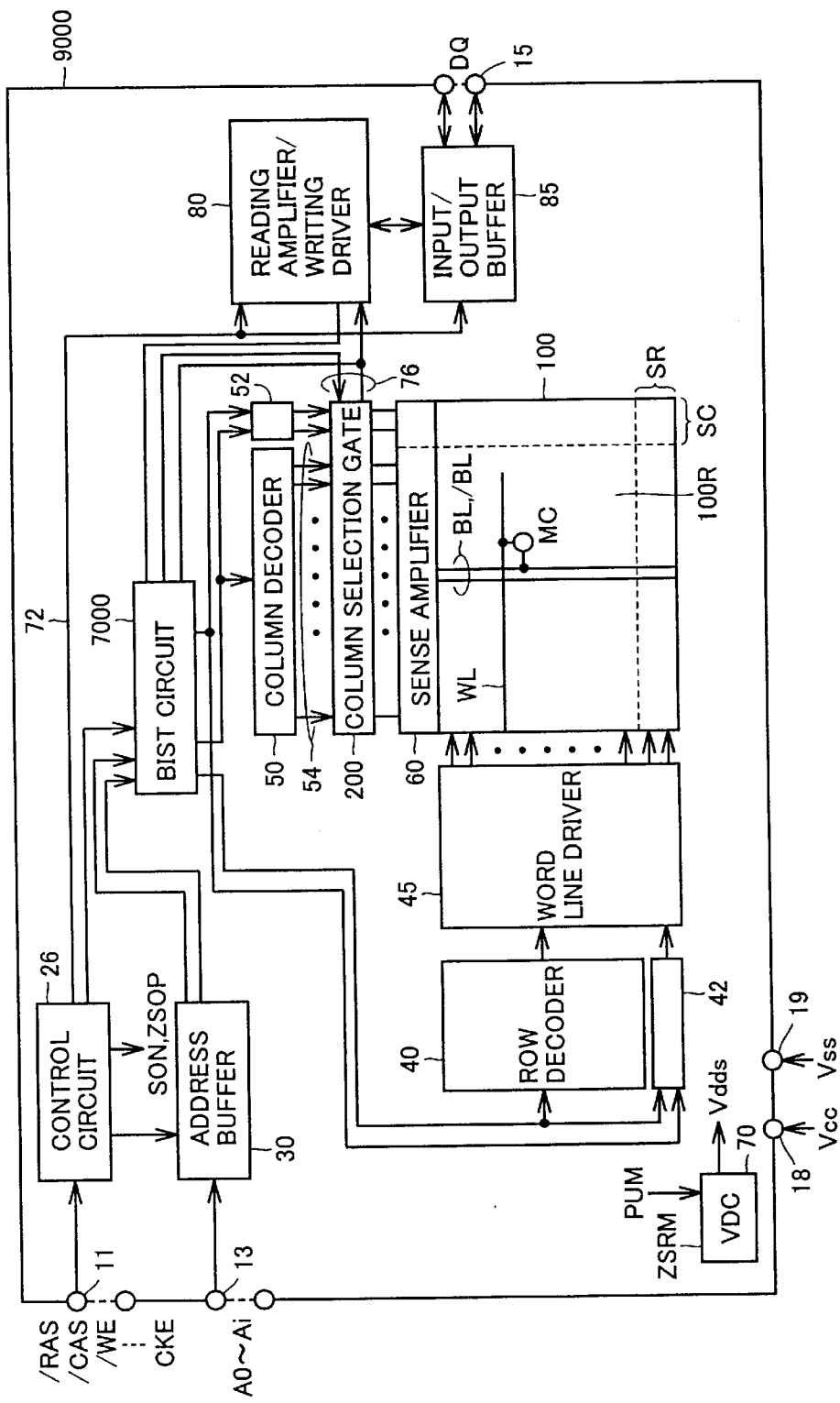
FIG. 29 is a schematic block diagram that shows the entire structure of a conventional dynamic-type semiconductor memory device 9000.

FIG. 27 is a flow chart that explains in detail the contents of the process for the ternary analyzing process (step S404) explained in FIG. 26.

Referring to FIG. 27, when the ternary analyzing process is started (step S500), a determination is made as to whether or not the secondary analysis has determined that the repair is available by using candidates for the repair solution selected in step S402 (step S502), and if the determination shows that no repair is available, it is determined that the final repair solution is not obtained by the pairs of selected candidates for the repair solution (step S522), thereby completing the process of step S404 (step S530).

In contrast, at step S502, if it is determined that the secondary analysis has determined that the repair is available; then, the value of variable i is successively initialized to "1" (step S504).

Next, in the replacement step of the final repair solution (for example, the solution to save in the order of SR1→SR2→SR3→SR4→SCI→SCII), among the steps in which the replacement is made by using spare column, defective address to be replaced by the i-numbered spare column is set as the subject of the treatment (step S506).

Successively, with respect to the candidates for the repair solution obtained by the specified secondary analysis, it is determined whether or not the number of spare columns required exceeds the number of spare columns that can be replaced in the final repair solution (in this case, one in each of sub-memory cell arrays 100.1 and 100.3)(step S508). If this exceeds, it is determined that no repair is available (step S522), thereby completing the process in step S404 (step S530).

If this does not exceed, it is determined whether or not, in the replacing step in the final repair solution, all the steps in which the replacement is executed by spare column become subjects for the treatment (step S510), and in the case when all the steps have not become subjects for the treatment, the value of variable i is incremented by only 1 (step S512), and the sequence returns to step S506.

In contrast, in the case when all the steps in which the replacement is executed by spare row become subjects for the treatment (step S510), it is determined that the repair is available (step S520), thereby completing the process of step S404 (step S530).

By carrying out the above-mentioned processes, it is possible to carry out the analysis for redundant repair in a short time while reducing the circuit scale, even in the case when memory cell 100 is divided into sub-memory cell arrays 100.1 to 100.4 as explained in FIG. 23 and FIG. 24.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    a memory cell array in which a plurality of memory cells, each holding memory data, are placed in a matrix format, said memory cell array being divided into at least a first and a second sub-memory cell arrays, said first and second sub-memory cell arrays comprising:
normal memory cell arrays including a plurality of normal memory cells, and
preliminary memory cell arrays including a plurality of preliminarily memory cells;
a normal memory cell selection circuit which, in accordance with an address signal, selects at least either a memory cell row or a memory cell column that is in common with said normal memory cell array of said first and second sub-memory cell array;
a preliminary memory cell selection circuit which, in the case when a defective memory cell exists in said normal memory cell array, selects either a memory cell row or memory cell column in said preliminary memory cell array, commonly on said preliminary memory cell array of said first and second sub-memory cell array, in place of either of said common memory cell row or memory cell column to be selected by said normal memory cell selection circuit; and
a self-testing circuit which detects a defective memory cell in said normal memory cell and carries out a test so as to determine whether either of said preliminary memory cells is used for replacing said defective memory cell;
said self-testing circuit including:
a plurality of primary replacement determining circuits, which is installed for each of said first and second sub-memory cell arrays, and which, on the assumption that a selection of a memory cell from said first and second sub-memory cell arrays and a replacement thereof to said preliminary memory cell can be carried out independently from each other, determines whether said replacement is made by either of said preliminary memory cells, and outputs the result of the determination.

2. The semiconductor integrated circuit device according to claim 1, wherein said primary replacement determining circuit comprises:
a storing circuit for storing a row address and a column address to be repaired by replacement, said row address and column address corresponding to either of said first and second sub-memory cell arrays; and
a reading circuit which, in accordance with an external instruction, reads said row address and column address to be repaired by replacement from said storing circuit, and outputs the resulting addresses.

3. The semiconductor integrated circuit device according to claim 2, wherein said self-testing circuit further includes:
a self analysis control circuit which outputs said address signal used for successively selecting said memory cell, test data to be written in said memory cell selected in a test writing operation, and expected value data to be read out from said memory cell in a test reading operation; and
a comparison circuit which, in said test reading operation, compares memory data from said selected memory cell with said expected value data;
said storing circuit includes:
a first association storing type memory circuit which, in accordance with the results of comparison in said comparison circuit, stores a defective address corresponding to a defective memory cell, and makes a determination as to coincidence or non-coincidence between the stored defective address and a detected defective address, and
said first association storing type memory circuit, which is controlled by said primary replacement determining circuit, selectively stores a defective address that is different from the stored defective address, among defective addresses being successively detected.

4. The semiconductor integrated circuit device according to claim 1, wherein said self testing circuit further comprises: a secondary replacement determining circuit which, based upon the results of determination from said plurality of primary replacement determining circuits, under the limited condition that in place of either of said common memory cell row and memory cell column to be selected by said normal memory cell selection circuit, either of a memory cell row and a memory cell column in said preliminary memory cell array is commonly selected on said preliminary memory cell array of said first and second sub-memory cell arrays, decides a defective row address and a defective column address to form subjects for replacement at the time when said memory cell array is repaired by replacement.

5. The semiconductor integrated circuit device according to claim 4, wherein said self testing circuit comprises:
a self analysis control circuit for outputting said address signal for successively selecting said memory cell; test data to be written in said memory cell selected in the test writing operation, and expected value data to be read out from said memory cell in the test reading operation; and a comparator circuit which, in said test reading operation, compares stored data from said selected memory cell and said expected value data,
said primary replacement determining circuit includes a storing circuit which, with respect to the corresponding one of said first and second sub-memory cell arrays, stores a row address and a column address to be repaired by replacement,
said storing circuit including:
a first association storing type memory circuit which, in accordance with the results of comparison in said comparison circuit, stores a defective address corresponding to a defective memory cell, and makes a determination as to coincidence or non-coincidence between the stored defective address and a detected defective address, and
said first association storing type memory circuit, which is controlled by said primary replacement determining circuit, selectively stores a defective address that is different from the stored defective address, among defective addresses being successively detected.

6. The semiconductor integrated circuit device according to claim 5, wherein said secondary replacement analyzing circuit comprises:
a second association storing type memory circuit which, of a defective row address and said defective column address, successively reads either of them that has been commonly selected with respect to said first and second sub-memory cell arrays, from said first association storing type memory circuit, determines as to coincidence and non-coincidence between the stored address and read out defective address, and stores the resulting address, and
a replacement determining section which, in accordance with the results of determination in said second association storing type memory circuit, makes a determination as to whether or not said first and second sub-memory cell arrays can be repaired by replacing them with said preliminary memory sell array.

7. The semiconductor integrated circuit device according to claim 6, wherein said first association storing type memory circuit comprises:

a first read-out driving circuit which stores said address signal from said self analyzing control circuit in said first association memory circuit, and reads out data stored in said first association storing type memory circuit, and said second association storing type memory circuit comprises:

a second readout driving circuit which stores said defective address from said first association storing type memory circuit in said second association memory circuit, and reads out data stored in said second association storing type memory circuit.

8. The semiconductor integrated circuit device according to claim 6, wherein said first association storing type memory circuit comprises:

a plurality of association type memory cells that are arranged in a matrix format, a first association type memory cell array for storing a defective row address corresponding to said first sub-memory cell array, a plurality of association type memory cells arranged in a matrix format, and a second association type memory cell array for storing a defective column address corresponding to said first sub-memory cell array; and said second association storing type memory circuit comprises:

a plurality of association type memory cells that are arranged in a matrix format, a third association type memory cell array for storing a defective row address corresponding to said second sub-memory cell array, a plurality of association type memory cells that are arranged in a matrix format, and a fourth association type memory cell array for storing a defective row address corresponding to said second sub-memory cell array, said storing circuit comprises:

a plurality of first bit lines that are commonly installed on said first association type memory cell array and said third association type memory cell array, and a plurality of second bit lines that are commonly installed on said second association type memory cell array and said fourth association type memory cell array.

9. The semiconductor integrated circuit device according to claim 6, wherein said first association storing type memory circuit comprises:

a plurality of association type memory cells that are arranged in a matrix format, and a first association type memory cell array for storing a defective row address corresponding to said first sub-memory cell array, said second association storing type memory circuit comprises:

a plurality of association type memory cells that are arranged in a matrix format, and a second association type memory cell array for storing a defective row address corresponding to said second sub-memory cell array, said storing circuit comprises:

a plurality of first bit lines that are commonly installed on said first association type memory cell array and said second association type memory cell array, a plurality of sense amplifier circuits, installed commonly on said first association type memory cell array and said second association type memory cell array, for carrying out a data reading operation, and a switch circuit for selectively blocking data transmission from said first association type memory cell array to said plurality of sense amplifier circuits.

10. The semiconductor integrated circuit device according to claim 7, wherein said first readout driving circuit stores said address signal from said self-analyzing control circuit in accordance with a timing signal from said self-analyzing control circuit, and the timing of the storing process by said second readout driving circuit is controlled by a signal that is formed by delaying said timing signal for a predetermined time.

11. The semiconductor integrated circuit device according to claim 6, wherein said second association storing type memory circuit, which is controlled by said replacement determining section, selectively stores a defective address different from defective addresses that have been stored, among defective addresses that are successively read out.

12. The semiconductor integrated circuit device according to claim 11, wherein said second association storing type memory circuit further comprises an overflow detection circuit which stores the fact that the number of defective addresses to be selectively stored exceeds a number that can be stored in said second association storing type memory circuit.

13. The semiconductor integrated circuit device according to claim 1, wherein said memory cell array is divided into first to fourth sub-memory cell arrays, each of said third and fourth sub-memory cell arrays comprises:

a normal memory cell array containing a plurality of normal memory cell arrays, and a preliminary memory cell array containing a plurality of preliminary memory cells, said normal memory cell selection means comprises:

a first normal memory cell selection circuit which, in accordance with said address signal, selects a memory cell row that is in common with said normal memory cell array of said first and second sub-memory cell arrays, and a second normal memory cell selection circuit which, in accordance with said address signal, selects a memory cell row that is in common with said normal memory cell array of said third and fourth sub-memory cell arrays, said preliminary memory cell selection circuit comprises: a first preliminary memory cell selection circuit which, in the case when any defective memory cell exists in said normal memory cell array, in place of either one of said common memory cell row and memory cell column to be selected by said normal memory cell selection circuit, selects either one of memory cell row and memory cell column in said preliminary memory cell array in common with said preliminary memory cell array of said first and second sub-memory cell arrays, and a second preliminary memory cell selection circuit which, in the case when any defective memory cell exists in said normal memory cell array, in place of either one of said common memory cell row and memory cell column to be selected by said normal memory cell selection circuit, selects either one of memory cell row and memory cell column in said preliminary memory cell array in common with said preliminary memory cell array of said third and fourth sub-memory cell arrays, said plurality of primary replacement determining circuits are respectively installed in association with said first to fourth sub-memory cell arrays, each of said primary replacement determining circuits, assuming that a selection of memory cell from said first to fourth sub-memory cell arrays and a replacement thereof to said preliminary memory cell can be carried out independently from each other, determines whether any of said preliminary memory cells is used for replacement, and outputs the result of determination.

* * * * *